United States Patent
Banno et al.

(10) Patent No.: US 10,340,452 B2
(45) Date of Patent: Jul. 2, 2019

(54) VARIABLE RESISTANCE ELEMENT, SEMICONDUCTOR DEVICE, AND MANUFACTURING METHOD OF SEMICONDUCTOR DEVICE

(71) Applicant: NEC CORPORATION, Tokyo (JP)

(72) Inventors: Naoki Banno, Tokyo (JP); Munehiro Tada, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/361,560

(22) Filed: Nov. 28, 2016

(65) Prior Publication Data

US 2017/0162784 A1    Jun. 8, 2017

(30) Foreign Application Priority Data

Dec. 7, 2015    (JP) .................. 2015-238610

(51) Int. Cl.
   *H01L 45/00*    (2006.01)

(52) U.S. Cl.
   CPC .......... *H01L 45/1266* (2013.01); *H01L 45/08* (2013.01); *H01L 45/1226* (2013.01); *H01L 45/16* (2013.01)

(58) Field of Classification Search
   CPC .. H01L 45/1266; H01L 45/1253; H01L 45/08
   USPC .......................................................... 257/4
   See application file for complete search history.

(56) References Cited

U.S. PATENT DOCUMENTS

| | | | | |
|---|---|---|---|---|
| 7,116,573 B2* | 10/2006 | Sakamoto | ........... | G11C 13/0011 365/153 |
| 7,781,981 B2* | 8/2010 | Winkel | ............... | H05B 41/042 315/209 M |
| 7,960,712 B2* | 6/2011 | Sakamoto | ............. | H01L 45/085 257/2 |
| 2011/0272664 A1* | 11/2011 | Tada | ..................... | H01L 45/085 257/4 |
| 2012/0097916 A1* | 4/2012 | Tada | ..................... | H01L 27/101 257/4 |
| 2013/0082231 A1* | 4/2013 | Tada | .................. | G11C 13/0007 257/4 |
| 2013/0181180 A1* | 7/2013 | Tada | .................. | G11C 13/0007 257/1 |
| 2015/0103583 A1* | 4/2015 | Tada | .................. | G11C 13/0002 365/148 |
| 2015/0340609 A1* | 11/2015 | Banno | .................. | H01L 45/085 257/4 |
| 2016/0111638 A1* | 4/2016 | Banno | .................. | H01L 45/085 257/4 |

(Continued)

FOREIGN PATENT DOCUMENTS

JP    2002-536840 A    10/2002
JP    5382001 B2    1/2014

(Continued)

*Primary Examiner* — Tuan N Nguyen
(74) *Attorney, Agent, or Firm* — Sughrue Mion, PLLC

(57) ABSTRACT

A variable resistance element according to the present invention comprises a configuration in which an ion conduction layer is arranged between an upper electrode and a lower electrode, wherein a recess part is formed on a surface of the lower electrode of the variable resistance element, and the ion conduction layer is formed in contact with at least the recess part on a surface of the lower electrode.

17 Claims, 18 Drawing Sheets

(56) References Cited

U.S. PATENT DOCUMENTS

2016/0359110 A1* 12/2016 Banno ................ G11C 13/0007

FOREIGN PATENT DOCUMENTS

| WO | 2011/058947 A1 | 5/2011 |
| WO | 2011/158821 A1 | 12/2011 |
| WO | 2012/043502 A1 | 4/2012 |

* cited by examiner

Fig. 1
(a)
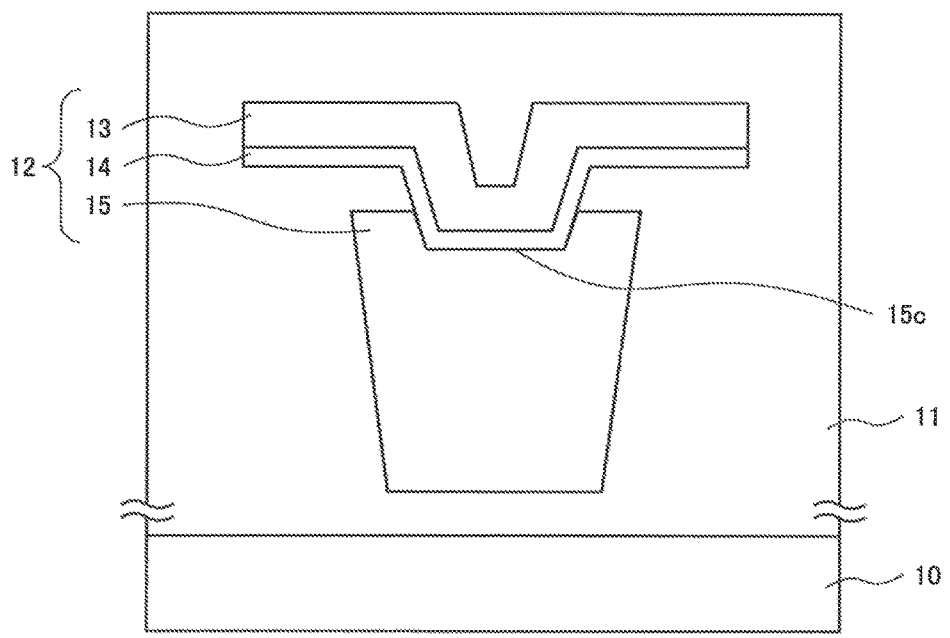
(b)
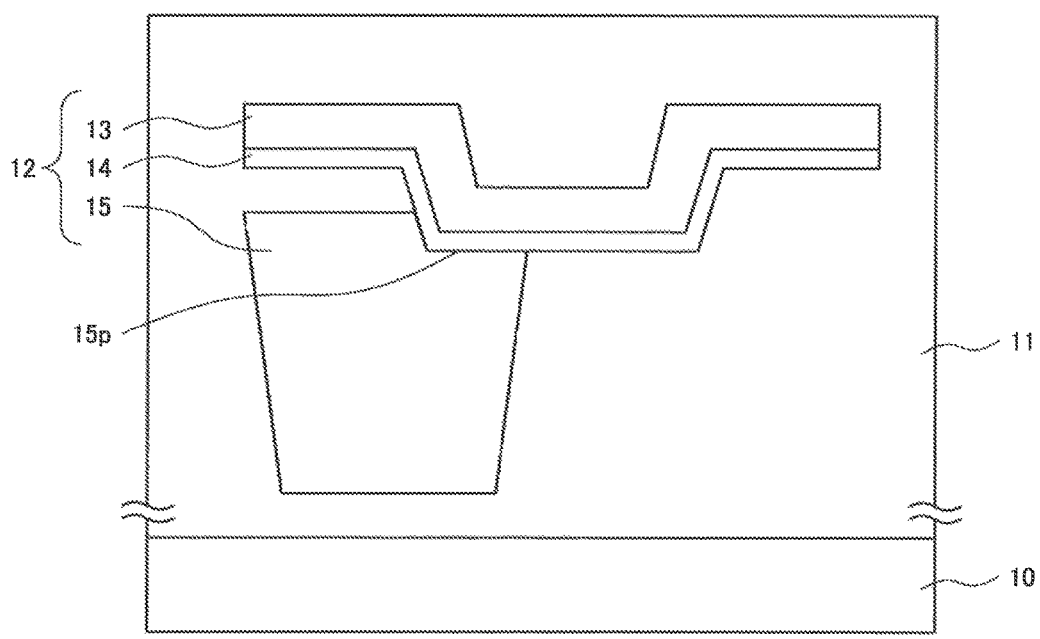

VARIABLE RESISTANCE ELEMENT, SEMICONDUCTOR DEVICE, AND MANUFACTURING METHOD OF SEMICONDUCTOR DEVICE

INCORPORATION BY REFERENCE

This application is based upon and claims the benefit of priority from Japanese Patent Application No. 2015-238610, filed on Dec. 7, 2015, the disclosure of which is incorporated herein in its entirety by reference.

TECHNICAL FIELD

The present invention relates to a variable resistance element, a semiconductor device, and a manufacturing method of the semiconductor device, and particularly to a variable resistance element utilizing precipitation of metal, used in an electronic device such as a programmable logic device and a memory, and a manufacturing method of a semiconductor device incorporating the variable resistance element.

BACKGROUND ART

In order to diversify functionality of a programmable logic device and promote implementation thereof on electronic equipment and the like, reduction in size of a switch connecting logic cells with one another, and reduction in ON-resistance of the switch are required. A switching element utilizing precipitation of metal in an ion conduction layer in which a metal ion conducts, is known to have a smaller size and less ON-resistance than a conventional semiconductor switch.

The switching element includes a two-terminal switch disclosed in Patent Literature 1 and a three-terminal switch disclosed in Patent Literature 2. The two-terminal switch has a configuration in which an ion conduction layer is sandwiched between a first electrode supplying a metal ion and a second electrode not supplying an ion. Switching is performed between the two electrodes by formation and disappearance of a metal bridge in the ion conduction layer. The two-terminal switch has a simple configuration, and therefore a manufacturing process thereof is simple, and an element size can be reduced to the order of nanometers. The three-terminal switch has a configuration in which second electrodes of two two-terminal switches are integrated, and secures high reliability. It is preferable to use a porous polymer having silicon, oxygen, and carbon as main components, as the aforementioned ion conduction layer. A porous polymer ion conduction layer is able to maintain high dielectric breakdown voltage even when a metal bridge is formed, and therefore has excellent operational reliability (Patent Literature 3). In order to integrate the switching element as a wiring selector switch in a programmable logic device, densification by size reduction of the switch and simplification of a manufacturing process are required. A wiring material of a leading-edge semiconductor device is mainly composed of copper, and therefore a technique of efficiently forming a variable resistance element in a copper wiring is expected. A technology of integrating a switch element utilizing an electrochemical reaction into a semiconductor device for a two-terminal switch is disclosed in Patent Literature 4, and the technology for a three-terminal switch is disclosed in Patent Literature 5. The literatures describe a technology of using a copper wiring on a semiconductor substrate also as a first electrode of a switch element. Use of the configuration enables reduction in step for newly forming a first electrode. Consequently, a mask for creating a first electrode becomes unnecessary, and the number of photomasks (PR number: number of photoresist masks) to be added for manufacturing a variable resistance element can be two. At this time, when an ion conduction layer (second ion conduction layer) is directly formed on a copper wiring, a surface of the copper wiring is oxidized, causing increase in leak current, and therefore a metal thin film functioning as an oxidation sacrificial layer is arranged between the copper wiring and the ion conduction layer. The metal thin film is oxidized by oxygen contained in the ion conduction layer, and becomes part of the ion conduction layer (first ion conduction layer). A metal constituting the oxidation sacrificial layer forms an alloy layer at an interface with copper, and, when a metal bridge is formed by voltage application, the metal is taken into the metal bridge. Non Patent Literature 1 discloses that retentive strength (retention characteristic) is improved by enhanced thermal stability of a metal bridge by the metal diffused into the bridge. At that time, generation efficiency of Joule heat is enhanced by the metal being taken into the metal bridge, and therefore current required for transition from "ON" to "OFF" does not increase.

CITATION LIST

Patent Literature

[Patent Literature 1] Japanese Translation of PCT International Application published as No. 2002-536840
[Patent Literature 2] International Application Publication No. WO 2012/043502
[Patent Literature 3] International Application Publication No. WO 2011/058947
[Patent Literature 4] Japanese Patent No. 5382001
[Patent Literature 5] International Application Publication No. WO 2011/158821

Non Patent Literature

[Non Patent Literature 1] IEEE TRANSACTION ON ELECTRON DEVICES, Vol. 60, pp. 3534-3540, 2013

SUMMARY

The two-terminal switch and the three-terminal switch formed between wirings, according to the background art, have a configuration protruding from a wiring layer forming the element. Accordingly, a via connecting to the wiring from an upper-layer wiring is shorter than a via connecting to the element. When manufacturing both vias with a same mask, plasma damage due to etching corresponding to a difference from the via connecting to the wiring is accumulated in the element, and an element characteristic such as reliability may be degraded. Although it is possible to arrange a via connecting to the element while avoiding a variable resistance part, an element area accordingly increases in order to secure a connecting part for the via. The problem becomes more remarkable as miniaturization progresses, making application to an advanced process difficult.

The present invention is made to solve the aforementioned problem of the background art, and an object of the present invention is to provide a variable resistance element reducing plasma damage accumulating in a switch upon via formation and having excellent reliability, a variable resistance element reducing an element height in a vertical direction and being suited for miniaturization, and a rewritable semiconductor device using the switching element.

Moreover, an object of the present invention is to provide a variable resistance element and a semiconductor device that are suited for miniaturization, and a manufacturing method of the semiconductor device for achieving the miniaturization.

Means for Solving the Problem

In order to achieve the object, a variable resistance element according to the present invention is a variable resistance element comprising a configuration in which an ion conduction layer is arranged between an upper electrode and a lower electrode, wherein a recess part is formed on a surface of the lower electrode of the variable resistance element, and the ion conduction layer is formed in contact with at least the recess part on a surface of the lower electrode.

A semiconductor device according to the present invention is a semiconductor device comprising a variable resistance element inside a multi-layered wiring layer on a semiconductor substrate, wherein the variable resistance element includes a configuration in which an ion conduction layer is arranged between an upper electrode and a lower electrode, a recess part is formed on a surface of the lower electrode of the variable resistance element, and the ion conduction layer is formed in contact with at least the recess part on a surface of the lower electrode.

A manufacturing method of a semiconductor device, according to the present invention, is a manufacturing method of a semiconductor device comprising, inside a multi-layered wiring layer on a semiconductor substrate, a variable resistance element including a configuration in which an ion conduction layer is arranged between an upper electrode and a lower electrode, the method comprising, after exposing a surface of the lower electrode, forming a recess part by injecting plasma of a halogen gas, an inert gas, a fluorocarbon-based gas, or a mixed gas thereof onto the exposed surface of the lower electrode, at reduced pressure.

Advantageous Effect of the Invention

The present invention is able to provide a variable resistance element and a semiconductor device that are suited for miniaturization.

BRIEF DESCRIPTION OF THE DRAWINGS

Exemplary features and advantages of the present invention will become apparent from the following detailed description when taken with the accompanying drawings in which:

FIGS. 1(a) and 1(b) are schematic cross-sectional views for illustrating semiconductor devices according to an exemplary embodiment of the highest-level concept of the present invention.

EXEMPLARY EMBODIMENT

Figure 2:
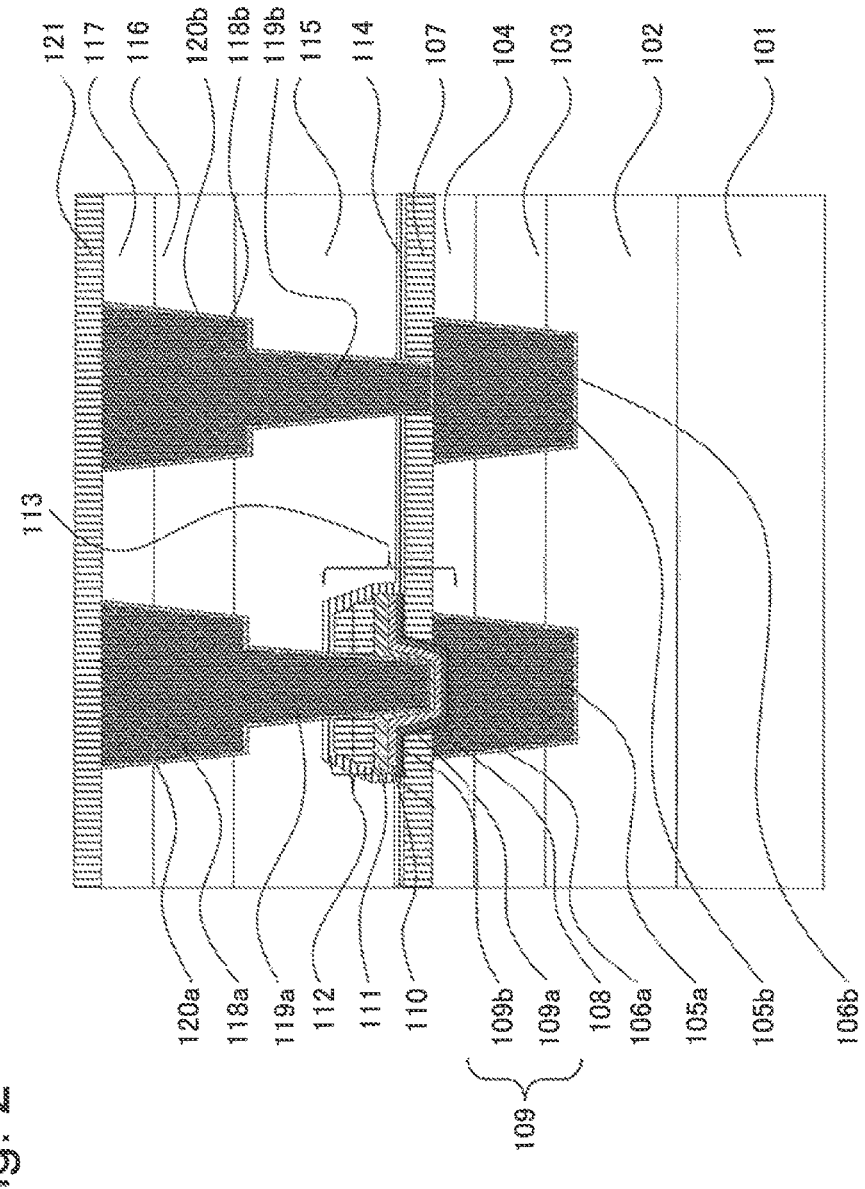
FIG. 2 is a schematic cross-sectional view illustrating a configuration example of a two-terminal switching element as a semiconductor device according to a first exemplary embodiment of the present invention.

Preferred exemplary embodiments will be described in detail with reference to the drawings. Before a variable resistance element, a semiconductor device, and a manufacturing method of the semiconductor device according to exemplary embodiments of the present invention are specifically described, semiconductor devices according to an exemplary embodiment of the highest-level concept of the present invention will be described. FIGS. 1(a) and 1(b) are schematic cross-sectional views for illustrating the semiconductor devices according to the exemplary embodiment of the highest-level concept of the present invention.

Each of the semiconductor devices in FIGS. 1(a) and 1(b) is a semiconductor device including a variable resistance element 12 inside a multi-layered wiring layer 11 on a semiconductor substrate 10, and the variable resistance element 12 has a configuration in which an ion conduction layer 14 is arranged between an upper electrode 13 and a lower electrode 15. Further, in each of the semiconductor devices in FIGS. 1(a) and 1(b), a recess part is formed on a surface of the lower electrode 15 of the variable resistance element 12. FIG. 1(a) illustrates a state in which a recess part 15c is formed on a central part of the surface of the lower electrode 15. FIG. 1(b) illustrates a state in which a recess part 15p is formed at least on a peripheral part of the surface of the lower electrode 15. Additionally, in each of the semiconductor devices in FIGS. 1(a) and 1(b), the ion conduction layer 14 of the variable resistance element 12 is formed at least in contact with the recess part on the surface of the lower electrode 15.

In each of the semiconductor devices in FIGS. 1(a) and 1(b), the recess part is formed on the surface of the lower electrode 15, and the ion conduction layer 14 is formed at least in contact with the recess part on the surface of the lower electrode 15. Consequently, in the semiconductor device including the variable resistance element 12 inside the multi-layered wiring layer, miniaturization is facilitated in terms of electrical connection to the variable resistance element 12, particularly to the upper electrode 13 of the variable resistance element 12. Specific exemplary embodiments of the present invention will be described below with reference to the drawings.

First Exemplary Embodiment

First, a variable resistance element, a semiconductor device, and a manufacturing method of the semiconductor device, according to a first exemplary embodiment of the present invention, will be described. A configuration of a semiconductor device including a two-terminal switch, as an example of a variable resistance element, inside a multi-layered wiring layer, will be described as the semiconductor device according to the first exemplary embodiment of the present invention. FIG. 2 is a cross-sectional view schematically illustrating a configuration example of a switching element employing a configuration of "a two-terminal switch formed inside a multi-layered wiring layer" according to the first exemplary embodiment. The semiconductor device includes a two-terminal switch 113 inside a multi-layered wiring layer on a semiconductor substrate 101.

The multi-layered wiring layer includes an insulating laminated body on the semiconductor substrate 101. In the insulating laminated body, an interlayer insulating film 102, a Low-k insulating film 103, an interlayer insulating film 104, a barrier insulating film 107, a protective insulating film 114, an interlayer insulating film 115, a Low-k insulating film 116, an interlayer insulating film 117, and a barrier insulating film 121 are laminated in this order.

In the multi-layered wiring layer, a first wiring A 105a and a first wiring B 105b are embedded in wiring grooves formed in the interlayer insulating film 104 and the Low-k insulating film 103, through a first barrier metal A 106a and a first barrier metal B 106b, respectively. In the multi-layered wiring layer, a second wiring A 118a and a second wiring B 118b are embedded in wiring groovees formed in the interlayer insulating film 117 and the Low-k insulating film 116. A via A 119a and a via B 119b are embedded in prepared holes formed in the interlayer insulating film 115, the protective insulating film 114, and a hard mask film 112, and the second wiring A 118a and the via A 119a, and the second wiring B 118b and the via B 119b, are respectively integrated. Additionally, side surfaces and bottom surfaces of the second wiring A 118a and the via A 119a, and the second wiring B 118b and the via B 119b are respectively covered by a second barrier metal A 120a and a second barrier metal B 120b.

In the multi-layered wiring layer, the two-terminal switch 113 is formed at an opening formed on the barrier insulating film 107. In the two-terminal switch 113, an ion conduction layer 109, a lower second electrode 110, and an upper second electrode 111 are laminated in this order on the first wiring A 105a as a first electrode, a wall surface of the opening of the barrier insulating film 107, and the barrier insulating film 107. The hard mask film 112 is formed on the upper second electrode 111, and an upper surface and a side surface of a laminated body including the ion conduction layer 109, the lower second electrode 110, the upper second electrode 111, and the hard mask film 112 are covered by the protective insulating film 114. By making part of the first wiring A 105a as a lower electrode of the "two-terminal switch" 113, electrode resistance can be reduced while simplifying a number of steps. By merely creating at least a 2PR mask set as an additional step to a common copper damascene wiring process, the "two-terminal switch" 113 can be integrated on the semiconductor device, and reduction in resistance and a cost of the element can be concurrently achieved. The ion conduction layer 109 includes a first ion conduction layer 109a and a second ion conduction layer 109b.

In the "two-terminal switch" 113 in the semiconductor device in FIG. 2, the first ion conduction layer 109a is in direct contact with the first wiring A 105a in the opening region formed on the barrier insulating film 107. Then, an alloy layer is formed at an interface between the first ion conduction layer 109a and the first wiring A 105a, by diffusing a metal constituting the first ion conduction layer 109a into the first wiring A 105a. In the "two-terminal switch" 113, the via A 119a and the upper second electrode 111 are electrically connected through the second barrier metal A 120a on the upper second electrode 111. The "two-terminal switch" 113 is controlled in ON or OFF state, by applying voltage or passing current. The "two-terminal switch" 113 is controlled in ON or OFF state by, for example, utilizing electric field diffusion of a metal ion supplied from a metal forming the first wiring A 105a, into the first ion conduction layer 109a and the second ion conduction layer 109b.

Furthermore, in the semiconductor device according to the present exemplary embodiment, the first wiring A 105a includes a recess part 108 formed by digging down in a depth direction in the opening region formed on the barrier insulating film 107. The first ion conduction layer 109a is in contact with the first wiring A 105a through the recess part 108. Further, in FIG. 2, the via B 119b is in contact with the first wiring B 105b through the second barrier metal B 120b, without intervening the two-terminal switch between the first wiring B 105b and the via B 119b. The first wiring A 105a and the first wiring B 105b are wirings formed in a same layer, on the basis of, for example, the semiconductor substrate 101.

The two-terminal switch 113 in the semiconductor device according to the present exemplary embodiment is arranged down in a depth direction correspondingly to the recess part 108. Thus, a difference between a height of the via A 119a in contact with the upper second electrode 111 through the second barrier metal A 120a, and a height of the via B 119b in contact with the first wiring B 105b through the second barrier metal B 120b, can be reduced.

Specifically, the height difference amounts to nearly a thickness of the lower second electrode 110. Accordingly, when the via A 119a and the via B 119b are formed by exposure using a same photomask and etching by plasma simultaneously, plasma damage in the two-terminal switch 113 is reduced to an amount corresponding to the height difference between the via A 119a and the via B 119b. Consequently, degradation in element performance of the two-terminal switch 113 can be suppressed.

The semiconductor substrate 101 is a substrate on which a semiconductor element is formed. A substrate such as a silicon substrate, a single-crystal substrate, a silicon-on-insulator (SOI) substrate, a thin-film transistor (TFT) substrate, and a substrate for manufacturing a liquid crystal display (LCD) may be used as the semiconductor substrate 101. The interlayer insulating film 102 is an insulating film formed on the semiconductor substrate 101. For example, a silicon oxide film, an SiOC film, or the like may be used as the interlayer insulating film 102. The interlayer insulating film 102 may be a laminate of a plurality of insulating films.

The Low-k insulating film 103 is an insulating film having a low relative dielectric constant, arranged between the interlayer insulating films 102 and 104, and a low-dielectric-constant film (such as an SiOCH film) having a relative dielectric constant lower than a silicon oxide film, or the like is used. Wiring grooves for embedding the first wiring A 105a and the first wiring B 105b are formed in the Low-k insulating film 103. The first wiring A 105a and the first wiring B 105b are embedded in the wiring grooves through the first barrier metal A 106a and the first barrier metal B 106b, respectively.

The interlayer insulating film 104 is an insulating film formed on the Low-k insulating film 103. For example, a silicon oxide film, an SiOC film, or the like may be used as the interlayer insulating film 104. The interlayer insulating film 104 may be a laminate of a plurality of insulating films. Wiring grooves for embedding the first wiring A 105a and the first wiring B 105b are formed in the interlayer insulating film 104, and the first wiring A 105a and the first wiring B 105b are embedded in the wiring grooves through the first barrier metal A 106a and the first barrier metal B 106b, respectively.

The first wiring A 105a is a wiring embedded in the wiring groove formed in the interlayer insulating film 104 and the Low-k insulating film 103 through the first barrier metal A 106a. The first wiring A 105a also serves as the lower electrode of the two-terminal switch 113, and is in direct contact with the first ion conduction layer 109a. An upper surface of the first ion conduction layer 109a is in direct contact with the second ion conduction layer 109b, and an upper surface of the second ion conduction layer 109b is in direct contact with the lower second electrode 110. A metal capable of diffusion and ionic conduction in the ion conduction layer 109, such as copper, may be used as a metal constituting the first wiring A 105a. The metal constituting the first wiring A 105a (such as copper) may be alloyed with aluminum.

The first wiring A 105a includes the recess part 108 formed by digging down in a depth direction at the opening surface of the barrier insulating film 107. The first wiring A 105a is in contact with the first ion conduction layer 109a at the recess part 108. An alloy layer with a metal constituting the first ion conduction layer 109a, to be described later, is formed at an interface between the recess part 108 and the first ion conduction layer 109a. The alloy layer is not formed throughout surface of the first wiring A 105a, but is formed only at the opening surface of the barrier insulating film 107.

Formation of the recess part 108 is performed after forming the opening surface of the barrier insulating film 107 in contact with the first wiring A 105a, by supplying onto the substrate including the first wiring A 105a, in a dry etching apparatus, plasma of a halogen gas, an inert gas, a fluorocarbon-based gas, or a mixed gas thereof, at reduced pressure. At this time, while the barrier insulating film 107 is also etched, the first wiring B 105b not forming the two-terminal switch 113 is not exposed to the plasma, and is not dug down.

The first wiring B 105b is a wiring embedded in the wiring groove formed in the interlayer insulating film 104 and the Low-k insulating film 103 through the first barrier metal B 106b. The first wiring B 105b is in direct contact with the via B 119b at the opening of the barrier insulating film 107 through the second barrier metal B 120b.

The first barrier metal A 106a and the first barrier metal B 106b are conductive films having a barrier property, covering side surfaces and bottom surfaces of the wirings, in order to prevent the metal forming the first wiring A 105a and the first wiring B 105b from diffusing into the interlayer insulating film 104 and a lower layer. When, for example, the first wiring A 105a and the first wiring B 105b are composed of a metal element with copper being a main component, a refractory metal or a nitride thereof such as tantalum, tantalum nitride, titanium nitride, and tungsten carbonitride, or a laminated film thereof may be used as the first barrier metal A 106a and the first barrier metal B 106b.

The barrier insulating film 107 is formed on the interlayer insulating film 104 including the first wiring A 105a and the first wiring B 105b. The barrier insulating film 107 has a role in preventing oxidation of the metal forming the first wiring A 105a and the first wiring B 105b (such as copper) and a role in preventing the metal forming the first wiring A 105a and the first wiring B 105b from diffusing into the interlayer insulating film 115. Additionally, the barrier insulating film 107 has a role as an etching stopper layer upon processing of the upper second electrode 111, the lower second electrode 110, and the ion conduction layer 109. For example, an SiC film, a silicon carbonitride film, a silicon nitride film, or a laminated structure thereof may be used as the barrier insulating film 107. It is preferable that the barrier insulating film 107 be of the same material as the protective insulating film 114 and the hard mask film 112.

The first ion conduction layer 109a and the second ion conduction layer 109b are films with variable resistance. A material varying resistance by an action (such as diffusion and ion conduction) of a metal ion generated from the metal forming the first wiring A 105a (lower electrode) may be used. When resistance change of the "two-terminal switch" 113 accompanying switching to an "ON" state is performed by precipitation of metal due to reduction of a metal ion, an ion-conductible film is used.

The second ion conduction layer 109*b* is formed by use of a plasma-enhanced Chemical Vapor Deposition (CVD) method. Raw materials of cyclic organosiloxane and helium being a carrier gas are introduced into a reaction chamber, and, when supply of the two is stabilized and pressure in the reaction chamber becomes constant, application of Radio Frequency (RF) power is started. A supply amount of the raw materials is set to in a range of 10 to 200 sccm, and a supply amount of helium is set to 500 sccm through a raw material vaporizer. The thus formed second ion conduction layer 109*b* is a porous polymer including silicon, oxygen, and carbon as main components, and, for example, has a relative dielectric constant greater than or equal to 2.1 and less than or equal to 3.0.

The first ion conduction layer 109*a* has a role in preventing the metal forming the first wiring A 105*a* from diffusing into the second ion conduction layer 109*b* due to heating and plasma during deposition of the second ion conduction layer 109*b*. Further, the first ion conduction layer 109*a* has a role in preventing the first wiring A 105*a* from being oxidized and becoming more likely to diffuse into the second ion conduction layer 109*b*. A metal forming the first ion conduction layer 109*a*, such as zirconium, hafnium, aluminum, and titanium, is exposed to an oxygen atmosphere in a deposition chamber for the second ion conduction layer 109*b* at reduced pressure, after film formation of the metal constituting the first ion conduction layer 109*a*. The metal exposed to the oxygen atmosphere turns to zirconium oxide, hafnium oxide, aluminum oxide, or titanium oxide, and becomes part of the ion conduction layer 109. An optimum film thickness of the metal film forming the first ion conduction layer 109*a* is in a range of 0.5 to 1 nm. The metal film used for forming the first ion conduction layer 109*a* may form a laminate or may be a single layer. It is preferable that formation of the first ion conduction layer 109*a* be performed by sputtering. A metal atom or ion gaining energy by sputtering rushes and diffuses into the first wiring A 105*a* to form an alloy layer at an interface.

The ion conduction layer 109 is formed on the first wiring A 105*a*, a tapered surface of the recess part 108 formed at the opening of the barrier insulating film 107, a tapered surface of the barrier insulating film 107, and the barrier insulating film 107. In the ion conduction layer 109, an outer periphery of a connecting part of the first wiring A 105*a* and the ion conduction layer 109 is arranged at least along the tapered surface of the recess part 108 and a tapered surface of the opening of the barrier insulating film 107.

The lower second electrode 110 is an electrode on the lower layer side of an upper electrode of the "two-terminal switch" 113, and is in direct contact with the second ion conduction layer 109*b*. An alloy containing ruthenium, and titanium, tantalum, zirconium, hafnium, aluminum, or the like, having good adhesion with the metal forming the first wiring A 105*a*, is used for the lower second electrode 110. Ruthenium is a metal more resistant to ionization than the metal forming the first wiring A 105*a*, and is resistant to diffusion and ionic conduction in the second ion conduction layer 109*b*.

In a ruthenium alloy used in formation of the lower second electrode 110, it is desirable to select, as a first metal to be added to ruthenium, an added metal having a standard Gibbs energy of formation of a process of generating a metal ion from the metal (oxidation process) greater than ruthenium in a negative direction. Titanium, tantalum, zirconium, hafnium, and aluminum, each having a standard Gibbs energy of formation of a process of generating a metal ion from the metal (oxidation process) greater than ruthenium in a negative direction, exhibit stronger likelihood of spontaneously generating a chemical reaction compared with ruthenium, and therefore have high reactivity. Consequently, in the ruthenium alloy forming the lower second electrode 110, adhesion with a metal bridge formed by the metal forming the first wiring A 105*a* is enhanced by alloying with ruthenium, when above-mentioned metal is added to the ruthenium alloy. By contrast, when the lower second electrode 110 is composed of only an added metal such as titanium, tantalum, zirconium, hafnium, and aluminum, without ruthenium, reactivity becomes so high that transition to an "OFF" state does not occur. The transition from an "ON" state to an "OFF" state progresses by an oxidation reaction (dissolution reaction) of the metal bridge. When a metal having a standard Gibbs energy of formation of a process of generating a metal ion from the metal (oxidation process) greater than the metal forming the first wiring A 105*a* in a negative direction is used as a metal constituting the lower second electrode 110, transition to an "OFF" state is not likely to occur. The reason is that an oxidation reaction of the lower second electrode 110 progresses ahead of an oxidation reaction of the metal bridge formed by the metal forming the first wiring A 105*a*. Accordingly, a metal material used for formation of the lower second electrode 110 needs to be alloyed with ruthenium having a standard Gibbs energy of formation of a process of generating a metal ion from the metal (oxidation process) less in a negative direction than copper. Furthermore, when copper being a component of the metal bridge is mixed into the lower second electrode 110, an effect of adding a metal having a large standard Gibbs energy in a negative direction is diminished, and therefore it is preferable that a metal added to ruthenium be a material having a barrier property with respect to copper and a copper ion. For example, tantalum, titanium, or the like may be used. Meanwhile, it is known that a greater amount of an added metal stabilizes an "ON" state accordingly, and it is also known that an addition of 5 atm % enhances the stability. When an added metal is titanium, in particular, excellent transition to an "OFF" state and excellent stability of an "ON" state are exhibited, and it is particularly preferable that the lower second electrode 110 be composed of an alloy of ruthenium and titanium, and a content ratio of titanium be in a range of 20 atm % to 30 atm %. It is desirable that a content ratio of ruthenium in the ruthenium alloy be greater than or equal to 60 atm % and less than or equal to 90 atm %.

It is desirable to use a sputtering method for forming the lower second electrode 110. When forming an alloy by use of a sputtering method, a method of using an alloy target of ruthenium and a first metal, a co-sputtering method of sputtering a ruthenium target and a first metal target simultaneously in a same chamber, and an intermixing method of forming a thin film of a first metal in advance, performing film-forming of ruthenium thereon by use of a sputtering method, and performing alloying by energy of colliding atoms, are available. By use of the co-sputtering method and the intermixing method, composition of an alloy can be changed. When the intermixing method is adopted, it is preferable that heat treatment at 400° C. or lower be applied for "flattening" of a mixed state, after film-forming of ruthenium is completed.

The upper second electrode 111 is an electrode on the upper layer side of the upper electrode of the "two-terminal switch" 113, and is formed on the lower second electrode 110. The upper second electrode 111 has a role in protecting the lower second electrode 110. Specifically, by the upper second electrode 111 protecting the lower second electrode 110, damage to the lower second electrode 110 in a process can be suppressed, and a switching characteristic of the "two-terminal switch" 113 can be maintained. For example, tantalum, titanium, tungsten, a nitride thereof, or the like may be used for the upper second electrode 111. Further, when electrically connecting the via A 119a on the lower second electrode 110, the upper second electrode 111 also functions as an etching stopper layer. Accordingly, it is preferable to select such a material for the upper second electrode 111 that an etching rate of the electrode is low with respect to plasma of a fluorocarbon-based gas used for etching the interlayer insulating film 115.

The upper second electrode 111 is composed of a metal nitride. A nitride of titanium, tantalum, zirconium, hafnium, or aluminum, functioning as an etching stopper layer and having conductivity, is particularly preferable. When a metal not being a nitride is used for the upper second electrode 111, defects may be generated in the lower second electrode 110 by part of the metal diffusing into the lower second electrode 110 due to heating and plasma damage during the process. Additionally, starting from the defects, dielectric breakdown voltage of the ion conduction layer 109 may be decreased. By using a metal nitride being a stable compound having electrical conductivity for the upper second electrode 111, diffusion of the metal into the lower second electrode 110 can be prevented. It is particularly preferable that a metal in a metal nitride constituting the upper second electrode 111 and an added metal forming an alloy with ruthenium constituting the lower second electrode 110 be a same metal. Consequently, diffusion failure of the metal forming the alloy with ruthenium can be more efficiently prevented. For example, when the lower second electrode 110 is an alloy electrode of ruthenium and titanium, it is preferable that the upper second electrode 111 be a titanium nitride electrode. Alternatively, when the lower second electrode 110 is an alloy of ruthenium and tantalum, the upper second electrode 111 should be a tantalum nitride electrode. By matching metal components constituting the lower second electrode 110 and the upper second electrode 111, even in case that the metal in the upper second electrode 111 diffuses into the lower second electrode 110, defects are less likely to form. At this time, a ratio of metal to nitrogen in the nitride constituting the upper second electrode 111 is set to be greater than a ratio of metal to ruthenium in the ruthenium alloy constituting the lower second electrode 110. By thus setting the ratio high, diffusion of the metal constituting the lower second electrode 110 into the nitride constituting the upper second electrode 111, causing change in composition of the ruthenium alloy constituting the lower second electrode 110, can be prevented. Specifically, it is more preferable that a content ratio of titanium be greater than or equal to 60 atm % and less than or equal to 80 atm %.

It is desirable to use a sputtering method for forming the upper second electrode 111. When film-forming a metal nitride by use of a sputtering method, it is preferable to use a reactive sputtering method of vaporizing a metal target by use of plasma of a mixed gas of nitrogen and argon. A metal vaporized from the metal target reacts with nitrogen to turn to a metal nitride, and then film-formed on a substrate.

As a more preferable forming method of the upper second electrode 111, it is preferable to use co-sputtering using two electrodes being a ruthenium target electrode and a target electrode composed of a first metal. When an alloy target composed of ruthenium and the first metal is used, composition in continuous use causes deviation due to difference in sputtering yield of each material, and therefore composition of the film to be formed cannot be closely controlled. By contrast, the co-sputtering method is able to precisely control composition of the film to be formed, by individually setting power applied to each target electrode. It is highly effective to use titanium or tantalum, in particular, as the first metal.

In the semiconductor device according to the present exemplary embodiment, the two-terminal switch 113 can be arranged down in a depth direction by forming the recess part 108 on the first wiring A 105a. Accordingly, a time in which the upper second electrode 111 is exposed to etching plasma using a fluorine gas, a rare gas, an inert gas, or a mixed gas thereof, used in pattern forming of the via A 119a, can be reduced. Consequently, a film thickness of the upper second electrode 111 etched by the etching gas is reduced, and accumulation of plasma damage in the ion conduction layer 109 can be prevented. Accumulation of plasma damage in the ion conduction layer 109 causes the metal constituting the first wiring A 105a to become more likely to diffuse into the ion conduction layer 109, causes the ion conduction layer 109 to increase defects due to damage by charge-up, and consequently leads to increase in leak current of the two-terminal switch 113 and progression of characteristic variation and reliability degradation.

The hard mask film 112 is a film being a hard mask film and passivation film in etching the upper second electrode 111, the lower second electrode 110, and the first ion conduction layer 109a and the second ion conduction layer 109b. For example, a silicon nitride film, a silicon oxide film, or the like, or a laminated film thereof may be used as the hard mask film 112. It is preferable that the hard mask film 112 contain the same material as the protective insulating film 114 and the barrier insulating film 107. Specifically, by surrounding a whole periphery of the "two-terminal switch" 113 with a same material, a material interface is integrated so that ingress of moisture and the like from outside can be prevented, and separation from the "two-terminal switch" 113 itself can be prevented.

The protective insulating film 114 is an insulating film having a function of further preventing separation of oxygen from the second ion conduction layer 109b without damaging the "two-terminal switch" 113. For example, a silicon nitride film, a silicon carbonitride film, and the like may be used as the protective insulating film 114. It is preferable that the protective insulating film 114 be of the same material as the hard mask film 112 and the barrier insulating film 107. When the same material is used, the protective insulating film 114 is integrated with the barrier insulating film 107 and the hard mask film 112 to enhance interface adhesion, enabling enhanced protection of the "two-terminal switch" 113.

The interlayer insulating film 115 is an insulating film formed on the protective insulating film 114. For example, a silicon oxide film, an SiOC film, or the like may be used as the interlayer insulating film 115. The interlayer insulating film 115 may be a laminate of a plurality of insulating films. The interlayer insulating film 115 may be of the same material as the interlayer insulating film 117. In the interlayer insulating film 115, prepared holes for embedding the via A 119a and the via B 119b are formed, and the via A 119a and the via B 119b are embedded in the prepared holes through the second barrier metal A 120a and the second barrier metal B 120b, respectively.

The Low-k insulating film 116 is an insulating film having a low relative dielectric constant, arranged between the interlayer insulating films 115 and 117, and a low-dielectric-constant film having a lower relative dielectric constant than a silicon oxide film (such as an SiOCH film) is used. Wiring grooves for embedding the second wiring A 118*a* and the second wiring B 118*b* are formed in the Low-k insulating film 116. The second wiring A 118*a* and the second wiring B 118*b* are embedded in the wiring grooves through the second barrier metal A 120*a* and the second barrier metal B 120*b*, respectively.

The interlayer insulating film 117 is an insulating film formed on the Low-k insulating film 116. For example, a silicon oxide film, an SiOC film, a low-dielectric-constant film having a lower relative dielectric constant than a silicon oxide film (such as an SiOCH film), or the like may be used as the interlayer insulating film 117. The interlayer insulating film 117 may be a laminate of a plurality of insulating films. The interlayer insulating film 117 may be of the same material as the interlayer insulating film 115. In the interlayer insulating film 117, wiring grooves for embedding the second wiring A 118*a* and the second wiring B 118*b* are formed, and the second wiring A 118*a* and the second wiring B 118*b* are embedded in the wiring grooves through the second barrier metal A 120*a* and the second barrier metal B 120*b*, respectively.

The second wiring A 118*a* and the second wiring B 118*b* are wirings embedded in the wiring grooves formed in the interlayer insulating film 117 and the Low-k insulating film 116, through the second barrier metal A 120*a* and the second barrier metal B 120*b*, respectively. The second wiring A 118*a* and the second wiring B 118*b* are respectively integrated with the via A 119*a* and the via B 119*b*. The via A 119*a* and the via B 119*b* are embedded in prepared holes formed in the interlayer insulating film 115, the protective insulating film 114, and, in the case of the via A 119*a*, the hard mask film 112, through the second barrier metal A 120*a* and the second barrier metal B 120*b*, respectively. The via A 119*a* is electrically connected to the upper second electrode 111 through the second barrier metal A 120*a*. For example, copper may be used for the second wiring A 118*a* and the second wiring B 118*b*, and the via A 119*a* and the via B 119*b*.

The second barrier metal A 120*a* and the second barrier metal B 120*b* are conductive films having a barrier property, covering the side surfaces and the bottom surfaces of the second wiring A 118*a* and the second wiring B 118*b*, and the via A 119*a* and the via B 119*b*. The covering prevents the metal forming the second wiring A 118*a* and the second wiring B 118*b* (including the via A 119*a* and the via B 119*b*) from diffusing into the interlayer insulating films 115 and 117, and a lower layer. When, for example, the second wiring A 118*a* and the second wiring B 118*b*, and the via A 119*a* and the via B 119*b* are composed of a metal element with copper being a main component, a refractory metal or a nitride thereof, such as tantalum, tantalum nitride, titanium nitride, and tungsten carbonitride, or a laminated film thereof may be used as the second barrier metal A 120*a* and the second barrier metal B 120*b*. It is preferable that the second barrier metal A 120*a* and the second barrier metal B 120*b* be of the same material as the upper second electrode 111. For example, when the second barrier metal A 120*a* and the second barrier metal B 120*b* have a laminated structure of tantalum nitride (lower layer)/tantalum (upper layer), it is preferable to use tantalum nitride being the lower layer material for the upper second electrode 111.

The barrier insulating film 121 is an insulating film formed on the interlayer insulating film 117 including the second wiring A 118*a* and the second wiring B 118*b*, and has a role in preventing oxidation of the metal forming the second wiring A 118*a* and the second wiring B 118*b* (such as copper). Further, the barrier insulating film 121 is an insulating film having a role in preventing the metal forming the second wiring A 118*a* and the second wiring B 118*b* from diffusing into an upper layer. For example, a silicon carbonitride film, a silicon nitride film, a laminated structure thereof, or the like may be used as the barrier insulating film 121.

(Mode 1)

Next, an advantage of the "two-terminal-switch" type switching element according to the aforementioned first exemplary embodiment will be described in accordance with FIG. 3. Further, an element configuration will be described in accordance with the terminology indicated in FIG. 2.

Figure 3:
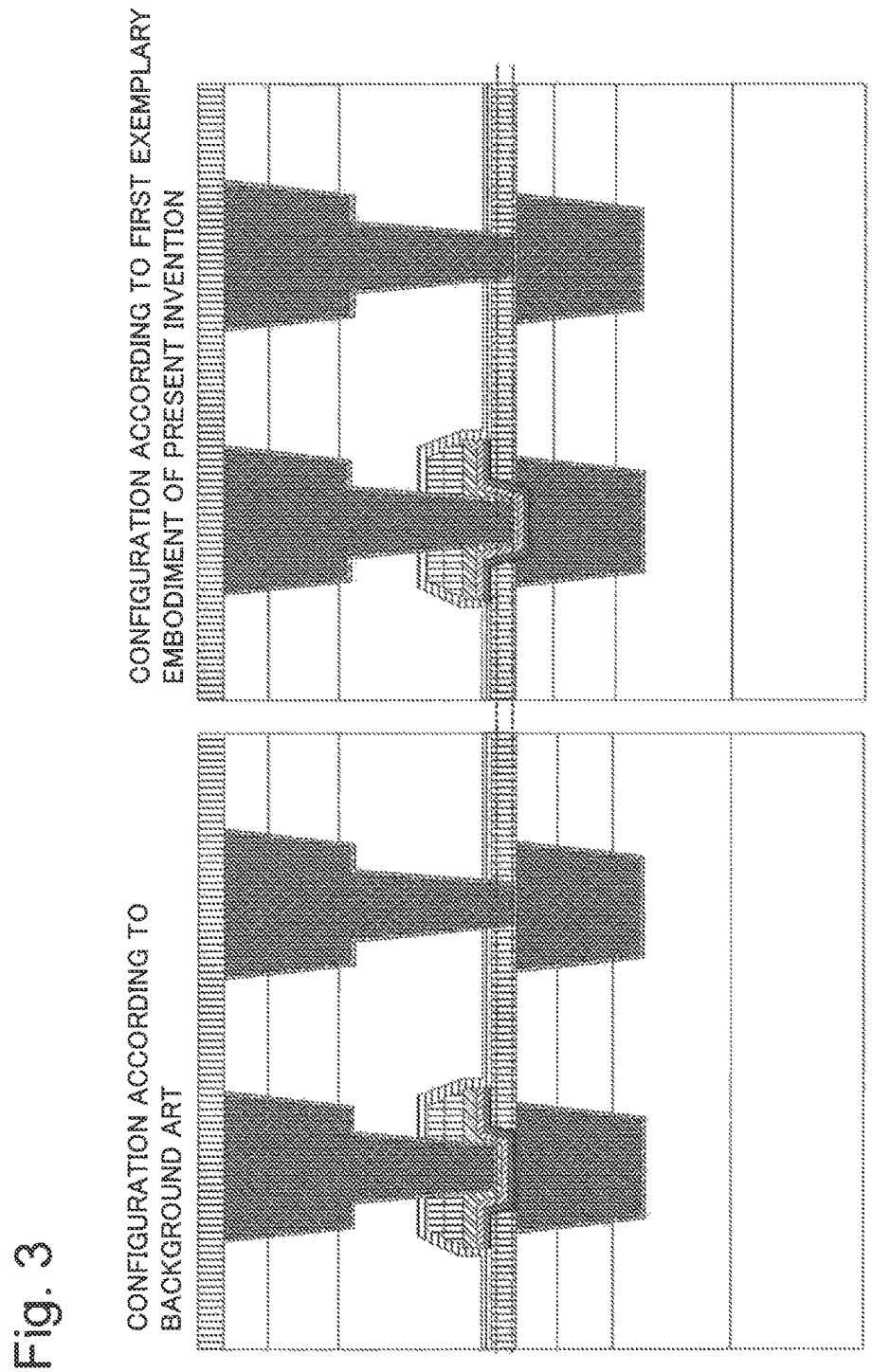
FIG. 3 is a schematic cross-sectional view comparing the configuration example of the two-terminal switching element in FIG. 2 with a configuration according to the background art.

FIG. 3 is a diagram illustrating a configuration according to the background art and a configuration according to the first exemplary embodiment of the present invention placed side by side, in terms of a "two-terminal-switch" type switching element formed in a multi-layered wiring layer. In the configuration according to the aforementioned first exemplary embodiment, the recess part 108 formed by digging down in a depth direction is formed on the first wiring A 105*a* at the opening surface formed on the barrier insulating film 107, and the two-terminal switch 113 is arranged down in a depth direction in the first wiring A 105*a*. By contrast, in the configuration according to the background art, the recess part 108 does not exist, and therefore the two-terminal switch 113 is formed immediately above the tapered surface of the barrier insulating film 107 and the first wiring A 105*a*. In the configuration according to the aforementioned first exemplary embodiment, by lowering the via A 119*a* so as to electrically connect to the upper second electrode 111 immediately above the recess part 108, a height difference from the via B 119*b* directly connecting to the first wiring B 105*b* becomes smaller compared with the configuration according to the background art. When the via A 119*a* and the via B 119*b* are exposed with one mask and formed by simultaneous etching, the upper second electrode 111 of the two-terminal switch 113 is exposed to an etching environment correspondingly to the height difference between the via A 119*a* and the via B 119*b*. Accordingly, in the configuration according to the first exemplary embodiment of the present invention in which the height difference between the via A 119*a* and the via B 119*b* can be reduced, plasma damage to the ion conduction layer 109 can be reduced.

(Mode 2)

Figure 4:
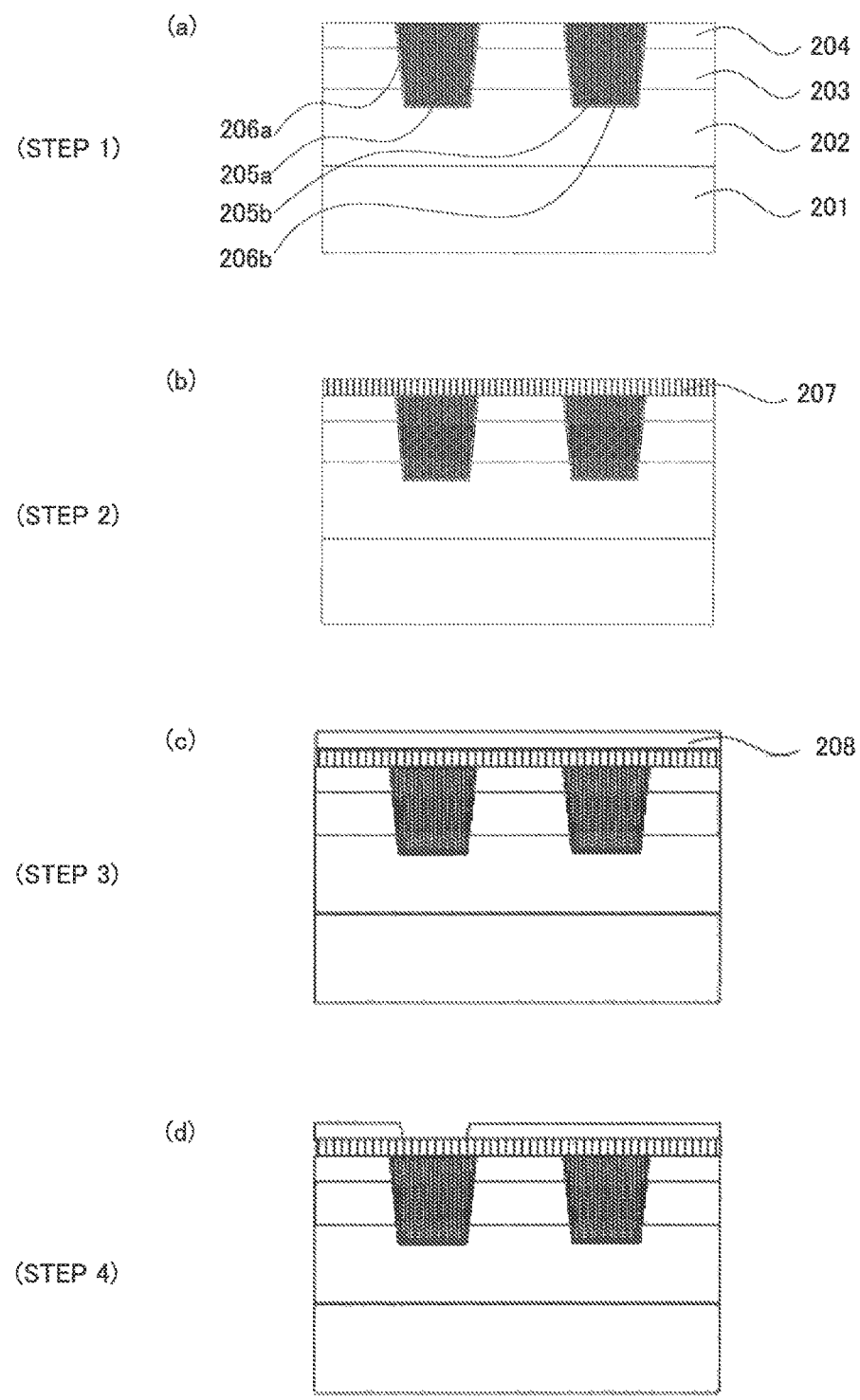
FIGS. 4(a) to 4(d) are schematic cross-sectional views illustrating a manufacturing process of a two-terminal switching element as an example of a manufacturing method of a semiconductor device according to the first exemplary embodiment of the present invention.
Figure 5:
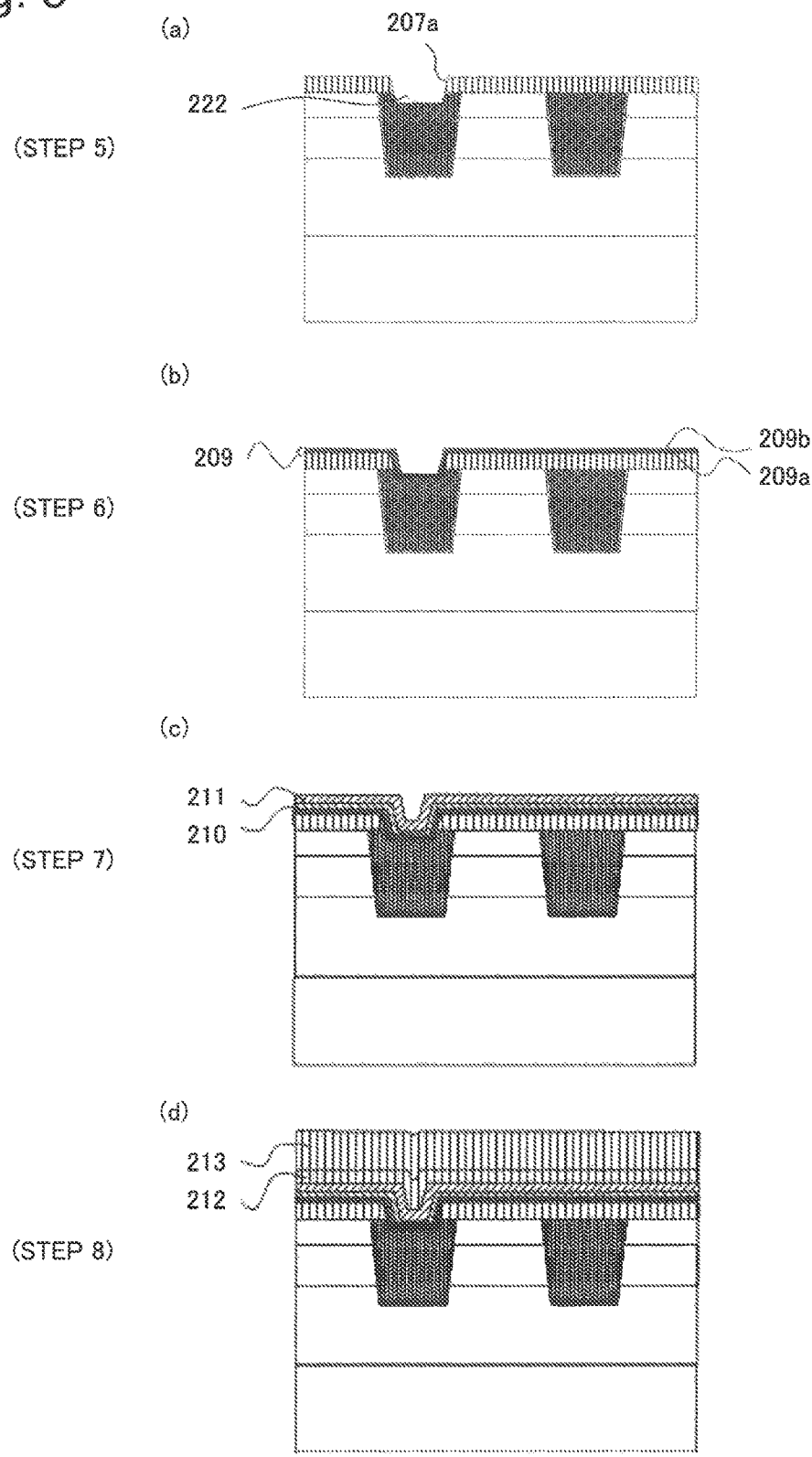
FIGS. 5(a) to 5(d) are schematic cross-sectional views illustrating a manufacturing process of the two-terminal switching element as an example of the manufacturing method of the semiconductor device according to the first exemplary embodiment of the present invention.
Figure 6:
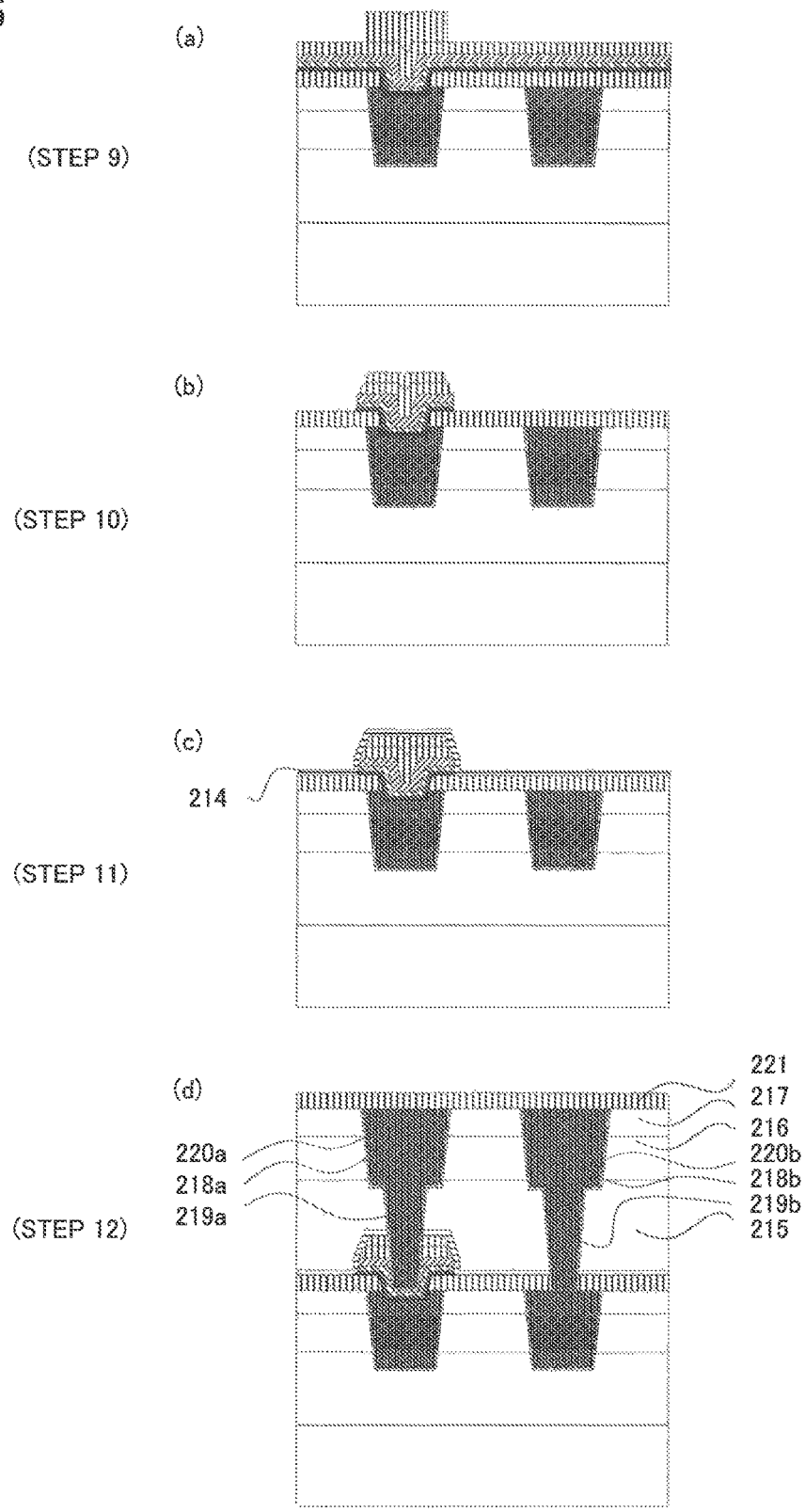
FIGS. 6(a) to 6(d) are schematic cross-sectional views illustrating a manufacturing process of the two-terminal switching element as an example of the manufacturing method of the semiconductor device according to the first exemplary embodiment of the present invention.

As Mode 2 according to the present exemplary embodiment, a manufacturing process of a semiconductor device forming a switching element employing a "two-terminal switch" configuration inside a multi-layered wiring layer will be described. Steps of forming a switching element employing a "two-terminal switch" configuration in a multi-layered wiring layer in particular will be described. FIGS. 4(*a*) to 4(*d*), FIGS. 5(*a*) to 5(*d*), and FIGS. 6(*a*) to 6(*d*) are schematic cross-sectional views illustrating a manufacturing process of a two-terminal switching element as an example of a manufacturing method of the semiconductor device according to the first exemplary embodiment of the present invention.

(Step 1)

As illustrated in FIG. 4(*a*), an interlayer insulating film 202 (such as a silicon oxide film with a film thickness of 500 nm) is deposited on a semiconductor substrate 201 (such as a substrate on which a semiconductor element is formed). Then, a low-dielectric-constant film having a low relative dielectric constant (such as an SiOCH film with a film thickness of 150 nm) is deposited as a Low-k insulating film 203 on the interlayer insulating film 202. Then, a silicon oxide film (such as a silicon oxide film with a film thickness of 100 nm) is deposited as an interlayer insulating film 204 on the Low-k insulating film 203. Then, wiring grooves are formed in the interlayer insulating film 202, the Low-k insulating film 203, and the interlayer insulating film 204 by use of a lithography method (method including photoresist formation, dry etching, and photoresist removal).

Subsequently, a first wiring A 205a and a first wiring B 205b (such as copper) are embedded in the wiring grooves through a first barrier metal A 206a and a first barrier metal B 206b (such as tantalum nitride/tantalum with film thicknesses of 5 nm/5 nm, respectively). The interlayer insulating films 202 and 204 may be formed by a plasma-enhanced CVD method. The first wiring A 205a and the first wiring B 205b may be formed by, for example, forming barrier metals (such as laminated films of tantalum nitride/tantalum) by a PVD method, burying copper in the wiring grooves by an electrolytic plating method after forming copper seeds by the PVD method, and removing excess copper not existing inside the wiring grooves by a Chemical Mechanical Polishing (CMP) method after heat treatment at a temperature of 200° C. or higher. Common techniques in the relevant technological fields may be used in the series of copper wiring forming methods. The CMP method is a method of planarization by bringing unevenness of a wafer surface generated in a multi-layered wiring forming process into contact with a rotating polishing pad to polish the unevenness, while flowing a polishing solution on the wafer surface. An embedded wiring (damascene wiring) is formed by polishing excess copper embedded in a groove, and planarization is performed by polishing an interlayer insulating film.

(Step 2)

As illustrated in FIG. 4(b), a barrier insulating film 207 (such as a silicon nitride film or a silicon carbonitride film with a film thickness of 30 nm) is formed on the interlayer insulating film 204 including the first wiring A 205a and the first wiring B 205b. The barrier insulating film 207 may be formed by a plasma-enhanced CVD method. It is preferable that a film thickness of the barrier insulating film 207 be around 10 nm to 50 nm.

(Step 3)

As illustrated in FIG. 4(c), a hard mask film 208 (such as a silicon oxide film with a film thickness of 40 nm) is formed on the barrier insulating film 207. At this time, it is preferable that the hard mask film 208 be of a different material from the barrier insulating film 207 from the viewpoint of keeping an etching selection ratio high in dry etching processing, and may be an insulating film or a conductive film. For example, silicon oxide, silicon nitride, titanium nitride, titanium, tantalum, tantalum nitride, and the like, and also a laminated body of a silicon nitride film/silicon oxide film may be used as the hard mask film 208.

(Step 4)

As illustrated in FIG. 4(d), an opening pattern is formed on the hard mask film 208 by forming a photoresist (unillustrated) pattern on the hard mask film 208, and performing dry etching using the photoresist as a mask. Then, the photoresist is stripped by oxygen plasma ashing or the like. At this time, the aforementioned dry etching is not necessarily required to stop on an upper surface of the barrier insulating film 207, and may reach inside the barrier insulating film 207.

(Step 5)

As illustrated in FIG. 5(a), an opening 207a is formed on the barrier insulating film 207 by etching back (dry etching) the barrier insulating film 207 exposed from the opening of the hard mask film 208 by use of the hard mask film 208 as a mask. By the formation of the opening 207a, the first wiring A 205a is exposed from the opening 207a of the barrier insulating film 207. Then, by being exposed to plasma using a mixed gas of nitrogen and argon, copper oxide formed on the exposed surface of the first wiring A 205a is removed, and a by-product of etching generated upon the etch back, and the like, are removed. Furthermore, the exposed first wiring A 205a is dry etched to form a recess part 222 by use of an inert gas such as helium, argon, and nitrogen, or a halogen gas, a fluorocarbon-based gas, or a mixed gas thereof.

In etch back of the barrier insulating film 207, a wall surface of the opening 207a of the barrier insulating film 207 can be formed as a tapered surface by use of reactive dry etching. In reactive dry etching, a gas containing carbon fluoride can be used as an etching gas. While it is preferable that the hard mask film 208 be completely removed during the etch back, the film may remain intact when the film is of an insulating material. Further, a shape of the opening 207a of the barrier insulating film 207 is circular, and a diameter of the circle may range from 30 nm to 500 nm. It is desirable that Radio Frequency (RF) etching be performed in an ultrahigh vacuum (less than or equal to $10^{-5}$ Pa) in the formation of the recess part 222. It is desirable to use a nonresponsive gas such as helium, argon, and nitrogen as the etching gas. Further, it is desirable that bias power (ionized gas pull-in power toward the wafer side) in etching be set to 150 W or lower so as not to increase surface roughness of the recess part 222. There may be a case that an unintended recess part is formed in etching with high bias power, and, in such a case, roughness of the recess part is likely to increase compared with the exemplary embodiment of the present invention. When the surface roughness increases, there is a risk of increase in variation of switching voltage, leak current, and reliability, of the two-terminal switch. The etching using a nonresponsive gas progresses isotropically, and therefore a side surface of the recess part 222 can be tapered. An etching rate and an etching time are adjusted so that the film thickness of the barrier insulating film 207 is not entirely etched by dry etching for forming the recess part 222. It is desirable that a height (depth) of the recess part 222 be around 5 nm to 20 nm.

(Step 6)

As illustrated in FIG. 5(b), an ion conduction layer 209 is formed on the barrier insulating film 207 including the first wiring A 205a. First, 1 nm of zirconium is deposited by a sputtering method. The zirconium is oxidized in formation of a second ion conduction layer 209b to form a first ion conduction layer 209a. At this time, a metal constituting the first ion conduction layer 209a diffuses into a part in contact with the first ion conduction layer 209a in the recess part 222, and an alloy layer is formed spontaneously. Additionally, by performing annealing in a vacuum environment at a temperature of 350° C., the thickness of the alloy layer can be increased. It is preferable to perform the annealing for around two minutes. Furthermore, an SiOCH-based polymer film containing silicon, oxygen, carbon, and hydrogen is formed as the second ion conduction layer 209b by the plasma-enhanced CVD. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to in a range of 10 to 200 sccm, and a supply amount of helium is set to 500 sccm through a raw material vaporizer. Additionally, 500 sccm of helium is directly supplied to the reaction chamber through another line. Moisture and the like are adhered to the opening 207a of the barrier insulating film 207 due to atmospheric exposure, and therefore it is preferable to perform degassing by applying heat treatment at reduced pressure at a temperature around 250° C. to 350° C. before deposition of the first ion conduction layer 209a.

(Step 7)

As illustrated in FIG. 5(c), an "alloy of ruthenium and titanium" is formed as a lower second electrode 210 with a film thickness of 10 nm on the ion conduction layer 209 by a co-sputtering method. At this time, a ruthenium target and a titanium target exist in a same chamber, and an alloy film is deposited by simultaneous sputtering. At this time, power applied to the ruthenium target is set to 150 W and power applied to the titanium target is set to 50 W, so as to make a content ratio of ruthenium in the "alloy of ruthenium and titanium" 75 atm %. Further, an upper second electrode 211 is formed on the lower second electrode 210. Titanium nitride is formed as the upper second electrode 211 with a film thickness of 25 nm by a reactive sputtering method. At this time, power applied to a titanium target is set to 600 W, and a nitrogen gas and an argon gas are introduced into a chamber for sputtering. At this time, a ratio between a flow rate of nitrogen and a flow rate of argon is set to 1:1 so as to make a ratio of titanium in the titanium nitride 70 atm %.

(Step 8)

As illustrated in FIG. 5(d), a hard mask film 212 (such as a silicon nitride film or a silicon carbonitride film with a film thickness of 30 nm) and a hard mask film 213 (such as a silicon oxide film with a film thickness of 80 nm) are laminated on the upper second electrode 211 in this order. The hard mask film 212 and the hard mask film 213 may be formed by use of a plasma-enhanced CVD method. The hard mask films 212 and 213 may be formed by use of a common plasma-enhanced CVD method in the relevant technological field. Further, it is preferable that the hard mask film 212 and the hard mask film 213 be different types of films, and, for example, the hard mask film 212 may be a silicon nitride film, and the hard mask film 213 may be a silicon oxide film. At this time, it is preferable that the hard mask film 212 is of the same material as a protective insulating film 214, to be described later, and the barrier insulating film 207. In other words, by surrounding an entire periphery of the two-terminal switch with a same material to integrate a material interface, ingress of moisture from outside can be prevented, and separation of a constituent element of the two-terminal switch itself can be prevented. Further, while the hard mask film 212 may be formed by a plasma-enhanced CVD method, it is preferable to use a high-density silicon nitride film formed with, for example, high-density plasma of a mixed gas of $SiH_4/N_2$.

(Step 9)

As illustrated in FIG. 6(a), a photoresist (unillustrated) for patterning a "two-terminal switch" part is formed on the hard mask film 213, and then, using the photoresist as a mask, the hard mask film 213 is dry etched until the hard mask film 212 appears. Then, the photoresist is removed by use of oxygen plasma ashing and organic stripping.

(Step 10)

As illustrated in FIG. 6(b), the hard mask film 212, the upper second electrode 211, the lower second electrode 210, and the ion conduction layer 209 are continuously dry etched using the hard mask film 213 as a mask. At this time, while it is preferable that the hard mask film 213 be completely removed during the etch back, it may remain intact. For example, when the upper second electrode 211 is of titanium nitride, $Cl_2$-based Reactive Ion Etching (RIE) processing can be performed, and, when the lower second electrode 210 is of an alloy of ruthenium and titanium, RIE processing with a mixed gas of $Cl_2/O_2$ can be performed. Further, in the etching of the ion conduction layer 209, it is required to stop dry etching on the barrier insulating film 207 being a lower surface. When the ion conduction layer 209 is an SiOCH-based polymer film containing silicon, oxygen, carbon, and hydrogen, and the barrier insulating film 207 is a silicon nitride film or a silicon carbonitride film, RIE processing can be performed by adjusting an etching condition with a mixed gas such as $CF_4$-based, $CF_4/Cl_2$-based, and $CF_4/Cl_2/Ar$-based. By use of such a hard mask RIE method, a variable resistance element part can be processed without exposing the variable resistance element part to oxygen plasma ashing for resist removal. Further, when oxidation treatment is performed with oxygen plasma after the processing, the oxidation plasma treatment can be irradiated without depending on a resist stripping time.

(Step 11)

As illustrated in FIG. 6(c), the protective insulating film 214 (such as a silicon nitride film or a silicon carbonitride film with a film thickness of 20 nm) is deposited on the barrier insulating film 207 including the hard mask film 212, the upper second electrode 211, the lower second electrode 210, and the ion conduction layer 209. While the protective insulating film 214 may be formed by a plasma-enhanced CVD method, a reaction chamber needs to be maintained at reduced pressure before film-forming, and, at this time, a problem occurs that oxygen separates from a side surface of the ion conduction layer 209, and leak current of the ion conduction layer 209 increases. In order to suppress the problem, it is preferable that a film-forming temperature of the protective insulating film 214 be 300° C. or lower. Additionally, exposure to a film-forming gas at reduced pressure occurs before the film-forming, therefore it is preferable that a reducing gas be not used. For example, it is preferable to use a silicon nitride film formed with high-density plasma of a mixed gas of $SiH_4/N_2$ at a substrate temperature of 300° C.

(Step 12)

As illustrated in FIG. 6(d), an interlayer insulating film 215 (such as a silicon oxide film), a low-dielectric-constant film having a low relative dielectric constant (such as an SiOCH film with a film thickness of 150 nm) as a Low-k insulating film 216, and an interlayer insulating film 217 (such as a silicon oxide film) are deposited on the protective insulating film 214 in this order. Then, wiring grooves for a second wiring A 218a and a second wiring B 218b, and prepared holes for a via A 219a and a via B 219b are formed. Furthermore, by use of a copper dual-damascene wiring process, the second wiring A 218a and the second wiring B 218b (such as copper), and the via A 219a and the via B 219b (such as copper) are simultaneously formed in the wiring grooves and the prepared holes through a second barrier metal A 220a and a second barrier metal B 220b (such as tantalum nitride/tantalum), respectively. Then, a barrier insulating film 221 (such as a silicon nitride film) is deposited on the interlayer insulating film 217 including the second wiring A 218a and the second wiring B 218b. A process similar to the formation of the lower-layer wiring may be used for the formation of the second wiring A 218a and the second wiring B 218b. At this time, by making a material of the second barrier metal A 220a same as the upper second electrode 211, contact resistance between the second barrier metal A 220a and the upper second electrode 211 can be reduced, and element performance can be enhanced. The interlayer insulating film 215, the Low-k insulating film 216, and the interlayer insulating film 217 may be formed by a plasma-enhanced CVD method. In order to clear a level difference formed by the "two-terminal switch," the interlayer insulating film 215 may be thickly deposited and planarized by a CMP method, so as to be set to a desired film thickness. The via A 219a and the via B 219b are formed by patterning by exposure with a same photomask and simultaneous etching. The upper second electrode 211 is exposed to etching correspondingly to a height difference between the via A 219a and the via B 219b, and is dug down in a depth direction.

(Mode 3)

Figure 7:
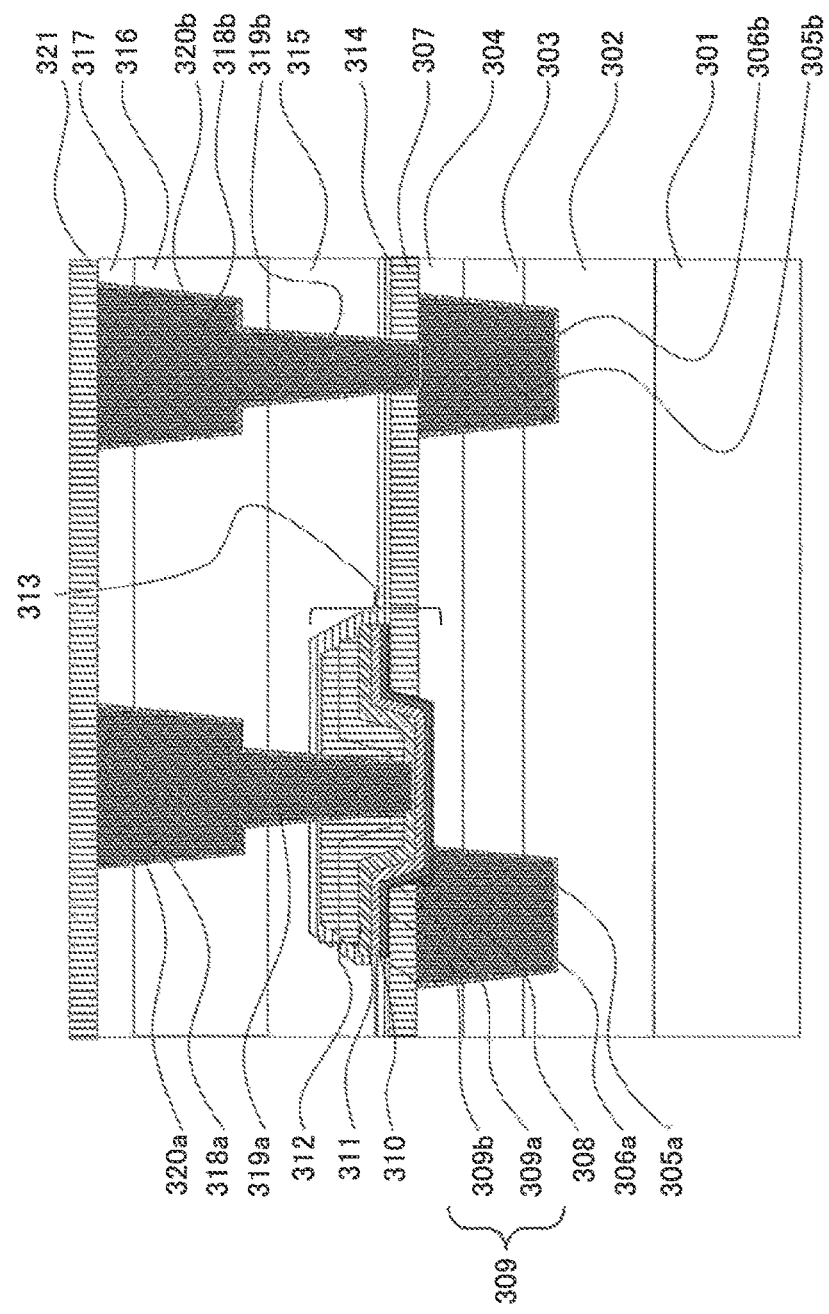
FIG. 7 is a schematic cross-sectional view illustrating another configuration example of a two-terminal switching element as a semiconductor device according to the first exemplary embodiment of the present invention.

As Mode 3 according to the present exemplary embodiment, another configuration example of a "two-terminal switch formed inside a multi-layered wiring layer" will be described. FIG. 7 is a cross-sectional view schematically illustrating a configuration example of a switching element employing a "two-terminal switch formed inside a multi-layered wiring layer" according to the first exemplary embodiment. The example is a semiconductor device including a two-terminal switch 313 inside a multi-layered wiring layer on a semiconductor substrate 301.

The multi-layered wiring layer includes an insulating laminated body in which an interlayer insulating film 302, a Low-k insulating film 303, an interlayer insulating film 304, a barrier insulating film 307, a protective insulating film 314, an interlayer insulating film 315, a Low-k insulating film 316, an interlayer insulating film 317, and a barrier insulating film 321 are laminated on the semiconductor substrate 301 in this order. In the multi-layered wiring layer, a first wiring A 305a and a first wiring B 305b are embedded in wiring grooves formed in the interlayer insulating film 304 and the Low-k insulating film 303 through a first barrier metal A 306a and a first barrier metal B 306b, respectively. In the multi-layered wiring layer, a second wiring A 318a and a second wiring B 318b are embedded in wiring grooves formed in the interlayer insulating film 317 and the Low-k insulating film 316. Additionally, a via A 319a and a via B 319b are embedded in prepared holes formed in the interlayer insulating film 315, the protective insulating film 314, and a hard mask film 312. Additionally, the second wiring A 318a and the via A 319a, and the second wiring B 318b and the via B 319b, are respectively integrated. Additionally, side surfaces and bottom surfaces of the second wiring A 318a and the via A 319a, and the second wiring B 318b and the via B 319b are respectively covered by a second barrier metal A 320a and a second barrier metal B 320b. In the multi-layered wiring layer, at an opening formed on the barrier insulating film 307, the two-terminal switch 313, in which an ion conduction layer 309, a lower second electrode 310, and an upper second electrode 311 are laminated in this order, is formed on the first wiring A 305a as a first electrode, the interlayer insulating film 304 in contact with the first wiring A 305a, a wall surface of the opening of the barrier insulating film 307, and the barrier insulating film 307. The hard mask film 312 is formed on the upper second electrode 311, and an upper surface and a side surface of a laminated body including the ion conduction layer 309, the lower second electrode 310, the upper second electrode 311, and the hard mask film 312 are covered by the protective insulating film 314. By making part of the first wiring A 305a as a lower electrode of the "two-terminal switch" 313, electrode resistance can be reduced while simplifying a number of steps. By merely creating at least a 2PR mask set as an additional step to a common copper damascene wiring process, the "two-terminal switch" 313 can be integrated, and reduction in resistance and a cost of the element can be concurrently achieved.

In the "two-terminal switch" 313, a first ion conduction layer 309a is in direct contact with the first wiring A 305a and part of the interlayer insulating film 304 in an opening region formed on the barrier insulating film 307. Then, a metal constituting the first ion conduction layer 309a diffuses into the first wiring A 305a to form an alloy layer at an interface. In the "two-terminal switch" 313, the via A 319a and the upper second electrode 311 are electrically connected through the second barrier metal A 320a, on the upper second electrode 311. The "two-terminal switch" 313 is controlled in ON or OFF state by applying voltage or passing current. The switch is controlled in ON or OFF state by, for example, utilizing electric field diffusion of a metal ion supplied from a metal forming the first wiring A 305a, into the first ion conduction layer 309a and a second ion conduction layer 309b.

As illustrated in FIG. 7, in the opening region formed on the barrier insulating film 307, the first wiring A 305a and part of the interlayer insulating film 304 in contact with a side surface of the first wiring A 305a include a recess part 308 formed by digging down in a depth direction. The first ion conduction layer 309a is in contact with the first wiring A 305a and the part of the interlayer insulating film 304 in contact with the side surface of the first wiring A 305a at the recess part 308. Further, the via B 319b is in contact with the first wiring B 305b through the second barrier metal B 320b, without intervening the two-terminal switch between the first wiring B 305b and the via B 319b. The two-terminal switch 313 is arranged down in a depth direction correspondingly to the recess part 308. Thus, a difference between a height of the via A 319a in contact with the upper second electrode 311 through the second barrier metal A 320a, and a height of the via B 319b in contact with the first wiring B 305b through the second barrier metal B 320b, can be reduced. Specifically, the difference amounts to nearly a thickness of the lower second electrode 310. Accordingly, when the via A 319a and the via B 319b are exposed by use of a same photomask and formed by plasma etching simultaneously, plasma damage in the two-terminal switch 313 is reduced to an amount corresponding to the height difference between the via A 319a and the via B 319b, and degradation in element performance of the two-terminal switch 313 can be suppressed.

The semiconductor substrate 301 is a substrate on which a semiconductor element is formed. A substrate such as a silicon substrate, a single-crystal substrate, a silicon-on-insulator (SOI) substrate, a thin-film transistor (TFT) substrate, and a substrate for manufacturing a liquid crystal display (LCD) may be used as the semiconductor substrate 301. The interlayer insulating film 302 is an insulating film formed on the semiconductor substrate 301. For example, a silicon oxide film, an SiOC film, or the like may be used as the interlayer insulating film 302. The interlayer insulating film 302 may be a laminate of a plurality of insulating films.

The Low-k insulating film 303 is an insulating film having a low relative dielectric constant, arranged between the interlayer insulating films 302 and 304, and a low-dielectricconstant film (such as an SiOCH film) having a relative dielectric constant lower than a silicon oxide film, or the like is used. Wiring grooves for embedding the first wiring A 305*a* and the first wiring B 305*b* are formed in the Low-k insulating film 303, and the first wiring A 305*a* and the first wiring B 305*b* are embedded in the wiring grooves through the first barrier metal A 306*a* and the first barrier metal B 306*b*, respectively.

The interlayer insulating film 304 is an insulating film formed on the Low-k insulating film 303. For example, a silicon oxide film, an SiOC film, or the like may be used as the interlayer insulating film 304. The interlayer insulating film 304 may be a laminate of a plurality of insulating films. Wiring grooves for embedding the first wiring A 305*a* and the first wiring B 305*b* are formed in the interlayer insulating film 304. The first wiring A 305*a* and the first wiring B 305*b* are embedded in the wiring grooves through the first barrier metal A 306*a* and the first barrier metal B 306*b*, respectively.

The first wiring A 305*a* is a wiring embedded in the wiring groove formed in the interlayer insulating film 304 and the Low-k insulating film 303 through the first barrier metal A 306*a*. The first wiring A 305*a* also serves as the lower electrode of the two-terminal switch 313, and is in direct contact with the first ion conduction layer 309*a*. An upper surface of the first ion conduction layer 309*a* is in direct contact with the second ion conduction layer 309*b*, and an upper surface of the second ion conduction layer 309*b* is in direct contact with the lower second electrode 310. A metal capable of diffusion and ionic conduction in the ion conduction layer 309, such as copper, may be used as a metal constituting the first wiring A 305*a*. The metal constituting the first wiring A 305*a* (such as copper) may be alloyed with aluminum. The first wiring A 305*a* and part of the interlayer insulating film 304 in contact with the first wiring A 305*a* include the recess part 308 formed by digging down in a depth direction at the opening surface of the barrier insulating film 307. The first wiring A 305*a* is in contact with the first ion conduction layer 309*a* at the recess part 308. An alloy layer with a metal constituting the first ion conduction layer 309*a*, to be described later, is formed at an interface between the recess part 308 and the first ion conduction layer 309*a*. The alloy layer is not formed throughout the first wiring A 305*a*, but is formed only at the opening surface of the barrier insulating film 307. The two-terminal switch 313 is arranged down in a depth direction correspondingly to the recess part 308. Thus, a difference between a height of the via A 319*a* in contact with the upper second electrode 311 through the second barrier metal A 320*a*, and a height of the via B 319*b* in contact with the first wiring B 305*b* through the second barrier metal B 320*b*, can be reduced. Specifically, the difference amounts to nearly a thickness of the lower second electrode 310. Accordingly, when the via A 319*a* and the via B 319*b* are exposed by use of a same photomask and formed by plasma etching simultaneously, plasma damage in the two-terminal switch 313 is reduced to an amount corresponding to the height difference between the via A 319*a* and the via B 319*b*, and degradation in element performance of the two-terminal switch 313 can be suppressed. Formation of the recess part 308 is performed after forming the opening surface of the barrier insulating film 307 in contact with the first wiring A 305*a*, by supplying onto the substrate including the first wiring A 305*a*, in a dry etching apparatus, plasma using a halogen gas, an inert gas, or a fluorocarbon-based gas, or a mixed gas thereof. At this time, while the barrier insulating film 307 is also etched, the first wiring B 305*b* not forming the two-terminal switch 313 is not exposed to the plasma, and is not dug down.

The first wiring B 305*b* is a wiring embedded in the wiring groove formed in the interlayer insulating film 304 and the Low-k insulating film 303 through the first barrier metal B 306*b*. The first wiring B 305*b* is in direct contact with the via B 319*b* at the opening of the barrier insulating film 307 through the second barrier metal B 320*b*.

The first barrier metal A 306*a* and the first barrier metal B 306*b* are conductive films having a barrier property, covering side surfaces and bottom surfaces of the wirings, in order to prevent the metal forming the first wiring A 305*a* and the first wiring B 305*b* from diffusing into the interlayer insulating film 304 and a lower layer. When, for example, the first wiring A 305*a* and the first wiring B 305*b* are composed of a metal element with copper being a main component, a refractory metal or a nitride thereof such as tantalum, tantalum nitride, titanium nitride, and tungsten carbonitride, or a laminated film thereof may be used as the first barrier metal A 306*a* and the first barrier metal B 306*b*.

The barrier insulating film 307 is formed on the interlayer insulating film 304 including the first wiring A 305*a* and the first wiring B 305*b*, and has a role in preventing oxidation of the metal forming the first wiring A 305*a* and the first wiring B 305*b* (such as copper). Further, the barrier insulating film 307 has a role in preventing the metal forming the first wiring A 305*a* and the first wiring B 305*b* from diffusing into the interlayer insulating film 315, and a role as an etching stopper layer upon processing of the upper second electrode 311, the lower second electrode 310, and the ion conduction layer 309. For example, an SiC film, a silicon carbonitride film, a silicon nitride film, or a laminated structure thereof may be used as the barrier insulating film 307. It is preferable that the barrier insulating film 307 be of the same material as the protective insulating film 314 and the hard mask film 312.

The first ion conduction layer 309*a* and the second ion conduction layer 309*b* are films with variable resistance. A material varying resistance by an action (such as diffusion and ion conduction) of a metal ion generated from the metal forming the first wiring A 305*a* (lower electrode) may be used. When resistance change of the "two-terminal switch" 313 accompanying switching to an "ON" state is performed by precipitation of metal due to reduction of a metal ion, an ion-conductible film is used.

The second ion conduction layer 309*b* is formed by use of a plasma-enhanced CVD method. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to 10 to 200 sccm, and a supply amount of helium is set to 500 sccm through a raw material vaporizer. The thus formed second ion conduction layer 309*b* is a porous polymer having silicon, oxygen, and carbon as main components, and, for example, has a relative dielectric constant greater than or equal to 2.1 and less than or equal to 3.0.

The first ion conduction layer 309*a* has a role in preventing the metal forming the first wiring A 305*a* from diffusing into the second ion conduction layer 309*b* due to heating and plasma during deposition of the second ion conduction layer 309*b*. Further, the first ion conduction layer 309*a* has a role in preventing the first wiring A 305*a* from being oxidized and becoming more likely to diffuse into the second ion conduction layer 309*b*. A metal forming the first ion conduction layer 309*a*, such as zirconium, hafnium, aluminum, and titanium, is exposed to an oxygen atmosphere in a deposition chamber for the second ion conduction layer 309b at reduced pressure, after film formation of the metal constituting the first ion conduction layer 309a. The metal exposed to the oxygen atmosphere turns to zirconium oxide, hafnium oxide, aluminum oxide, or titanium oxide, and becomes part of the ion conduction layer 309. An optimum film thickness of the metal film forming the first ion conduction layer 309a is 0.5 to 1 nm. The metal film used for forming the first ion conduction layer 309a may form a laminate or may be a single layer. It is preferable that formation of the first ion conduction layer 309a be performed by sputtering. A metal atom or ion gaining energy by sputtering rushes and diffuses into the first wiring A 305a to form an alloy layer.

The ion conduction layer 309 is formed on the first wiring A 305a, the recess part 308 of the first wiring A 305a, a tapered surface of the recess part formed at the opening of the barrier insulating film 307, a tapered surface of the barrier insulating film 307, the barrier insulating film 307, and part of the interlayer insulating film 304 in contact with the first wiring A 305a. In the ion conduction layer 309, an outer periphery of a connecting part of the first wiring A 305a and the ion conduction layer 309 is arranged at least along the tapered surface of the recess part 308 and a tapered surface of the opening of the barrier insulating film 307.

The lower second electrode 310 is an electrode on the lower layer side of an upper electrode of the "two-terminal switch" 313, and is in direct contact with the second ion conduction layer 309b. An alloy containing ruthenium, and titanium, tantalum, zirconium, hafnium, aluminum, or the like, having good adhesion with the metal forming the first wiring A 305a, is used for the lower second electrode 310. Ruthenium is a metal more resistant to ionization than the metal forming the first wiring A 305a, and is resistant to diffusion and ionic conduction in the second ion conduction layer 309b.

In a ruthenium alloy used in formation of the lower second electrode 310, it is desirable to select, as a first metal to be added to ruthenium, an added metal having a standard Gibbs energy of formation of a process of generating a metal ion from the metal (oxidation process) greater than ruthenium in a negative direction. Titanium, tantalum, zirconium, hafnium, and aluminum, each having a standard Gibbs energy of formation of a process of generating a metal ion from the metal (oxidation process) greater than ruthenium in a negative direction, exhibit stronger likelihood of spontaneously generating a chemical reaction compared with ruthenium, and therefore have high reactivity. Consequently, in the ruthenium alloy forming the lower second electrode 310, adhesion with a metal bridge formed by the metal forming the first wiring A 305a is enhanced by alloying with ruthenium. By contrast, when the lower second electrode 310 is composed of only an added metal such as titanium, tantalum, zirconium, hafnium, and aluminum, without ruthenium, reactivity becomes so high that transition to an "OFF" state does not occur. The transition from an "ON" state to an "OFF" state progresses by an oxidation reaction (dissolution reaction) of the metal bridge. When a metal having a standard Gibbs energy of formation of a process of generating a metal ion from the metal (oxidation process) greater than the metal forming the first wiring A 305a in a negative direction is used as a metal constituting the lower second electrode 310, transition to an "OFF" state is not likely to occur. The reason is that an oxidation reaction of the lower second electrode 310 progresses ahead of an oxidation reaction of the metal bridge formed by the metal forming the first wiring A 305a. Accordingly, a metal material used for formation of the lower second electrode 310 needs to be alloyed with ruthenium having a standard Gibbs energy of formation of a process of generating a metal ion from the metal (oxidation process) less in a negative direction than copper. Furthermore, when copper being a component of the metal bridge is mixed into the lower second electrode 310, an effect of adding a metal having a large standard Gibbs energy in a negative direction is diminished, and therefore it is preferable that a metal added to ruthenium be a material having a barrier property with respect to copper and a copper ion. For example, tantalum, titanium, or the like may be used. Meanwhile, it is known that a greater amount of an added metal stabilizes an "ON" state accordingly, and it is also known that an addition of 5 atm % enhances the stability. When an added metal is titanium, in particular, excellent transition to an "OFF" state and excellent stability of an "ON" state are exhibited, and it is particularly preferable that the lower second electrode 310 be composed of an alloy of ruthenium and titanium, and a content ratio of titanium be in a range of 20 atm % to 30 atm %. It is desirable that a content ratio of ruthenium in the ruthenium alloy be greater than or equal to 60 atm % and less than or equal to 90 atm %.

It is desirable to use a sputtering method for forming the lower second electrode 310. When forming an alloy by use of a sputtering method, a method of using an alloy target of ruthenium and a first metal, a co-sputtering method of sputtering a ruthenium target and a first metal target simultaneously in a same chamber, and an intermixing method of forming a thin film of a first metal in advance, performing film-forming of ruthenium thereon by use of a sputtering method, and performing alloying by energy of colliding atoms, are available. By use of the co-sputtering method and the intermixing method, composition of an alloy can be changed. When the intermixing method is adopted, it is preferable that heat treatment at 400° C. or lower be applied for "flattening" of a mixed state, after film-forming of ruthenium is completed.

The upper second electrode 311 is an electrode on the upper layer side of the upper electrode of the "two-terminal switch" 313, and is formed on the lower second electrode 310. The upper second electrode 311 has a role in protecting the lower second electrode 310. Specifically, by the upper second electrode 311 protecting the lower second electrode 310, damage to the lower second electrode 310 in a process can be suppressed, and a switching characteristic of the "two-terminal switch" 313 can be maintained. For example, tantalum, titanium, tungsten, a nitride thereof, or the like may be used for the upper second electrode 311. Further, when electrically connecting the via A 319a on the lower second electrode 310, the upper second electrode 311 also functions as an etching stopper layer. Accordingly, it is preferable that an etching rate of the electrode be low with respect to plasma of a fluorocarbon-based gas used for etching the interlayer insulating film 315.

The upper second electrode 311 is composed of a metal nitride. A nitride of titanium, tantalum, zirconium, hafnium, or aluminum, functioning as an etching stopper layer and having conductivity, is particularly preferable. When a metal not being a nitride is used for the upper second electrode 311, defects may be generated in the lower second electrode 310 by part of the metal diffusing into the lower second electrode 310 due to heating and plasma damage during the process. Starting from the defects, dielectric breakdown voltage of the ion conduction layer 109 may be decreased. By using a metal nitride being a stable compound having electrical conductivity for the upper second electrode 311, diffusion of the metal into the lower second electrode 310 can be prevented. It is particularly preferable that a metal in a metal nitride constituting the upper second electrode 311 and an added metal forming an alloy with ruthenium constituting the lower second electrode 310 be a same metal. Consequently, diffusion failure of the metal forming the alloy with ruthenium can be more efficiently prevented. For example, when the lower second electrode 310 is an alloy electrode of ruthenium and titanium, it is preferable that the upper second electrode 311 be a titanium nitride electrode. Alternatively, when the lower second electrode 310 is an alloy of ruthenium and tantalum, the upper second electrode 311 should be a tantalum nitride electrode. By matching metal components constituting the lower second electrode 310 and the upper second electrode 311, even in case that the metal in the upper second electrode 311 diffuses into the lower second electrode 310, defects are less likely to form. At this time, a ratio of metal to nitrogen in the nitride constituting the upper second electrode 311 is set to be greater than a ratio of metal to ruthenium in the ruthenium alloy constituting the lower second electrode 310. By thus setting the ratio high, diffusion of the metal constituting the lower second electrode 310 into the nitride constituting the upper second electrode 311, causing change in composition of the ruthenium alloy constituting the lower second electrode 310, can be prevented. Specifically, it is more preferable that a content ratio of titanium be greater than or equal to 60 atm % and less than or equal to 80 atm %.

It is desirable to use a sputtering method for forming the upper second electrode 311. When film-forming a metal nitride by use of a sputtering method, it is preferable to use a reactive sputtering method of vaporizing a metal target by use of plasma of a mixed gas of nitrogen and argon. A metal vaporized from the metal target reacts with nitrogen to turn to a metal nitride, and then film-formed on a substrate.

As a more preferable forming method of the upper second electrode 311, it is preferable to use co-sputtering using two electrodes being a ruthenium target electrode and a target electrode composed of a first metal. When an alloy target composed of ruthenium and the first metal is used, composition in continuous use causes deviation due to difference in sputtering yield of each material, and therefore composition of the film to be formed cannot be closely controlled. By contrast, the co-sputtering method is able to precisely control composition of the film to be formed, by individually setting power applied to each target electrode. It is highly effective to use titanium or tantalum, in particular, as the first metal.

The two-terminal switch 313 can be arranged down in a depth direction by forming the recess part 308 on the first wiring A 305a. Accordingly, a time in which the upper second electrode 311 is exposed to etching plasma using a fluorine gas, a rare gas, an inert gas, or a mixed gas thereof, used in forming of the via A 319a, can be reduced. Consequently, a film thickness of the upper second electrode 311 etched by the etching gas is reduced, and accumulation of plasma damage in the ion conduction layer 309 can be prevented. Accumulation of plasma damage in the ion conduction layer 309 causes the metal constituting the first wiring A 305a to become more likely to diffuse into the ion conduction layer 309, causes the ion conduction layer 309 to increase defects due to damage by charge-up, and consequently leads to increase in leak current of the two-terminal switch 313 and progression of characteristic variation and reliability degradation.

The hard mask film 312 is a film being a hard mask film and passivation film in etching the upper second electrode 311, the upper first electrode 310, and the first ion conduction layer 309a and the second ion conduction layer 309b. For example, a silicon nitride film, a silicon oxide film, or the like, or a laminated film thereof may be used as the hard mask film 312. It is preferable that the hard mask film 312 contain the same material as the protective insulating film 314 and the barrier insulating film 307. Specifically, by surrounding a whole periphery of the "two-terminal switch" 313 with a same material, a material interface is integrated so that ingress of moisture and the like from outside can be prevented, and separation of a constituent element of the "two-terminal switch" 313 itself can be prevented.

The protective insulating film 314 is an insulating film having a function of further preventing separation of oxygen from the second ion conduction layer 309b without damaging the "two-terminal switch" 313. For example, a silicon nitride film, a silicon carbonitride film, and the like may be used as the protective insulating film 314. It is preferable that the protective insulating film 314 be of the same material as the hard mask film 312 and the barrier insulating film 307. When the same material is used, the protective insulating film 314 is integrated with the barrier insulating film 307 and the hard mask film 312 to enhance interface adhesion, enabling enhanced protection of the "two-terminal switch" 313.

The interlayer insulating film 315 is an insulating film formed on the protective insulating film 314. For example, a silicon oxide film, an SiOC film, or the like may be used as the interlayer insulating film 315. The interlayer insulating film 315 may be a laminate of a plurality of insulating films. The interlayer insulating film 315 may be of the same material as the interlayer insulating film 317. In the interlayer insulating film 315, prepared holes for embedding the via A 319a and the via B 319b are formed, and the via A 319a and the via B 319b are embedded in the prepared holes through the second barrier metal A 320a and the second barrier metal B 320b, respectively.

The Low-k insulating film 316 is an insulating film having a low relative dielectric constant, arranged between the interlayer insulating films 315 and 317, and a low-dielectric-constant film having a lower relative dielectric constant than a silicon oxide film (such as an SiOCH film) is used. In the Low-k insulating film 316, wiring grooves for embedding the second wiring A 318a and the second wiring B 318b are formed, and the second wiring A 318a and the second wiring B 318b are embedded in the wiring grooves through the second barrier metal A 320a and the second barrier metal B 320b, respectively.

The interlayer insulating film 317 is an insulating film formed on the Low-k insulating film 316. For example, a silicon oxide film, an SiOC film, a low-dielectric-constant film having a lower relative dielectric constant than a silicon oxide film (such as an SiOCH film), or the like may be used as the interlayer insulating film 317. The interlayer insulating film 317 may be a laminate of a plurality of insulating films. The interlayer insulating film 317 may be of the same material as the interlayer insulating film 315. In the interlayer insulating film 317, wiring grooves for embedding the second wiring A 318a and the second wiring B 318b are formed, and the second wiring A 318a and the second wiring B 318b are embedded in the wiring grooves through the second barrier metal A 320a and the second barrier metal B 320b, respectively.

The second wiring A 318a and the second wiring B 318b are wirings embedded in the wiring grooves formed in the interlayer insulating film 317 and the Low-k insulating film 316, through the second barrier metal A 320a and the second barrier metal B 320b, respectively. The second wiring A 318a and the second wiring B 318b are respectively integrated with the via A 319a and the via B 319b. The via A 319a and the via B 319b are embedded in prepared holes formed in the interlayer insulating film 315, the protective insulating film 314, and, in the case of the via A 319a, the hard mask film 312, through the second barrier metal A 320a and the second barrier metal B 320b, respectively. The via A 319a is electrically connected to the upper second electrode 311 through the second barrier metal A 320a. For example, copper may be used for the second wiring A 318a and the second wiring B 318b, and the via A 319a and the via B 319b.

The second barrier metal A 320a and the second barrier metal B 320b are conductive films having a barrier property, covering the side surfaces and the bottom surfaces of the second wiring A 318a and the second wiring B 318b, and the via A 319a and the via B 319b. The covering prevents the metal forming the second wiring A 318a and the second wiring B 318b (including the via A 319a and the via B 319b) from diffusing into the interlayer insulating films 315 and 317, and a lower layer. When, for example, the second wiring A 318a and the second wiring B 318b, and the via A 319a and the via B 319b are composed of a metal element with copper being a main component, a refractory metal or a nitride thereof, such as tantalum, tantalum nitride, titanium nitride, and tungsten carbonitride, or a laminated film thereof may be used as the second barrier metal A 320a and the second barrier metal B 320b. It is preferable that the second barrier metal A 320a and the second barrier metal B 320b be of the same material as the upper second electrode 311. For example, when the second barrier metal A 320a and the second barrier metal B 320b have a laminated structure of tantalum nitride (lower layer)/tantalum (upper layer), it is preferable to use tantalum nitride being the lower layer material for the upper second electrode 311.

The barrier insulating film 321 is an insulating film formed on the interlayer insulating film 317 including the second wiring A 318a and the second wiring B 318b, and has a role in preventing oxidation of the metal forming the second wiring A 318a and the second wiring B 318b (such as copper). Further, the barrier insulating film 321 is an insulating film having a role in preventing the metal forming the second wiring A 318a and the second wiring B 318b from diffusing into an upper layer. For example, a silicon carbonitride film, a silicon nitride film, a laminated structure thereof, or the like may be used as the barrier insulating film 321.

Second Exemplary Embodiment

Figure 8:
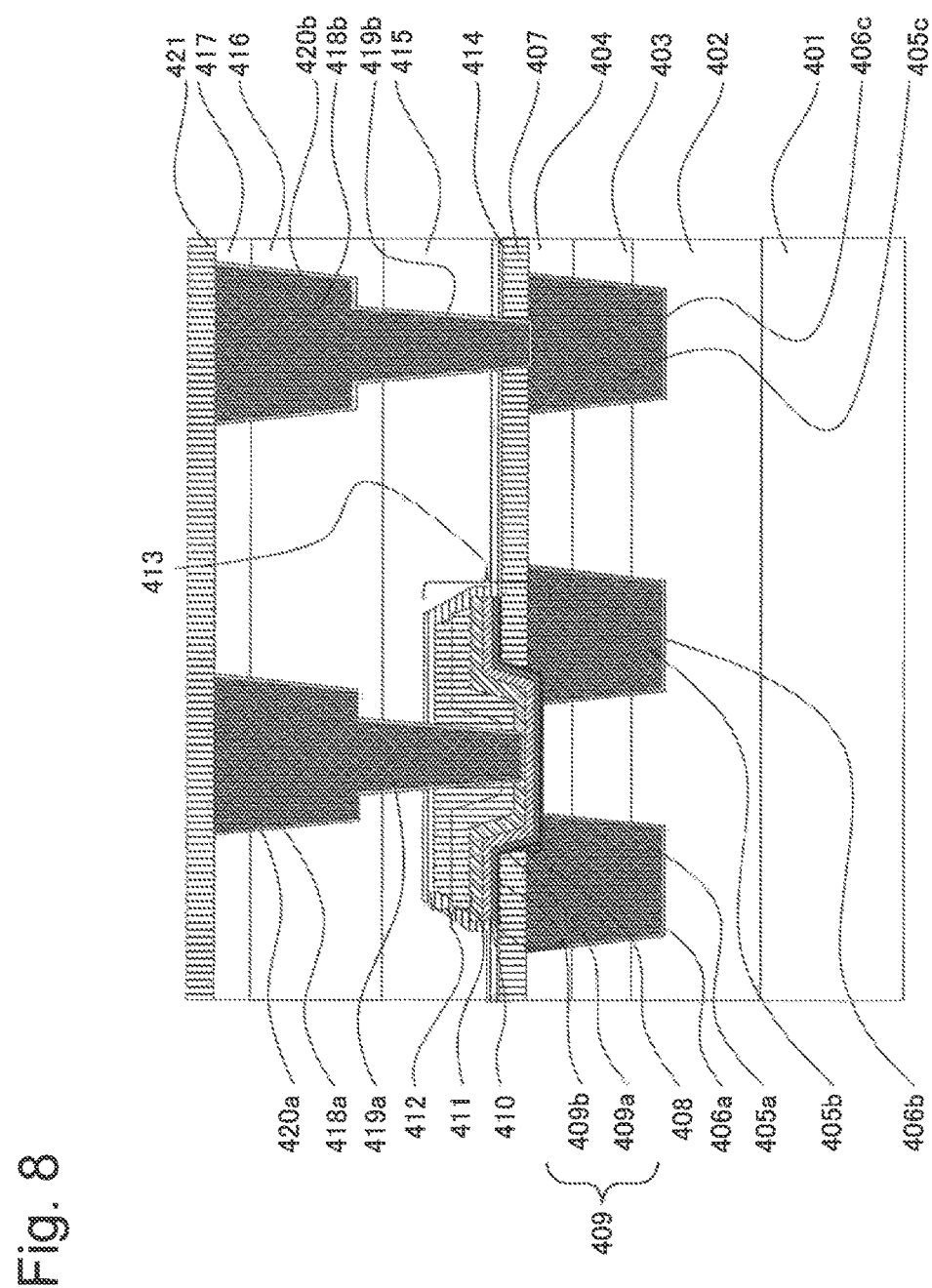
FIG. 8 is a schematic cross-sectional view illustrating a configuration example of a three-terminal switching element as a semiconductor device according to a second exemplary embodiment of the present invention.

Next, a variable resistance element, a semiconductor device, and a manufacturing method of the semiconductor device according to a second exemplary embodiment of the present invention will be described. A configuration of a semiconductor device including a three-terminal switch, as an example of a variable resistance element, inside a multi-layered wiring layer, as the semiconductor device according to the second exemplary embodiment of the present invention, will be described. FIG. 8 is a cross-sectional view schematically illustrating a configuration example of a switching element employing a configuration of "a three-terminal switch formed inside a multi-layered wiring layer" according to the second exemplary embodiment. The semiconductor device includes a three-terminal switch 413 inside a multi-layered wiring layer on a semiconductor substrate 401.

The multi-layered wiring layer includes an insulating laminated body on the semiconductor substrate 401. In the insulating laminated body, an interlayer insulating film 402, a Low-k insulating film 403, an interlayer insulating film 404, a barrier insulating film 407, a protective insulating film 414, an interlayer insulating film 415, a Low-k insulating film 416, an interlayer insulating film 417, and a barrier insulating film 421 are laminated in this order.

In the multi-layered wiring layer, a first wiring A 405a, a first wiring B 405b, and a first wiring C 405c are embedded in wiring grooves formed in the interlayer insulating film 404 and the Low-k insulating film 403 through a first barrier metal A 406a, a first barrier metal B 406b, and a first barrier metal C 406c, respectively. In the multi-layered wiring layer, a second wiring A 418a and a second wiring B 418b are embedded in wiring grooves formed in the interlayer insulating film 417 and the Low-k insulating film 416. Additionally, a via A 419a and a via B 419b are embedded in prepared holes formed in the interlayer insulating film 415, the protective insulating film 414, and a hard mask film 412. The second wiring A 418a and the via A 419a, and the second wiring B 418b and the via B 419b are respectively integrated. Additionally, side surfaces and bottom surfaces of the second wiring A 418a and the via A 419a, and the second wiring B 418b and the via B 419b, are respectively covered by a second barrier metal A 420a and a second barrier metal B 420b.

In the multi-layered wiring layer, the three-terminal switch 413 is formed at an opening formed on the barrier insulating film 407. In the three-terminal switch 413, an ion conduction layer 409, a lower second electrode 410, and an upper second electrode 411 are laminated in this order on the first wiring A 405a and the first wiring B 405b as a first electrode, the interlayer insulating film 404 sandwiched between the first wiring A 405a and the first wiring B 405b, a wall surface of the opening of the barrier insulating film 407, and the barrier insulating film 407. The hard mask film 412 is formed on the upper second electrode 411, and an upper surface and a side surface of a laminated body including the ion conduction layer 409, the lower second electrode 410, the upper second electrode 411, and the hard mask film 412 are covered by the protective insulating film 414. By making part of the first wiring A 405a and the first wiring B 405b as a lower electrode of the "three-terminal switch" 413, electrode resistance can be reduced while simplifying a number of steps. By merely creating at least a 2PR mask set as an additional step to a common copper damascene wiring process, the "three-terminal switch" 413 can be integrated on the semiconductor device, and reduction in resistance and a cost of the element can be concurrently achieved. The ion conduction layer 409 includes a first ion conduction layer 409a and a second ion conduction layer 409b.

In the "three-terminal switch" 413 in the semiconductor device in FIG. 8, the first ion conduction layer 409a is in direct contact with the first wiring A 405a and the first wiring B 405b in the opening region formed on the barrier insulating film 407. Then, a metal constituting the first ion conduction layer 409a diffuses into the first wiring A 405a and the first wiring B 405b to form an alloy layer at an interface. In the "three-terminal switch" 413, the via A 419a and the upper second electrode 411 are electrically connected through the second barrier metal A 420a on the upper second electrode 411. The "three-terminal switch" 413 is controlled in ON or OFF state by applying voltage or passing current. The switch is controlled in ON or OFF state by, for example, utilizing electric field diffusion of a metal ion supplied from a metal forming the first wiring A 405a and the first wiring B 405b, into the first ion conduction layer 409a and the second ion conduction layer 409b.

Furthermore, in the semiconductor device according to the present exemplary embodiment, the first wiring A 405a and the first wiring B 405b include a recess part 408 formed by digging down in a depth direction in the opening region formed on the barrier insulating film 407, respectively. FIG. 8 illustrates a state in which the interlayer insulating film 404 sandwiched between the recess part 408 of the first wiring A 405a and the recess part 408 of the first wiring B 405b is also dug down. The first ion conduction layer 409a is in contact with the first wiring A 405a and the first wiring B 405b at the recess parts 408. Further, in FIG. 8, the via B 419b is in contact with the first wiring C 405c through the second barrier metal B 420b, without intervening the three-terminal switch 413 between the first wiring C 405c and the via B 419b. The first wiring A 405a and the first wiring B 405b, and the first wiring C 405c are wirings formed in a same layer, on the basis of, for example, the semiconductor substrate 401.

The three-terminal switch 413 in the semiconductor device according to the present exemplary embodiment is arranged down in a depth direction correspondingly to the recess part 408. Thus, a difference between a height of the via A 419a in contact with the upper second electrode 411 through the second barrier metal A 420a, and a height of the via B 419b in contact with the first wiring C 405c through the second barrier metal B 420b, can be reduced.

Specifically, the height difference amounts to nearly a thickness of the lower second electrode 410. Accordingly, when the via A 419a and the via B 419b are exposed by use of a same photomask and formed by plasma etching simultaneously, plasma damage in the three-terminal switch 413 is reduced to an amount corresponding to the height difference between the via A 419a and the via B 419b. Consequently, degradation in element performance of the three-terminal switch 413 can be suppressed.

The semiconductor substrate 401 is a substrate on which a semiconductor element is formed. A substrate such as a silicon substrate, a single-crystal substrate, a silicon-on-insulator (SOI) substrate, a thin-film transistor (TFT) substrate, and a substrate for manufacturing a liquid crystal display (LCD) may be used as the semiconductor substrate 401.

The interlayer insulating film 402 is an insulating film formed on the semiconductor substrate 401. For example, a silicon oxide film, an SiOC film, or the like may be used as the interlayer insulating film 402. The interlayer insulating film 402 may be a laminate of a plurality of insulating films.

The Low-k insulating film 403 is an insulating film having a low relative dielectric constant, arranged between the interlayer insulating films 402 and 404, and a low-dielectric-constant film (such as an SiOCH film) having a relative dielectric constant lower than a silicon oxide film, or the like is used. Wiring grooves for embedding the first wiring A 405a, the first wiring B 405b, and the first wiring C 405c are formed in the Low-k insulating film 403. The first wiring A 405a, the first wiring B 405b, and the first wiring C 405c are embedded in the wiring grooves through the first barrier metal A 406a, the first barrier metal B 406b, and the first barrier metal C 406c, respectively.

The interlayer insulating film 404 is an insulating film formed on the Low-k insulating film 403. For example, a silicon oxide film, an SiOC film, or the like may be used as the interlayer insulating film 404. The interlayer insulating film 404 may be a laminate of a plurality of insulating films.

Wiring grooves for embedding the first wiring A 405a, the first wiring B 405b, and the first wiring C 405c are formed in the interlayer insulating film 404. The first wiring A 405a, the first wiring B 405b, and the first wiring C 405c are embedded in the wiring grooves through the first barrier metal A 406a, the first barrier metal B 406b, and the first barrier metal C 406c, respectively. The interlayer insulating film 404 sandwiched between the first wiring A 405a and the first wiring B 405b is dug down, upon formation of the recess part 408, to nearly a height of the recess part 408.

The first wiring A 405a and the first wiring B 405b are wirings embedded in the wiring grooves formed in the interlayer insulating film 404 and the Low-k insulating film 403 through the first barrier metal A 406a and the first barrier metal B 406b. The first wiring A 405a and the first wiring B 405b also serve as the lower electrode of the two-terminal switch 413, and are in direct contact with the first ion conduction layer 409a. An upper surface of the first ion conduction layer 409a is in direct contact with the second ion conduction layer 409b, and an upper surface of the second ion conduction layer 409b is in direct contact with the lower second electrode 410. A metal capable of diffusion and ionic conduction in the ion conduction layer 409, such as copper, may be used as a metal constituting the first wiring A 405a and the first wiring B 405b. The metal constituting the first wiring A 405a and the first wiring B 405b (such as copper) may be alloyed with aluminum.

The first wiring A 405a and the first wiring B 405b include the recess part 408 formed by digging down in a depth direction at the opening surface of the barrier insulating film 407. The first wiring A 405a and the first wiring B 405b are in contact with the first ion conduction layer 409a at the recess part 408. An alloy layer with a metal constituting the first ion conduction layer 409a, to be described later, is formed at an interface between the recess part 408 and the first ion conduction layer 409a. The alloy layer is not formed throughout the first wiring A 405a and the first wiring B 405b, but is formed only at the opening surface of the barrier insulating film 407.

Formation of the recess part 408 is performed after forming the opening surface of the barrier insulating film 407 in contact with the first wiring A 405a and the first wiring B 405b, by supplying onto the substrate including the first wiring A 405a, the first wiring B 405b, and the interlayer insulating film 404, in a dry etching apparatus, plasma using a halogen gas, an inert gas, or a fluorocarbon-based gas, or a mixed gas thereof, at reduced pressure. At this time, while the barrier insulating film 407 is also etched, the first wiring C 405c not forming the three-terminal switch 413 is not exposed to the plasma, and is not dug down.

The first wiring C 405c is a wiring embedded in the wiring groove formed in the interlayer insulating film 404 and the Low-k insulating film 403 through the first barrier metal C 406c. The first wiring C 405c is in direct contact with the via B 419b at the opening of the barrier insulating film 407 through the second barrier metal B 420b.

The first barrier metal A 406a, the first barrier metal B 406b, and the first barrier metal C 406c are conductive films having a barrier property, covering side surfaces and bottom surfaces of the wirings. The covering prevents the metal forming the first wiring A 405a, the first wiring B 405b, and the first wiring C 405c from diffusing into the interlayer insulating film 404 and a lower layer. When, for example, the first wiring A 405a, the first wiring B 405b, and the first wiring C 405c are composed of a metal element with copper being a main component, a refractory metal or a nitride thereof such as tantalum, tantalum nitride, titanium nitride, and tungsten carbonitride, or a laminated film thereof may be used as the first barrier metal A 406*a*, the first barrier metal B 406*b*, and the first barrier metal C 406*c*.

The barrier insulating film 407 is formed on the interlayer insulating film 404 including the first wiring A 405*a*, the first wiring B 405*b*, and the first wiring C 405*c*, and has a role in preventing oxidation of the metal forming the first wiring A 405*a*, the first wiring B 405*b*, and the first wiring C 405*c* (such as copper). Additionally, the barrier insulating film 407 has a role in preventing the metal forming the first wiring A 405*a*, the first wiring B 405*b*, and the first wiring C 405*c* from diffusing into the interlayer insulating film 415. Additionally, the barrier insulating film 407 has a role as an etching stopper layer upon processing of the upper second electrode 411, the lower second electrode 410, and the ion conduction layer 409. For example, an SiC film, a silicon carbonitride film, a silicon nitride film, or a laminated structure thereof may be used as the barrier insulating film 407. It is preferable that the barrier insulating film 407 be of the same material as the protective insulating film 414 and the hard mask film 412.

The first ion conduction layer 409*a* and the second ion conduction layer 409*b* are films with variable resistance. A material varying resistance by an action (such as diffusion and ion conduction) of a metal ion generated from the metal forming the first wiring A 405*a* and the first wiring B 405*b* (lower electrode) may be used. When resistance change of the "three-terminal switch" 413 accompanying switching to an "ON" state is performed by precipitation of metal due to reduction of a metal ion, an ion-conductible film is used.

The second ion conduction layer 409*b* is formed by use of a plasma-enhanced CVD method. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to in a range of 10 to 200 sccm, and a supply amount of helium is set to 500 sccm through a raw material vaporizer. The thus formed second ion conduction layer 409*b* is a porous polymer having silicon, oxygen, and carbon as main components, and, for example, has a relative dielectric constant greater than or equal to 2.1 and less than or equal to 3.0.

The first ion conduction layer 409*a* has a role in preventing the metal forming the first wiring A 405*a* and the first wiring B 405*b* from diffusing into the second ion conduction layer 409*b* due to heating and plasma during deposition of the second ion conduction layer 409*b*. Further, the first ion conduction layer 409*a* has a role in preventing the first wiring A 405*a* from being oxidized and becoming more likely to diffuse into the second ion conduction layer 409*b*. A metal forming the first ion conduction layer 409*a*, such as zirconium, hafnium, aluminum, and titanium, is exposed to an oxygen atmosphere in a deposition chamber for the second ion conduction layer 409*b* at reduced pressure, after film formation of the metal constituting the first ion conduction layer 409*a*. The metal exposed to the oxygen atmosphere turns to zirconium oxide, hafnium oxide, aluminum oxide, or titanium oxide, and becomes part of the ion conduction layer 409. An optimum film thickness of the metal film forming the first ion conduction layer 409*a* is in a range of 0.5 to 1 nm. The metal film used for forming the first ion conduction layer 409*a* may form a laminate or may be a single layer. It is preferable that formation of the first ion conduction layer 409*a* be performed by sputtering. A metal atom or ion gaining energy by sputtering rushes and diffuses into the first wiring A 405*a* and the first wiring B 405*b* to form an alloy layer.

The ion conduction layer 409 is formed on the first wiring A 405*a* and the first wiring B 405*b*, the interlayer insulating film 404 sandwiched between the first wiring A 405*a* and the first wiring B 405*b*, a tapered surface of the recess part 408 formed at the opening of the barrier insulating film 407, a tapered surface of the barrier insulating film 407, and the barrier insulating film 407. In the ion conduction layer 409, an outer periphery of a connecting part of the first wiring A 405*a* and the first wiring B 405*b*, and the ion conduction layer 409 is arranged at least along the tapered surface of the recess part 408, a tapered surface of the opening of the barrier insulating film 407, and the interlayer insulating film 404 sandwiched between the first wiring A 405*a* and the first wiring B 405*b*.

The lower second electrode 410 is an electrode on the lower layer side of an upper electrode of the "three-terminal switch" 413, and is in direct contact with the second ion conduction layer 409*b*. An alloy containing ruthenium, and titanium, tantalum, zirconium, hafnium, aluminum, or the like, having good adhesion with the metal forming the first wiring A 405*a* and the first wiring B 405*b*, is used for the lower second electrode 410. Ruthenium is a metal more resistant to ionization than the metal forming the first wiring A 405*a* and the first wiring B 405*b*, and is resistant to diffusion and ionic conduction in the second ion conduction layer 409*b*.

In a ruthenium alloy used in formation of the lower second electrode 410, it is desirable to select, as a first metal to be added to ruthenium, an added metal having a standard Gibbs energy of formation of a process of generating a metal ion from the metal (oxidation process) greater than ruthenium in a negative direction. Titanium, tantalum, zirconium, hafnium, and aluminum, each having a standard Gibbs energy of formation of a process of generating a metal ion from the metal (oxidation process) greater than ruthenium in a negative direction, exhibit stronger likelihood of spontaneously generating a chemical reaction compared with ruthenium, and therefore have high reactivity. Consequently, in the ruthenium alloy forming the lower second electrode 410, adhesion with a metal bridge formed by the metal forming the first wiring A 405*a* and the first wiring B 405*b* is enhanced by alloying with ruthenium. By contrast, when the lower second electrode 410 is composed of only an added metal such as titanium, tantalum, zirconium, hafnium, and aluminum, without ruthenium, reactivity becomes so high that transition to an "OFF" state does not occur. The transition from an "ON" state to an "OFF" state progresses by an oxidation reaction (dissolution reaction) of the metal bridge. When a metal having a standard Gibbs energy of formation of a process of generating a metal ion from the metal (oxidation process) greater than the metal forming the first wiring A 405*a* and the first wiring B 405*b* in a negative direction is used as a metal constituting the lower second electrode 410, transition to an "OFF" state is not likely to occur. The reason is that an oxidation reaction of the lower second electrode 410 progresses ahead of an oxidation reaction of the metal bridge formed by the metal forming the first wiring A 405*a* and the first wiring B 405*b*. Accordingly, a metal material used for formation of the lower second electrode 410 needs to be alloyed with ruthenium having a standard Gibbs energy of formation of a process of generating a metal ion from the metal (oxidation process) less in a negative direction than copper. Furthermore, when copper being a component of the metal bridge is mixed into the lower second electrode 410, an effect of adding a metal having a large standard Gibbs energy in a negative direction is diminished, and therefore it is preferable that a metal added to ruthenium be a material having a barrier property with respect to copper and a copper ion. For example, tantalum, titanium, or the like may be used. Meanwhile, it is known that a greater amount of an added metal stabilizes an "ON" state accordingly, and it is also known that an addition of 5 atm % enhances the stability. When an added metal is titanium, in particular, excellent transition to an "OFF" state and excellent stability of an "ON" state are exhibited, and it is particularly preferable that the lower second electrode 410 be composed of an alloy of ruthenium and titanium, and a content ratio of titanium be in a range of 20 atm % to 30 atm %. It is desirable that a content ratio of ruthenium in the ruthenium alloy be greater than or equal to 60 atm % and less than or equal to 90 atm %.

It is desirable to use a sputtering method for forming the lower second electrode 410. When forming an alloy by use of a sputtering method, a method of using an alloy target of ruthenium and a first metal, a co-sputtering method of sputtering a ruthenium target and a first metal target simultaneously in a same chamber, and an intermixing method of forming a thin film of a first metal in advance, performing film-forming of ruthenium thereon by use of a sputtering method, and performing alloying by energy of colliding atoms, are available. By use of the co-sputtering method and the intermixing method, composition of an alloy can be changed. When the intermixing method is adopted, it is preferable that heat treatment at 400° C. or lower be applied for "flattening" of a mixed state, after film-forming of ruthenium is completed.

The upper second electrode 411 is an electrode on the upper layer side of the upper electrode of the "three-terminal switch" 413, and is formed on the lower second electrode 410. The upper second electrode 411 has a role in protecting the lower second electrode 410. Specifically, by the upper second electrode 411 protecting the lower second electrode 410, damage to the lower second electrode 410 in a process can be suppressed, and a switching characteristic of the "three-terminal switch" 413 can be maintained. For example, tantalum, titanium, tungsten, a nitride thereof, or the like may be used for the upper second electrode 411. Further, when electrically connecting the via A 419a on the lower second electrode 410, the upper second electrode 411 also functions as an etching stopper layer. Accordingly, it is preferable that an etching rate of the electrode be low with respect to plasma of a fluorocarbon-based gas used for etching the interlayer insulating film 415.

The upper second electrode 411 is composed of a metal nitride. A nitride of titanium, tantalum, zirconium, hafnium, or aluminum, functioning as an etching stopper layer and having conductivity, is particularly preferable. When a metal not being a nitride is used for the upper second electrode 411, defects may be generated in the lower second electrode 410 by part of the metal diffusing into the lower second electrode 410 due to heating and plasma damage during the process. Starting from the defects, dielectric breakdown voltage of the ion conduction layer 409 may be decreased. By using a metal nitride being a stable compound having electrical conductivity for the upper second electrode 411, diffusion of the metal into the lower second electrode 410 can be prevented. It is particularly preferable that a metal in a metal nitride constituting the upper second electrode 411 and an added metal forming an alloy with ruthenium constituting the lower second electrode 410 be a same metal. Consequently, diffusion failure of the metal forming the alloy with ruthenium can be more efficiently prevented. For example, when the lower second electrode 410 is an alloy electrode of ruthenium and titanium, it is preferable that the upper second electrode 411 be a titanium nitride electrode. Alternatively, when the lower second electrode 410 is an alloy of ruthenium and tantalum, the upper second electrode 411 should be a tantalum nitride electrode. By matching metal components constituting the lower second electrode 410 and the upper second electrode 411, even in case that the metal in the upper second electrode 411 diffuses into the lower second electrode 410, defects are less likely to form. At this time, a ratio of metal to nitrogen in the nitride constituting the upper second electrode 411 is set to be greater than a ratio of metal to ruthenium in the ruthenium alloy constituting the lower second electrode 410. By thus setting the ratio high, diffusion of the metal constituting the lower second electrode 410 into the nitride constituting the upper second electrode 411, causing change in composition of the ruthenium alloy constituting the lower second electrode 410, can be prevented. Specifically, it is more preferable that a content ratio of titanium be greater than or equal to 60 atm % and less than or equal to 80 atm %.

It is desirable to use a sputtering method for forming the upper second electrode 411. When film-forming a metal nitride by use of a sputtering method, it is preferable to use a reactive sputtering method of vaporizing a metal target by use of plasma of a mixed gas of nitrogen and argon. A metal vaporized from the metal target reacts with nitrogen to turn to a metal nitride, and then film-formed on a substrate.

As a more preferable forming method of the upper second electrode 411, it is preferable to use co-sputtering using two electrodes being a ruthenium target electrode and a target electrode composed of a first metal. When an alloy target composed of ruthenium and the first metal is used, composition in continuous use causes deviation due to difference in sputtering yield of each material, and therefore composition of the film to be formed cannot be closely controlled. By contrast, the co-sputtering method is able to precisely control composition of the film to be formed, by individually setting power applied to each target electrode. It is highly effective to use titanium or tantalum, in particular, as the first metal.

In the semiconductor device according to the present exemplary embodiment, the three-terminal switch 413 can be arranged down in a depth direction by forming the recess part 408 on the first wiring A 405a and the first wiring B 405b, and forming a recess part on the interlayer insulating film 404 sandwiched between the first wiring A 405a and the first wiring B 405b. Accordingly, a time in which the upper second electrode 411 is exposed to etching plasma using a fluorine gas, a rare gas, an inert gas, or a mixed gas thereof, used in pattern forming of the via A 419a, can be reduced. Consequently, a film thickness of the upper second electrode 411 etched by the etching gas is reduced, and accumulation of plasma damage in the ion conduction layer 409 can be prevented. Accumulation of plasma damage in the ion conduction layer 409 causes the metal constituting the first wiring A 405a and the first wiring B 405b to become more likely to diffuse into the ion conduction layer 409, causes the ion conduction layer 409 to increase defects due to damage by charge-up, and consequently leads to increase in leak current of the three-terminal switch 413 and progression of characteristic variation and reliability degradation.

The hard mask film 412 is a film being a hard mask film and passivation film in etching the upper second electrode 411, the lower second electrode 410, and the first ion conduction layer 409a and the second ion conduction layer 409b. For example, a silicon nitride film, a silicon oxide film, or the like, or a laminated film thereof may be used as the hard mask film 412. It is preferable that the hard mask film 412 contain the same material as the protective insulating film 414 and the barrier insulating film 407. Specifically, by surrounding a whole periphery of the "three-terminal switch" 413 with a same material, a material interface is integrated so that ingress of moisture and the like from outside can be prevented, and separation from the "three-terminal switch" 413 itself can be prevented.

The protective insulating film 414 is an insulating film having a function of further preventing separation of oxygen from the second ion conduction layer 409b without damaging the "three-terminal switch" 413. For example, a silicon nitride film, a silicon carbonitride film, and the like may be used as the protective insulating film 414. It is preferable that the protective insulating film 414 be of the same material as the hard mask film 412 and the barrier insulating film 407. When the same material is used, the protective insulating film 414 is integrated with the barrier insulating film 407 and the hard mask film 412 to enhance interface adhesion, enabling enhanced protection of the "three-terminal switch" 413.

The interlayer insulating film 415 is an insulating film formed on the protective insulating film 414. For example, a silicon oxide film, an SiOC film, or the like may be used as the interlayer insulating film 415. The interlayer insulating film 415 may be a laminate of a plurality of insulating films. The interlayer insulating film 415 may be of the same material as the interlayer insulating film 417. In the interlayer insulating film 415, prepared holes for embedding the via A 419a and the via B 419b are formed, and the via A 419a and the via B 419b are embedded in the prepared holes through the second barrier metal A 420a and the second barrier metal B 420b, respectively.

The Low-k insulating film 416 is an insulating film having a low relative dielectric constant, arranged between the interlayer insulating films 415 and 417, and a low-dielectric-constant film having a lower relative dielectric constant than a silicon oxide film (such as an SiOCH film) is used. In the Low-k insulating film 416, wiring grooves for embedding the second wiring A 418a and the second wiring B 418b are formed, and the second wiring A 418a and the second wiring B 418b are embedded in the wiring grooves through the second barrier metal A 420a and the second barrier metal B 420b, respectively.

The interlayer insulating film 417 is an insulating film formed on the Low-k insulating film 416. For example, a silicon oxide film, an SiOC film, a low-dielectric-constant film having a lower relative dielectric constant than a silicon oxide film (such as an SiOCH film), or the like may be used as the interlayer insulating film 417. The interlayer insulating film 417 may be a laminate of a plurality of insulating films. The interlayer insulating film 417 may be of the same material as the interlayer insulating film 415. In the interlayer insulating film 417, wiring grooves for embedding the second wiring A 418a and the second wiring B 418b are formed, and the second wiring A 418a and the second wiring B 418b are embedded in the wiring grooves through the second barrier metal A 420a and the second barrier metal B 420b, respectively.

The second wiring A 418a and the second wiring B 418b are wirings embedded in the wiring grooves formed in the interlayer insulating film 417 and the Low-k insulating film 416, through the second barrier metal A 420a and the second barrier metal B 420b, respectively. The second wiring A 418a and the second wiring B 418b are respectively integrated with the via A 419a and the via B 419b. The via A 419a and the via B 419b are embedded in prepared holes formed in the interlayer insulating film 415, the protective insulating film 414, and, in the case of the via A 419a, the hard mask film 412, through the second barrier metal A 420a and the second barrier metal B 420b, respectively. The via A 419a is electrically connected to the upper second electrode 411 through the second barrier metal A 420a. For example, copper may be used for the second wiring A 418a and the second wiring B 418b, and the via A 419a and the via B 419b.

The second barrier metal A 420a and the second barrier metal B 420b are conductive films having a barrier property, covering the side surfaces and the bottom surfaces of the second wiring A 418a and the second wiring B 418b, and the via A 419a and the via B 419b. The covering prevents the metal forming the second wiring A 418a and the second wiring B 418b (including the via A 419a and the via B 419b) from diffusing into the interlayer insulating films 415 and 417, and a lower layer. When, for example, the second wiring A 418a and the second wiring B 418b, and the via A 419a and the via B 419b are composed of a metal element with copper being a main component, a refractory metal or a nitride thereof, such as tantalum, tantalum nitride, titanium nitride, and tungsten carbonitride, or a laminated film thereof may be used as the second barrier metal A 420a and the second barrier metal B 420b. It is preferable that the second barrier metal A 420a and the second barrier metal B 420b be of the same material as the upper second electrode 411. For example, when the second barrier metal A 420a and the second barrier metal B 420b have a laminated structure of tantalum nitride (lower layer)/tantalum (upper layer), it is preferable to use tantalum nitride being the lower layer material for the upper second electrode 411.

The barrier insulating film 421 is an insulating film formed on the interlayer insulating film 417 including the second wiring A 418a and the second wiring B 418b, and has a role in preventing oxidation of the metal forming the second wiring A 418a and the second wiring B 418b (such as copper). Further, the barrier insulating film 421 is an insulating film having a role in preventing the metal forming the second wiring A 418a and the second wiring B 418b from diffusing into an upper layer. For example, a silicon carbonitride film, a silicon nitride film, a laminated structure thereof, or the like may be used as the barrier insulating film 421.

(Mode 1)

Next, an advantage of the "three-terminal-switch" type switching element according to the present exemplary embodiment will be described in accordance with FIG. 9. Further, an element configuration will be described in accordance with the terminology indicated in FIG. 8.

Figure 9:
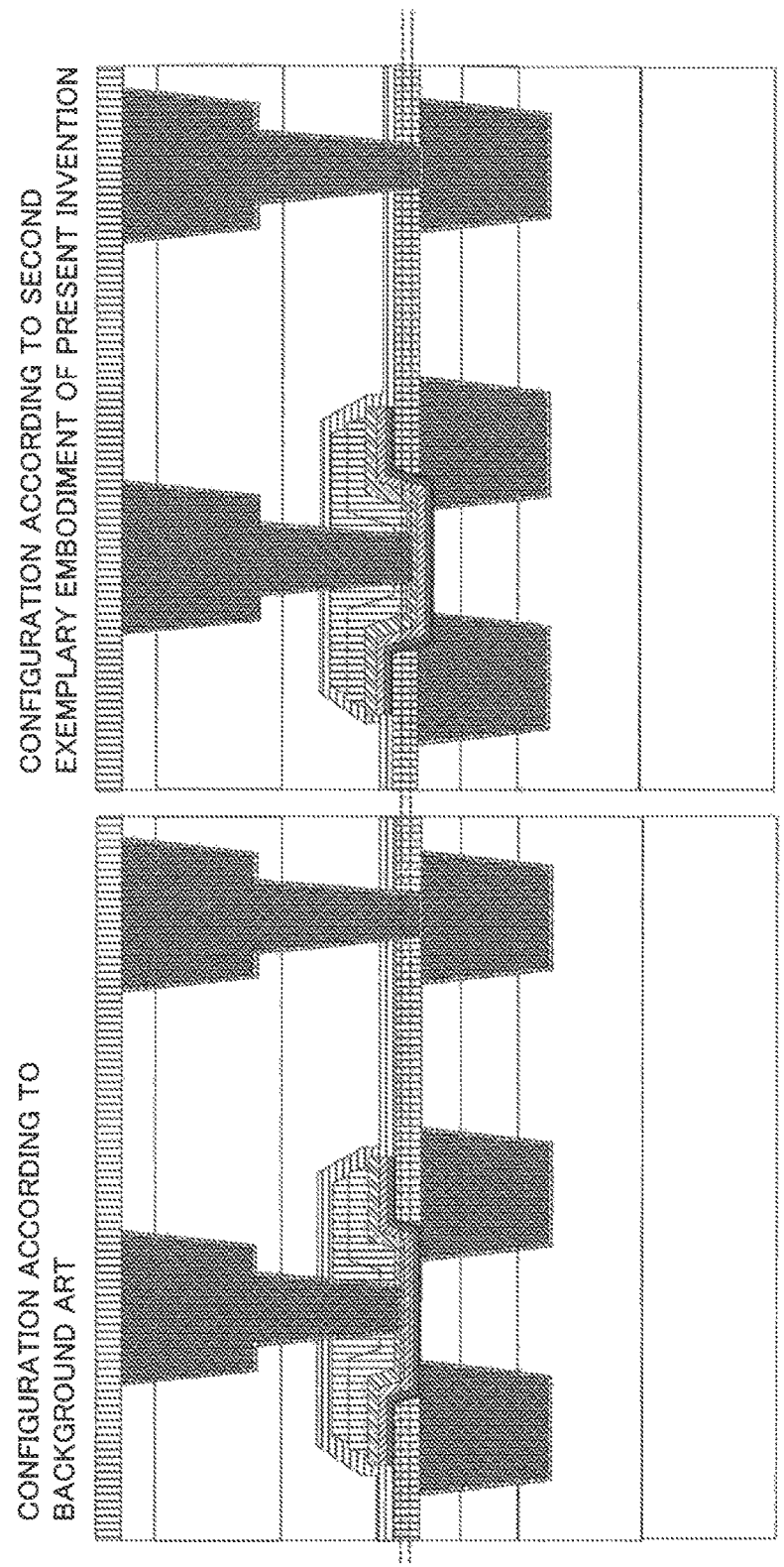
FIG. 9 is a schematic cross-sectional view comparing the configuration example of the three-terminal switching element in FIG. 8 with a configuration according to the background art.

FIG. 9 is a diagram illustrating a configuration according to the background art and a configuration according to the present exemplary embodiment placed side by side, in terms of a "three-terminal-switch" type switching element formed in a multi-layered wiring layer. In the configuration according to the aforementioned second exemplary embodiment, the recess part 408 formed by digging down in a depth direction is formed on the first wiring A 405a and the first wiring B 405b, and the interlayer insulating film 404 sandwiched between the first wiring A 405a and the first wiring B 405b, at the opening surface formed on the barrier insulating film 407. Accordingly, the three-terminal switch 413 is arranged down in a depth direction in the first wiring A 405a and the first wiring B 405b. By contrast, in the configuration according to the background art, the recess part 408 does not exist, and therefore the three-terminal switch 413 is formed immediately above the tapered surface of the barrier insulating film 407, and the first wiring A 405*a* and the first wiring B 405*b*. In the configuration according to the aforementioned second exemplary embodiment, by lowering the via A 419*a* so as to electrically connect to the upper second electrode 411 immediately above the recess part 408, a height difference from the via B 419*b* directly connecting to the first wiring C 405*c* becomes smaller compared with the configuration according to the background art. When the via A 419*a* and the via B 419*b* are exposed with one mask and formed by simultaneous etching, the upper second electrode 411 in the three-terminal switch 413 is exposed to an etching environment correspondingly to the height difference between the via A 419*a* and the via B 419*b*. Accordingly, in the configuration according to the second exemplary embodiment of the present invention in which the height difference between the via A 419*a* and the via B 419*b* can be reduced, plasma damage to the ion conduction layer 409 can be reduced.

(Mode 2)

Figure 10:
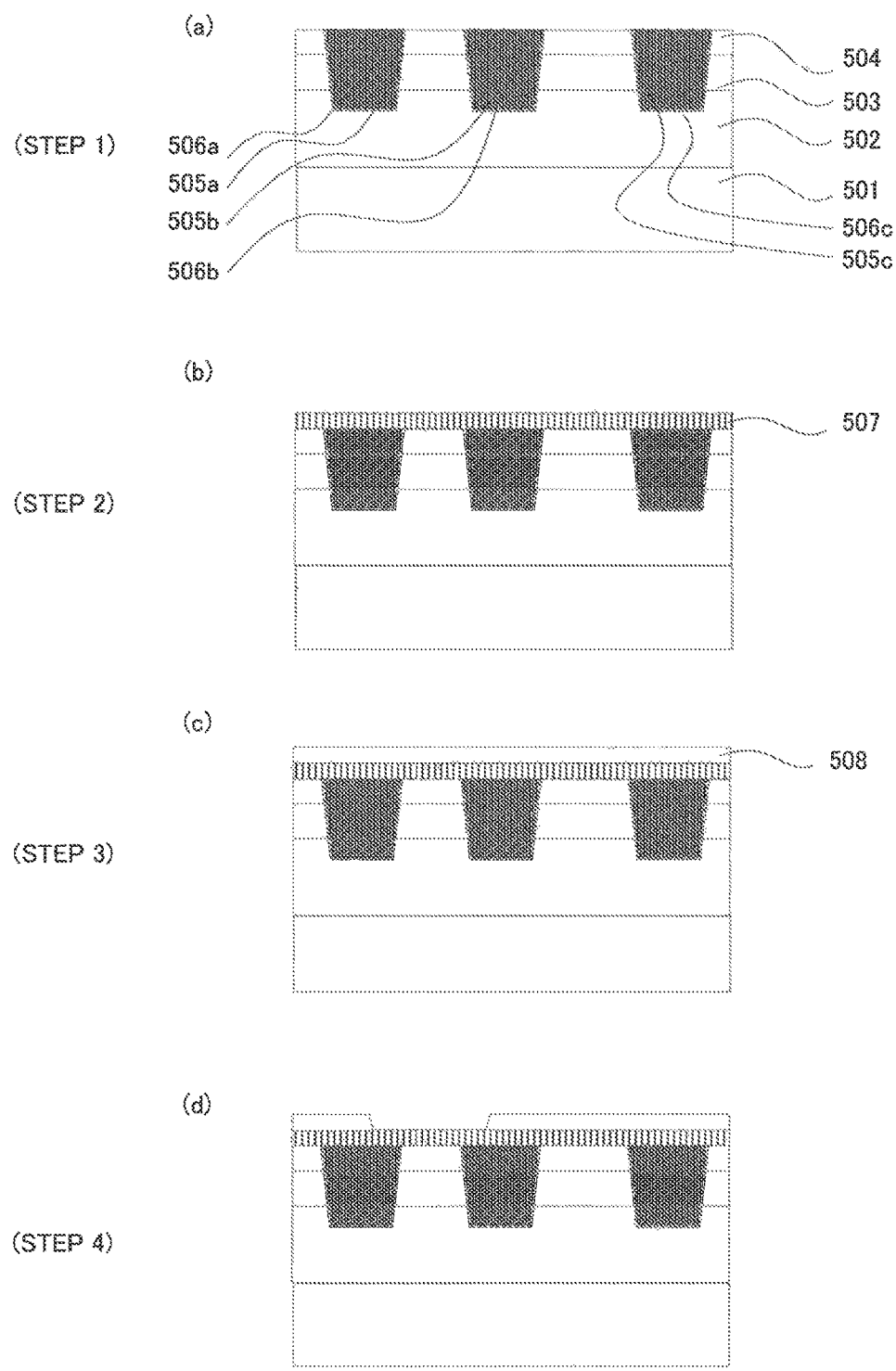
FIGS. 10(a) to 10(d) are schematic cross-sectional views illustrating a manufacturing process of a three-terminal switching element as an example of a manufacturing method of a semiconductor device according to the second exemplary embodiment of the present invention.

As Mode 2 according to the present exemplary embodiment, a manufacturing process of a semiconductor device forming a switching element employing a "three-terminal switch" configuration inside a multi-layered wiring layer will be described. Steps of forming a switching element employing a "three-terminal switch" configuration in a multi-layered wiring layer in particular will be described. FIGS. 10(*a*) to 10(*d*), FIGS. 11(*a*) to 11(*d*), and FIGS. 12(*a*) to 12(*d*) are schematic cross-sectional views illustrating a manufacturing process of a three-terminal switching element as an example of a manufacturing method of the semiconductor device according to the second exemplary embodiment of the present invention.

(Step 1)

As illustrated in FIG. 10(*a*), an interlayer insulating film 502 (such as a silicon oxide film with a film thickness of 500 nm) is deposited on a semiconductor substrate 501 (such as a substrate on which a semiconductor element is formed). Then, a low-dielectric-constant film having a low relative dielectric constant (such as an SiOCH film with a film thickness of 150 nm) is deposited as a Low-k insulating film 503 on the interlayer insulating film 502. Then, a silicon oxide film (such as a silicon oxide film with a film thickness of 100 nm) is deposited as an interlayer insulating film 504 on the Low-k insulating film 503. Then, wiring grooves are formed in the interlayer insulating film 502, the Low-k insulating film 503, and the interlayer insulating film 504 by use of a lithography method (including photoresist formation, dry etching, and photoresist removal).

Subsequently, a first wiring A 505*a*, a first wiring B 505*b* and a first wiring C 505*c* (such as copper) are embedded in the wiring grooves through a first barrier metal A 506*a*, a first barrier metal B 506*b* and a first barrier metal C 506*c* (such as tantalum nitride/tantalum with film thicknesses of 5 nm/5 nm). The interlayer insulating films 502 and 504 may be formed by a plasma-enhanced CVD method. The first wiring A 505*a*, the first wiring B 505*b*, and the first wiring C 505*c* may be formed by, for example, forming the first barrier metal A 506*a*, the first barrier metal B 506*b* and the first barrier metal C 506*c* (such as laminated films of tantalum nitride/tantalum) by a PVD method, burying copper in the wiring grooves by an electrolytic plating method after forming copper seeds by the PVD method, and removing excess copper not existing inside the wiring grooves by a CMP method after heat treatment at a temperature of 200° C. or higher. Common techniques in the relevant technological fields may be used in the series of copper wiring forming methods. An embedded wiring (damascene wiring) is formed by polishing excess copper embedded in a groove, and planarization is performed by polishing an interlayer insulating film.

(Step 2)

As illustrated in FIG. 10(*b*), a barrier insulating film 507 (such as a silicon nitride film or a silicon carbonitride film with a film thickness of 30 nm) is formed on the interlayer insulating film 504 including the first wiring A 505*a*, the first wiring B 505*b*, and the first wiring C 505*c*. The barrier insulating film 507 may be formed by a plasma-enhanced CVD method. It is preferable that a film thickness of the barrier insulating film 507 be around 10 nm to 50 nm.

(Step 3)

As illustrated in FIG. 10(*c*), a hard mask film 508 (such as a silicon oxide film with a film thickness of 40 nm) is formed on the barrier insulating film 507. At this time, it is preferable that the hard mask film 508 be of a different material from the barrier insulating film 507 from the viewpoint of keeping an etching selection ratio high in dry etching processing, and may be an insulating film or a conductive film. For example, silicon oxide, silicon nitride, titanium nitride, titanium, tantalum, tantalum nitride, and the like, and also a laminated body of a silicon nitride film/silicon oxide film may be used as the hard mask film 508.

(Step 4)

As illustrated in FIG. 10(*d*), an opening pattern is formed on the hard mask film 508 by forming a photoresist (unillustrated) pattern on the hard mask film 508, and performing dry etching using the photoresist as a mask. Then, the photoresist is stripped by oxygen plasma ashing or the like. At this time, the dry etching is not necessarily required to stop on an upper surface of the barrier insulating film 507, and may reach inside the barrier insulating film 507.

(Step 5)

Figure 11:
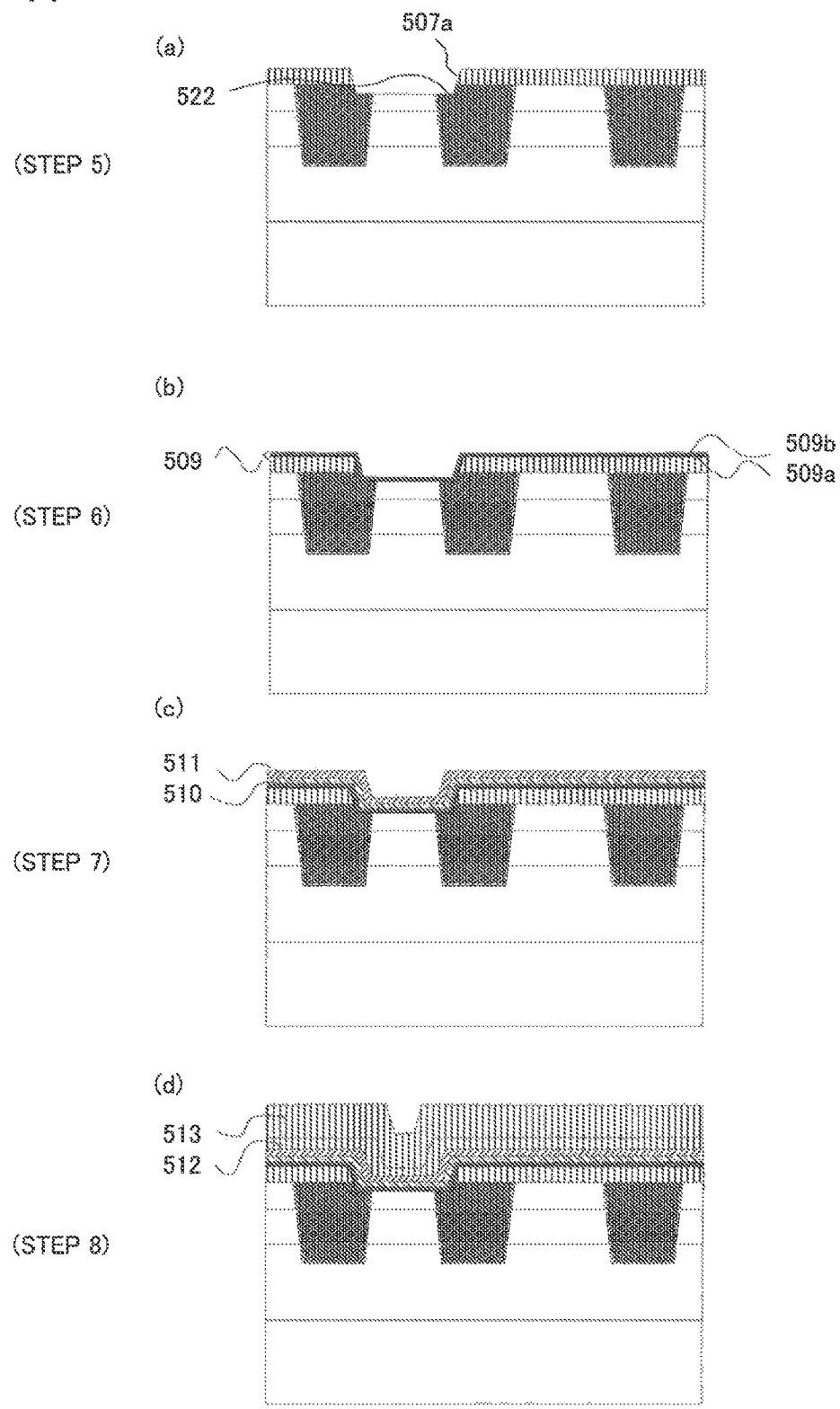
FIGS. 11(a) to 11(d) are schematic cross-sectional views illustrating a manufacturing process of the three-terminal switching element as an example of the manufacturing method of the semiconductor device according to the second exemplary embodiment of the present invention.

As illustrated in FIG. 11(*a*), the barrier insulating film 507 exposed from the opening of the hard mask film 508 is etched back (dry etched) by use of the hard mask film 508 as a mask. Accordingly, an opening 507*a* is formed on the barrier insulating film 507 to expose the first wiring A 505*a* and the first wiring B 505*b* from the opening 507*a* of the barrier insulating film 507. Then, by being exposed to plasma using a mixed gas of nitrogen and argon, copper oxide formed on the exposed surface of the first wiring A 505*a* and the first wiring B 505*b* is removed, and a by-product of etching generated upon the etch back, and the like, are removed. Furthermore, the exposed first wiring A 505*a* and the first wiring B 505*b* are dry etched to form a recess part 522 by use of an inert gas such as helium, argon, and nitrogen, a halogen gas, a fluorocarbon-based gas, or a mixed gas thereof. At this time, the interlayer insulating film 504 sandwiched between the first wiring A 505*a* and the first wiring B 505*b* is also dug down. The interlayer insulating film 504 between the first wiring A 505*a* and the first wiring B 505*b*, being exposed at the opening 507*a* of the barrier insulating film 507, is also dug down.

In etch back of the barrier insulating film 507, a wall surface of the opening 507*a* of the barrier insulating film 507 can be formed as a tapered surface by use of reactive dry etching. In reactive dry etching, a gas containing carbon fluoride can be used as an etching gas. While it is preferable that the hard mask film 508 be completely removed during the etch back, the film may remain intact when the film is of an insulating material. Further, a shape of the opening 507*a* of the barrier insulating film 507 is circular, and a diameter of the circle may range from 30 nm to 500 nm. It is desirable that RF etching be performed in an ultrahigh vacuum (less than or equal to $10^{-5}$ Pa) in the formation of the recess part 522. It is desirable to use a nonresponsive gas such as helium, argon, and nitrogen as the etching gas. Further, it is desirable that bias power (ionized gas pull-in power toward the wafer side) in etching be set to 150 W or lower so as not to increase surface roughness of the recess part 522. There may be a case that an unintended recess part is formed in etching with high bias power, and, in such a case, roughness of the recess part is likely to increase compared with the exemplary embodiment of the present invention. When the surface roughness increases, there is a risk of increase in variation of switching voltage, leak current, and reliability, of the three-terminal switch. The etching using a nonresponsive gas progresses isotropically, and therefore a side surface of the recess part 522 can be tapered. An etching rate and an etching time are adjusted so that the film thickness of the barrier insulating film 507 is not entirely etched by dry etching for forming the recess part 522. It is desirable that a height (depth) of the recess part 522 be around 5 nm to 20 nm.

(Step 6)

As illustrated in FIG. 11(*b*), an ion conduction layer 509 is formed on the barrier insulating film 507 including the first wiring A 505*a* and the first wiring B 505*b*. First, 1 nm of zirconium is deposited by a sputtering method. The zirconium is oxidized in formation of a second ion conduction layer 509*b* to form a first ion conduction layer 509*a*. At this time, a metal constituting the first ion conduction layer 509*a* diffuses into a part in contact with the first ion conduction layer 509*a* in the recess part 522, and an alloy layer is formed spontaneously. Additionally, by performing annealing in a vacuum environment at a temperature of 350° C., the thickness of the alloy layer can be increased. It is preferable to perform the annealing for around two minutes. Furthermore, an SiOCH-based polymer film containing silicon, oxygen, carbon, and hydrogen is formed as the second ion conduction layer 509*b* by the plasma-enhanced CVD. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to 10 to 200 sccm, and a supply amount of helium is set to 500 sccm through a raw material vaporizer. Additionally, 500 sccm of helium is directly supplied to the reaction chamber through another line. Moisture and the like are adhered to the opening 507*a* of the barrier insulating film 507 due to atmospheric exposure, and therefore it is preferable to perform degassing by applying heat treatment at reduced pressure at a temperature around 250° C. to 350° C. before deposition of the first ion conduction layer 509*a*.

(Step 7)

As illustrated in FIG. 11(*c*), an "alloy of ruthenium and titanium" is formed as a lower second electrode 510 with a film thickness of 10 nm on the ion conduction layer 509 by a co-sputtering method. At this time, a ruthenium target and a titanium target exist in a same chamber, and an alloy film is deposited by simultaneous sputtering. At this time, power applied to the ruthenium target is set to 150 W and power applied to the titanium target is set to 50 W, so as to make a content ratio of ruthenium in the "alloy of ruthenium and titanium" 75 atm %. Further, an upper second electrode 511 is formed on the lower second electrode 510. Titanium nitride is formed as the upper second electrode 511 with a film thickness of 25 nm by a reactive sputtering method. At this time, power applied to a titanium target is set to 600 W, and a nitrogen gas and an argon gas are introduced into a chamber for sputtering. At this time, a ratio between a flow rate of nitrogen and a flow rate of argon is set to 1:1 so as to make a ratio of titanium in the titanium nitride 70 atm %.

(Step 8)

As illustrated in FIG. 11(*d*), a hard mask film 512 (such as a silicon nitride film or a silicon carbonitride film with a film thickness of 30 nm) and a hard mask film 513 (such as a silicon oxide film with a film thickness of 80 nm) are laminated on the upper second electrode 511 in this order. The hard mask film 512 and the hard mask film 513 may be formed by use of a plasma-enhanced CVD method. The hard mask films 512 and 513 may be formed by use of a common plasma-enhanced CVD method in the relevant technological field. Further, it is preferable that the hard mask film 512 and the hard mask film 513 be different types of films, and, for example, the hard mask film 512 may be a silicon nitride film, and the hard mask film 513 may be a silicon oxide film. At this time, it is preferable that the hard mask film 512 is of the same material as a protective insulating film 514, to be described later, and the barrier insulating film 507. In other words, by surrounding an entire periphery of the three-terminal switch with a same material to integrate a material interface, ingress of moisture from outside can be prevented, and separation of a constituent element of the three-terminal switch itself can be prevented. Further, while the hard mask film 512 may be formed by a plasma-enhanced CVD method, it is preferable to use a high-density silicon nitride film formed with, for example, high-density plasma of a mixed gas of $SiH_4/N_2$.

(Step 9)

Figure 12:
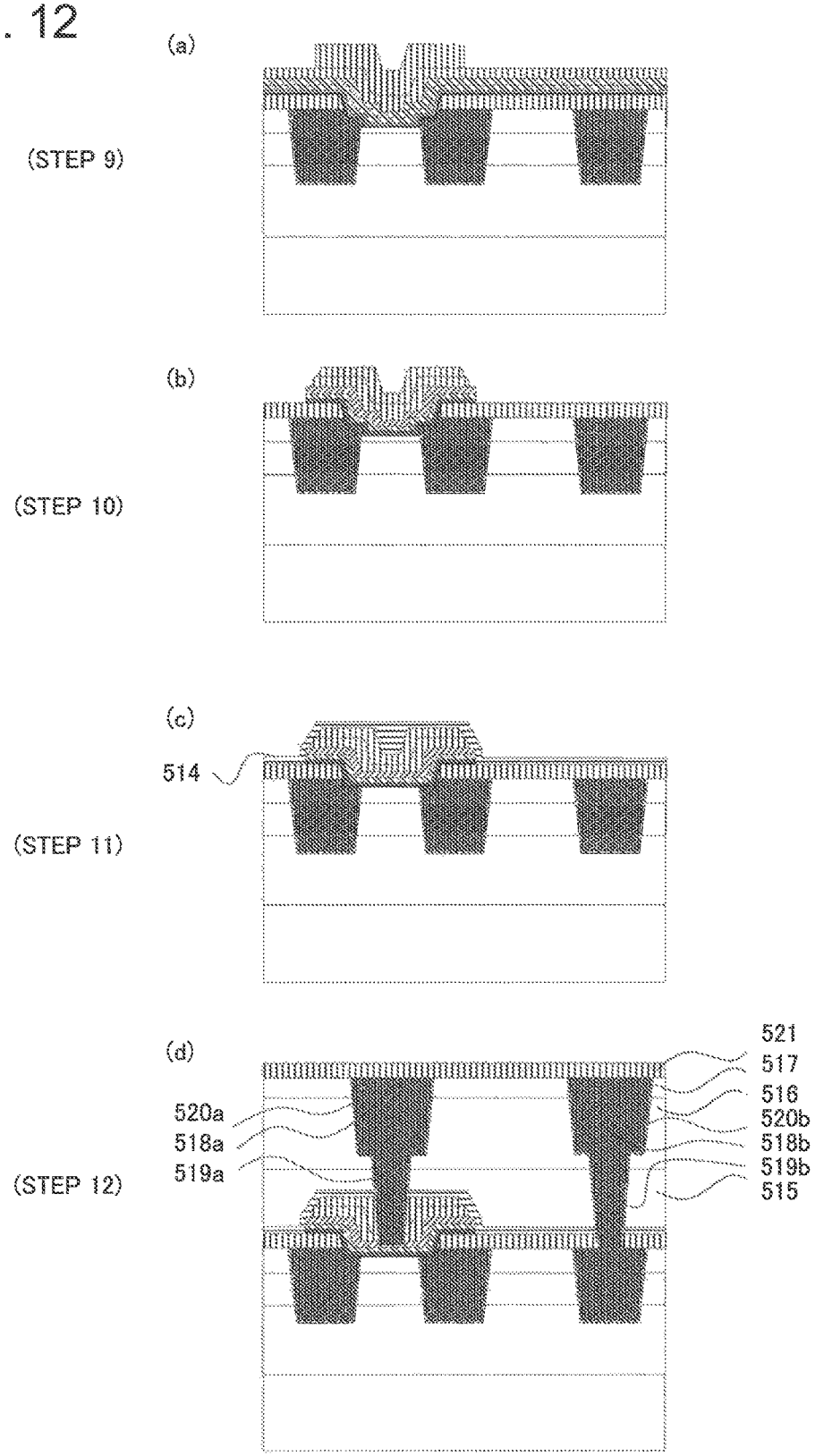
FIGS. 12(a) to 12(d) are schematic cross-sectional views illustrating a manufacturing process of the three-terminal switching element as an example of the manufacturing method of the semiconductor device according to the second exemplary embodiment of the present invention.

As illustrated in FIG. 12(*a*), a photoresist (unillustrated) for patterning a "three-terminal switch" part is formed on the hard mask film 513, and then, using the photoresist as a mask, the hard mask film 513 is dry etched until the hard mask film 512 appears. Then, the photoresist is removed by use of oxygen plasma ashing and organic stripping.

(Step 10)

As illustrated in FIG. 12(*b*), the hard mask film 512, the upper second electrode 511, the lower second electrode 510, and the ion conduction layer 509 are continuously dry etched using the hard mask film 513 as a mask. At this time, while it is preferable that the hard mask film 513 is completely removed during the etch back, it may remain intact. For example, when the upper second electrode 511 is of titanium nitride, $Cl_2$-based RIE processing can be performed, and, when the lower second electrode 510 is of an alloy of ruthenium and titanium, RIE processing with a mixed gas of $Cl_2/O_2$ can be performed. Further, in the etching of the ion conduction layer 509, it is required to stop dry etching on the barrier insulating film 507 being a lower surface. When the ion conduction layer 509 is an SiOCH-based polymer film containing silicon, oxygen, carbon, and hydrogen, and the barrier insulating film 507 is a silicon nitride film or a silicon carbonitride film, RIE processing can be performed by adjusting an etching condition with a mixed gas such as $CF_4$-based, $CF_4/Cl_2$-based, and $CF_4/Cl_2/Ar$-based. By use of such a hard mask RIE method, a variable resistance element part can be processed without exposing the variable resistance element part to oxygen plasma ashing for resist removal. Further, when oxidation treatment is performed with oxygen plasma after the processing, the oxidation plasma treatment can be irradiated without depending on a resist stripping time.

(Step 11)

As illustrated in FIG. 12(*c*), the protective insulating film 514 (such as a silicon nitride film or a silicon carbonitride film with a film thickness of 20 nm) is deposited on the barrier insulating film 507 including the hard mask film 512, the upper second electrode 511, the lower second electrode 510, and the ion conduction layer 509. While the protective insulating film 514 may be formed by a plasma-enhanced CVD method, a reaction chamber needs to be maintained at reduced pressure before film-forming, and, at this time, a problem occurs that oxygen separates from a side surface of the ion conduction layer 509, and leak current of the ion conduction layer increases. In order to suppress the problem, it is preferable that a film-forming temperature of the protective insulating film 514 be 300° C. or lower. Additionally, exposure to a film-forming gas at reduced pressure occurs before the film-forming, therefore it is preferable that a reducing gas be not used. For example, it is preferable to use a silicon nitride film formed with high-density plasma of a mixed gas of $SiH_4/N_2$ at a substrate temperature of 300° C.

(Step 12)

As illustrated in FIG. 12(d), an interlayer insulating film 515 (such as a silicon oxide film), a low-dielectric-constant film having a low relative dielectric constant (such as an SiOCH film with a film thickness of 150 nm) as a Low-k insulating film 516, and an interlayer insulating film 517 (such as a silicon oxide film) are deposited on the protective insulating film 514 in this order. Then, wiring grooves for a second wiring A 518a and a second wiring B 518b, and prepared holes for a via A 519a and a via B 519b are formed. Furthermore, by use of a copper dual-damascene wiring process, the second wiring A 518a and the second wiring B 518b (such as copper), and the via A 519a and the via B 519b (such as copper) are simultaneously formed in the wiring grooves and the prepared holes through a second barrier metal A 520a and a second barrier metal B 520b (such as tantalum nitride/tantalum), respectively. Then, a barrier insulating film 521 (such as a silicon nitride film) is deposited on the interlayer insulating film 517 including the second wiring A 518a and the second wiring B 518b. A process similar to the formation of the lower-layer wiring may be used for the formation of the second wiring A 518a and the second wiring B 518b. At this time, by making a material of the second barrier metal A 520a same as the upper second electrode 511, contact resistance between the second barrier metal A 520a and the upper second electrode 511 can be reduced, and element performance can be enhanced. The interlayer insulating film 515, the Low-k insulating film 516, and the interlayer insulating film 517 may be formed by a plasma-enhanced CVD method. In order to clear a level difference formed by the "three-terminal switch," the interlayer insulating film 515 may be thickly deposited and planarized by a CMP method, so as to be set to a desired film thickness. The via A 519a and the via B 519b are formed by patterning by exposure with a same photomask and simultaneous etching. The upper second electrode 511 is exposed to etching correspondingly to a height difference between the via A 519a and the via B 519b, and is dug down in a depth direction.

Third Exemplary Embodiment

Figure 13:
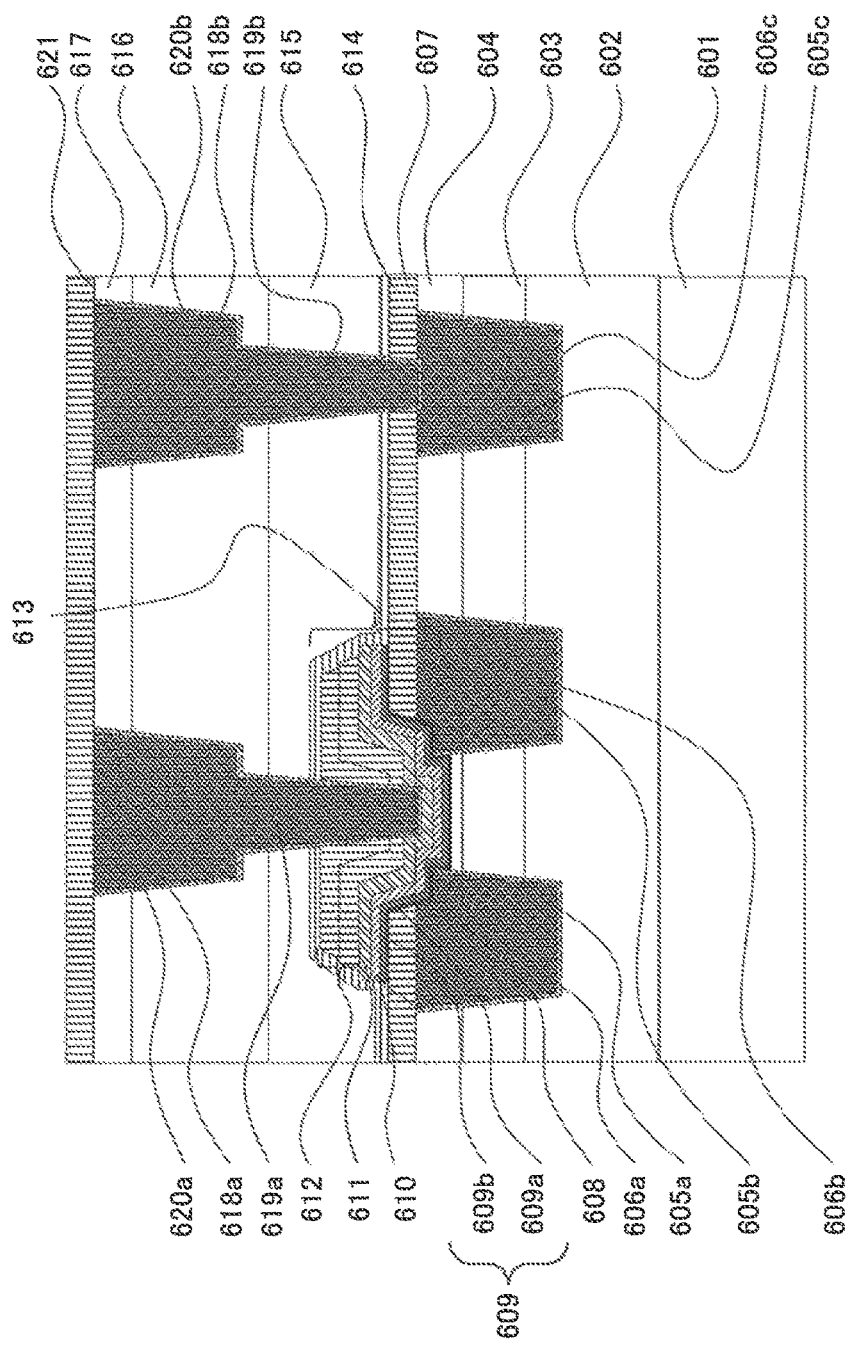
FIG. 13 is a schematic cross-sectional view illustrating a configuration example of a three-terminal switching element as a semiconductor device according to a third exemplary embodiment of the present invention.

Next, a variable resistance element, a semiconductor device, and a manufacturing method of the semiconductor device according to a third exemplary embodiment of the present invention will be described. A configuration of a semiconductor device including a three-terminal switch or a two-terminal switch, as an example of a variable resistance element, inside a multi-layered wiring layer, as the semiconductor device according to the third exemplary embodiment of the present invention, will be described. The semiconductor device according to the present exemplary embodiment is a modified example of the semiconductor devices according to the aforementioned exemplary embodiments. FIG. 13 is a cross-sectional view schematically illustrating a configuration example of a switching element employing a configuration of "a three-terminal switch or a two-terminal switch formed inside a multi-layered wiring layer" according to the third exemplary embodiment. The semiconductor device includes a three-terminal switch 613 inside a multi-layered wiring layer on a semiconductor substrate 601.

The multi-layered wiring layer includes an insulating laminated body on the semiconductor substrate 601. In the insulating laminated body, an interlayer insulating film 602, a Low-k insulating film 603, an interlayer insulating film 604, a barrier insulating film 607, a protective insulating film 614, an interlayer insulating film 615, a Low-k insulating film 616, an interlayer insulating film 617, and a barrier insulating film 621 are laminated in this order.

In the multi-layered wiring layer, a first wiring A 605a, a first wiring B 605b, and a first wiring C 605c are embedded in wiring grooves formed in the interlayer insulating film 604 and the Low-k insulating film 603 through a first barrier metal A 606a, a first barrier metal B 606b, and a first barrier metal C 606c, respectively. In the multi-layered wiring layer, a second wiring A 618a and a second wiring B 618b are embedded in wiring grooves formed in the interlayer insulating film 617 and the Low-k insulating film 616. Additionally, a via A 619a and a via B 619b are embedded in prepared holes formed in the interlayer insulating film 615, the protective insulating film 614, and a hard mask film 612. Additionally, the second wiring A 618a and the via A 619a, and the second wiring B 618b and the via B 619b are respectively integrated. Additionally, side surfaces and bottom surfaces of the second wiring A 618a and the via A 619a, and the second wiring B 618b and the via B 619b, are respectively covered by a second barrier metal A 620a and a second barrier metal B 620b.

In the multi-layered wiring layer, the three-terminal switch 613 is formed at an opening formed on the barrier insulating film 607. In the three-terminal switch 613, an ion conduction layer 609, a lower second electrode 610, and an upper second electrode 611 are laminated in this order on the first wiring A 605a and the first wiring B 605b as a first electrode, the interlayer insulating film 604 sandwiched between the first wiring A 605a and the first wiring B 605b, part of side surfaces of the first barrier metal A 606a and the first barrier metal B 606b, a wall surface of the opening of the barrier insulating film 607, and the barrier insulating film 607. The hard mask film 612 is formed on the upper second electrode 611, and an upper surface and a side surface of a laminated body including the ion conduction layer 609, the lower second electrode 610, the upper second electrode 611, and the hard mask film 612 are covered by the protective insulating film 614. By making part of the first wiring A 605a and the first wiring B 605b as a lower electrode of the "three-terminal switch" 613, electrode resistance can be reduced while simplifying a number of steps. By merely creating at least a 2PR mask set as an additional step to a common copper damascene wiring process, the "three-terminal switch" 613 can be integrated, and reduction in resistance and a cost of the element can be concurrently achieved. The ion conduction layer 609 includes a first ion conduction layer 609a and a second ion conduction layer 609b.

In the "three-terminal switch" 613 in the semiconductor device in FIG. 13, the first ion conduction layer 609a is in direct contact with the first wiring A 605a and the first wiring B 605b in the opening region formed on the barrier insulating film 607. Then, a metal constituting the first ion conduction layer 609a diffuses into the first wiring A 605a and the first wiring B 605b to form an alloy layer at an interface. In the "three-terminal switch" 613, the via A 619a and the upper second electrode 611 are electrically connected through the second barrier metal A 620a on the upper second electrode 611. The "three-terminal switch" 613 is controlled in ON or OFF state by applying voltage or passing current. The switch is controlled in ON or OFF state by, for example, utilizing electric field diffusion of a metal ion supplied from a metal forming the first wiring A 605a and the first wiring B 605b, into the first ion conduction layer 609a and the second ion conduction layer 609b.

Furthermore, in the semiconductor device according to the present exemplary embodiment, the first wiring A 605a and the first wiring B 605b include a recess part 608 formed by digging down in a depth direction in the opening region formed on the barrier insulating film 607. FIG. 13 illustrates a state in which the interlayer insulating film 604 sandwiched between the recess part 608 of the first wiring A 605a and the recess part 608 of the first wiring B 605b is also dug down.

Furthermore, in the semiconductor device according to the present exemplary embodiment, the recess part of the interlayer insulating film 604 is lower in a depth direction than the height of the recess part 608 of the first wiring A 605a and the first wiring B 605b. In other words, in the opening region of the barrier insulating film 607, a region with two different stages of height is formed in the ion conduction layer 609. The first ion conduction layer 609a is in contact with upper surfaces and side surfaces of the first wiring A 605a and the first wiring B 605b (the first barrier metal A 606a and the first barrier metal B 606b) at the recess part 608. Further, the via B 619b is in contact with the first wiring C 605c through the second barrier metal B 620b, without intervening the three-terminal switch 613 between the first wiring C 605c and the via B 619b. The first wiring A 605a and the first wiring B 605b, and the first wiring C 605c are wirings formed in a same layer, on the basis of, for example, the semiconductor substrate 601.

The three-terminal switch 613 in the semiconductor device according to the present exemplary embodiment is arranged down in a depth direction correspondingly to the recess part 608. Thus, a height of the via A 619a in contact with the upper second electrode 611 through the second barrier metal A 620a, and a height of the via B 619b in contact with the first wiring C 605c through the second barrier metal B 620b, can be nearly equalized. At this time, the via A 619a is connected to the upper second electrode 611 immediately above the interlayer insulating film 604 sandwiched between the first wiring A 605a and the first wiring B 605b, being dug down deepest in the recess part 608. Accordingly, when the via A 619a and the via B 619b are exposed by use of a same photomask and formed by plasma etching simultaneously, plasma damage in the three-terminal switch 613 is reduced to an amount corresponding to the height difference between the via A 619a and the via B 619b. Consequently, degradation in element performance of the three-terminal switch 613 can be suppressed.

The semiconductor substrate 601 is a substrate on which a semiconductor element is formed. A substrate such as a silicon substrate, a single-crystal substrate, a silicon-on-insulator (SOI) substrate, a thin-film transistor (TFT) substrate, and a substrate for manufacturing a liquid crystal display (LCD) may be used as the semiconductor substrate 601.

The interlayer insulating film 602 is an insulating film formed on the semiconductor substrate 601. For example, a silicon oxide film, an SiOC film, or the like may be used as the interlayer insulating film 602. The interlayer insulating film 602 may be a laminate of a plurality of insulating films.

The Low-k insulating film 603 is an insulating film having a low relative dielectric constant, arranged between the interlayer insulating films 602 and 604, and a low-dielectric-constant film (such as an SiOCH film) having a relative dielectric constant lower than a silicon oxide film, or the like is used. Wiring grooves for embedding the first wiring A 605a, the first wiring B 605b, and the first wiring C 605c are formed in the Low-k insulating film 603. The first wiring A 605a, the first wiring B 605b, and the first wiring C 605c are embedded in the wiring grooves through the first barrier metal A 606a, the first barrier metal B 606b, and the first barrier metal C 606c, respectively.

The interlayer insulating film 604 is an insulating film formed on the Low-k insulating film 603. For example, a silicon oxide film, an SiOC film, or the like may be used as the interlayer insulating film 604. The interlayer insulating film 604 may be a laminate of a plurality of insulating films. Wiring grooves for embedding the first wiring A 605a, the first wiring B 605b, and the first wiring C 605c are formed in the interlayer insulating film 604. The first wiring A 605a, the first wiring B 605b, and the first wiring C 605c are embedded in the wiring grooves through the first barrier metal A 606a, the first barrier metal B 606b, and the first barrier metal C 606c, respectively. The interlayer insulating film 604 sandwiched between the first wiring A 605a and the first wiring B 605b is dug down, upon formation of the recess part 608, and is dug down lower in a depth direction than the recess part 608 of the first wiring A 605a and the first wiring B 605b.

The first wiring A 605a and the first wiring B 605b are wirings embedded in the wiring grooves formed in the interlayer insulating film 604 and the Low-k insulating film 603 through the first barrier metal A 606a and the first barrier metal B 606b. The first wiring A 605a and the first wiring B 605b also serve as the lower electrode of the two-terminal switch 613, and are in direct contact with the first ion conduction layer 609a. An upper surface of the first ion conduction layer 609a is in direct contact with the second ion conduction layer 609b, and an upper surface of the second ion conduction layer 609b is in direct contact with the lower second electrode 610. A metal capable of diffusion and ionic conduction in the ion conduction layer 609, such as copper, may be used as a metal constituting the first wiring A 605a and the first wiring B 605b. The metal constituting the first wiring A 605a and the first wiring B 605b (such as copper) may be alloyed with aluminum.

The first wiring A 605a and the first wiring B 605b include the recess part 608 formed by digging down in a depth direction at the opening surface of the barrier insulating film 607. The first wiring A 605a and the first wiring B 605b are in contact with the first ion conduction layer 609a at the recess part 608. An alloy layer with a metal constituting the first ion conduction layer 609a, to be described later, is formed at an interface between the recess part 608 and the first ion conduction layer 609a. The alloy layer is not formed throughout the first wiring A 605a and the first wiring B 605b, but is formed only at the opening surface of the barrier insulating film 607.

Formation of the recess part 608 is performed after forming the opening surface of the barrier insulating film 607 in contact with the first wiring A 605a and the first wiring B 605b, by applying onto the substrate including the first wiring A 605a, the first wiring B 605b, and the interlayer insulating film 604, in a dry etching apparatus, plasma using a halogen gas, an inert gas, or a fluorocarbon-based gas, or a mixed gas thereof, at reduced pressure. At this time, while the barrier insulating film 607 is also etched, the first wiring C 605c not forming the three-terminal switch 613 is not exposed to the plasma, and is not dug down.

The first wiring C 605c is a wiring embedded in the wiring groove formed in the interlayer insulating film 604 and the Low-k insulating film 603 through the first barrier metal C 606c. The first wiring C 605c is in direct contact with the via B 619b at the opening of the barrier insulating film 607 through the second barrier metal B 620b.

The first barrier metal A 606a, the first barrier metal B 606b, and the first barrier metal C 606c are conductive films having a barrier property, covering side surfaces and bottom surfaces of the first wiring A 605a, the first wiring B 605b, and the first wiring C 605c. The covering prevents the metal forming the first wiring A 605a, the first wiring B 605b, and the first wiring C 605c from diffusing into the interlayer insulating film 604 and a lower layer. When, for example, the first wiring A 605a, the first wiring B 605b, and the first wiring C 605c are composed of a metal element with copper being a main component, a refractory metal or a nitride thereof such as tantalum, tantalum nitride, titanium nitride, and tungsten carbonitride, or a laminated film thereof may be used as the first barrier metal A 606a, the first barrier metal B 606b, and the first barrier metal C 606c.

The barrier insulating film 607 is formed on the interlayer insulating film 604 including the first wiring A 605a, the first wiring B 605b, and the first wiring C 605c, and has a role in preventing oxidation of the metal forming the first wiring A 605a, the first wiring B 605b, and the first wiring C 605c (such as copper). Additionally, the barrier insulating film 607 has a role in preventing the metal forming the first wiring A 605a, the first wiring B 605b, and the first wiring C 605c from diffusing into the interlayer insulating film 615. Additionally, the barrier insulating film 607 has a role as an etching stopper layer upon processing of the upper second electrode 611, the lower second electrode 610, and the ion conduction layer 609. For example, an SiC film, a silicon carbonitride film, a silicon nitride film, or a laminated structure thereof may be used as the barrier insulating film 607. It is preferable that the barrier insulating film 607 be of the same material as the protective insulating film 614 and the hard mask film 612.

The first ion conduction layer 609a and the second ion conduction layer 609b are films with variable resistance. A material varying resistance by an action (such as diffusion and ion conduction) of a metal ion generated from the metal forming the first wiring A 605a and the first wiring B 605b (lower electrode) may be used. When resistance change of the "three-terminal switch" 613 accompanying switching to an "ON" state is performed by precipitation of metal due to reduction of a metal ion, an ion-conductible film is used.

The second ion conduction layer 609b is formed by use of a plasma-enhanced CVD method. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to in a range of 10 to 200 sccm, and a supply amount of helium is set to 500 sccm through a raw material vaporizer. The thus formed second ion conduction layer 609b is a porous polymer having silicon, oxygen, and carbon as main components, and, for example, has a relative dielectric constant greater than or equal to 2.1 and less than or equal to 3.0.

The first ion conduction layer 609a has a role in preventing the metal forming the first wiring A 605a and the first wiring B 605b from diffusing into the second ion conduction layer 609b due to heating and plasma during deposition of the second ion conduction layer 609b. Further, the first ion conduction layer 609a has a role in preventing the first wiring A 605a and the first wiring B 605b from being oxidized and becoming more likely to diffuse into the second ion conduction layer 609b. A metal forming the first ion conduction layer 609a, such as zirconium, hafnium, aluminum, and titanium, is exposed to an oxygen atmosphere in a deposition chamber for the second ion conduction layer 609b at reduced pressure, after film formation of the metal constituting the first ion conduction layer 609a. The metal exposed to the oxygen atmosphere turns to zirconium oxide, hafnium oxide, aluminum oxide, or titanium oxide, and becomes part of the ion conduction layer 609. An optimum film thickness of the metal film forming the first ion conduction layer 609a is in a range of 0.5 to 1 nm. The metal film used for forming the first ion conduction layer 609a may form a laminate or may be a single layer. It is preferable that formation of the first ion conduction layer 609a be performed by sputtering. A metal atom or ion gaining energy by sputtering rushes and diffuses into the first wiring A 605a and the first wiring B 605b to form an alloy layer.

The ion conduction layer 609 is formed on the first wiring A 605a and the first wiring B 605b, the interlayer insulating film 604 sandwiched between the first wiring A 605a and the first wiring B 605b, a tapered surface of the recess part 608 formed at the opening of the barrier insulating film 607, a tapered surface of the barrier insulating film 607, and the barrier insulating film 607. In the ion conduction layer 609, an outer periphery of a connecting part of the first wiring A 605a and the first wiring B 605b, and the ion conduction layer 609 is arranged at least along the tapered surface of the recess part 608, a tapered surface of the opening of the barrier insulating film 607, the interlayer insulating film 604 sandwiched between the first wiring A 605a and the first wiring B 605b, and side surfaces of the first barrier metal A 606a and the first barrier metal B 606b on the sandwiched side between the first wiring A 605a and the first wiring B 605b.

The lower second electrode 610 is an electrode on the lower layer side of an upper electrode of the "three-terminal switch" 613, and is in direct contact with the second ion conduction layer 609b. An alloy containing ruthenium, and titanium, tantalum, zirconium, hafnium, aluminum, or the like, having good adhesion with the metal forming the first wiring A 605a and the first wiring B 605b, is used for the lower second electrode 610. Ruthenium is a metal more resistant to ionization than the metal forming the first wiring A 605a and the first wiring B 605b, and is resistant to diffusion and ionic conduction in the second ion conduction layer 609b.

In a ruthenium alloy used in formation of the lower second electrode 610, it is desirable to select, as a first metal to be added to ruthenium, an added metal having a standard Gibbs energy of formation of a process of generating a metal ion from the metal (oxidation process) greater than ruthenium in a negative direction. Titanium, tantalum, zirconium, hafnium, and aluminum, each having a standard Gibbs energy of formation of a process of generating a metal ion from the metal (oxidation process) greater than ruthenium in a negative direction, exhibit stronger likelihood of spontaneously generating a chemical reaction compared with ruthenium, and therefore have high reactivity. Consequently, in the ruthenium alloy forming the lower second electrode 610, adhesion with a metal bridge formed by the metal forming the first wiring A 605a and the first wiring B 605b is enhanced by alloying with ruthenium. By contrast, when the lower second electrode 610 is composed of only an added metal such as titanium, tantalum, zirconium, hafnium, and aluminum, without ruthenium, reactivity becomes so high that transition to an "OFF" state does not occur. The transition from an "ON" state to an "OFF" state progresses by an oxidation reaction (dissolution reaction) of the metal bridge. When a metal having a standard Gibbs energy of formation of a process of generating a metal ion from the metal (oxidation process) greater than the metal forming the first wiring A 605a and the first wiring B 605b in a negative direction is used as a metal constituting the lower second electrode 610, transition to an "OFF" state is not likely to occur. The reason is that an oxidation reaction of the lower second electrode 610 progresses ahead of an oxidation reaction of the metal bridge formed by the metal forming the first wiring A 605a and the first wiring B 605b. Accordingly, a metal material used for formation of the lower second electrode 610 needs to be alloyed with ruthenium having a standard Gibbs energy of formation of a process of generating a metal ion from the metal (oxidation process) less in a negative direction than copper. Furthermore, when copper being a component of the metal bridge is mixed into the lower second electrode 610, an effect of adding a metal having a large standard Gibbs energy in a negative direction is diminished, and therefore it is preferable that a metal added to ruthenium be a material having a barrier property with respect to copper and a copper ion. For example, tantalum, titanium, or the like may be used. Meanwhile, it is known that a greater amount of an added metal stabilizes an "ON" state accordingly, and it is also known that an addition of 5 atm % enhances the stability. When an added metal is titanium, in particular, excellent transition to an "OFF" state and excellent stability of an "ON" state are exhibited, and it is particularly preferable that the lower second electrode 610 be composed of an alloy of ruthenium and titanium, and a content ratio of titanium be in a range of 20 atm % to 30 atm %. It is desirable that a content ratio of ruthenium in the ruthenium alloy be greater than or equal to 60 atm % and less than or equal to 90 atm %.

It is desirable to use a sputtering method for forming the lower second electrode 610. When forming an alloy by use of a sputtering method, a method of using an alloy target of ruthenium and a first metal, a co-sputtering method of sputtering a ruthenium target and a first metal target simultaneously in a same chamber, and an intermixing method of forming a thin film of a first metal in advance, performing film-forming of ruthenium thereon by use of a sputtering method, and performing alloying by energy of colliding atoms, are available. By use of the co-sputtering method and the intermixing method, composition of an alloy can be changed. When the intermixing method is adopted, it is preferable that heat treatment at 400° C. or lower be applied for "flattening" of a mixed state, after film-forming of ruthenium is completed.

The upper second electrode 611 is an electrode on the upper layer side of the upper electrode of the "three-terminal switch" 613, and is formed on the lower second electrode 610. The upper second electrode 611 has a role in protecting the lower second electrode 610. Specifically, by the upper second electrode 611 protecting the lower second electrode 610, damage to the lower second electrode 610 in a process can be suppressed, and a switching characteristic of the "three-terminal switch" 613 can be maintained. For example, tantalum, titanium, tungsten, a nitride thereof, or the like may be used for the upper second electrode 611. Further, when electrically connecting the via A 619a on the lower second electrode 610, the upper second electrode 611 also functions as an etching stopper layer. Accordingly, it is preferable that an etching rate of the electrode be low with respect to plasma of a fluorocarbon-based gas used for etching the interlayer insulating film 615.

The upper second electrode 611 is composed of a metal nitride. A nitride of titanium, tantalum, zirconium, hafnium, or aluminum, functioning as an etching stopper layer and having conductivity, is particularly preferable. When a metal not being a nitride is used for the upper second electrode 611, defects may be generated in the lower second electrode 610 by part of the metal diffusing into the lower second electrode 610 due to heating and plasma damage during the process. Starting from the defects, dielectric breakdown voltage of the ion conduction layer 609 may be decreased. By using a metal nitride being a stable compound having electrical conductivity for the upper second electrode 611, diffusion of the metal into the lower second electrode 610 can be prevented. It is particularly preferable that a metal in a metal nitride constituting the upper second electrode 611 and an added metal forming an alloy with ruthenium constituting the lower second electrode 610 be a same metal. Consequently, diffusion failure of the metal forming the alloy with ruthenium can be more efficiently prevented. For example, when the lower second electrode 610 is an alloy electrode of ruthenium and titanium, it is preferable that the upper second electrode 611 be a titanium nitride electrode. Alternatively, when the lower second electrode 610 is an alloy of ruthenium and tantalum, the upper second electrode 611 should be a tantalum nitride electrode. By matching metal components constituting the lower second electrode 610 and the upper second electrode 611, even in case that the metal in the upper second electrode 611 diffuses into the lower second electrode 610, defects are less likely to form. At this time, a ratio of metal to nitrogen in the nitride constituting the upper second electrode 611 is set to be greater than a ratio of metal to ruthenium in the ruthenium alloy constituting the lower second electrode 610. By thus setting the ratio high, diffusion of the metal constituting the lower second electrode 610 into the nitride constituting the upper second electrode 611, causing change in composition of the ruthenium alloy constituting the lower second electrode 610, can be prevented. Specifically, it is more preferable that a content ratio of titanium be greater than or equal to 60 atm % and less than or equal to 80 atm %.

It is desirable to use a sputtering method for forming the upper second electrode 611. When film-forming a metal nitride by use of a sputtering method, it is preferable to use a reactive sputtering method of vaporizing a metal target by use of plasma of a mixed gas of nitrogen and argon. A metal vaporized from the metal target reacts with nitrogen to turn to a metal nitride, and then film-formed on a substrate.

As a more preferable forming method of the upper second electrode 611, it is preferable to use co-sputtering using two electrodes being a ruthenium target electrode and a target electrode composed of a first metal. When an alloy target composed of ruthenium and the first metal is used, composition in continuous use causes deviation due to difference in sputtering yield of each material, and therefore composition of the film to be formed cannot be closely controlled. By contrast, the co-sputtering method is able to precisely control composition of the film to be formed, by individually setting power applied to each target electrode. It is highly effective to use titanium or tantalum, in particular, as the first metal.

In the semiconductor device according to the present exemplary embodiment, the three-terminal switch 613 can be arranged down in a depth direction by forming the recess part 608 on the first wiring A 605a and the first wiring B 605b, and forming a recess part on the interlayer insulating film 604 sandwiched between the first wiring A 605a and the first wiring B 605b. Accordingly, a time in which the upper second electrode 611 is exposed to etching plasma using a fluorine gas, a rare gas, an inert gas, or a mixed gas thereof, used in pattern forming of the via A 619a, can be reduced. Consequently, a film thickness of the upper second electrode 611 etched by the etching gas is reduced, and accumulation of plasma damage in the ion conduction layer 609 can be prevented. Accumulation of plasma damage in the ion conduction layer 609 causes the metal constituting the first wiring A 605a and the first wiring B 605b to become more likely to diffuse into the ion conduction layer 609, causes the ion conduction layer 609 to increase defects due to damage by charge-up, and consequently leads to increase in leak current of the three-terminal switch 613 and progression of characteristic variation and reliability degradation.

The via A 619a may be connected to the upper second electrode 611 immediately above the recess part 608 of the first wiring A 605a and the first wiring B 605b, instead of being connected to the upper second electrode 611 immediately above the interlayer insulating film 604 sandwiched between the first wiring A 605a and the first wiring B 605b. However, in this case, the height difference between the via A 619a and the via B 619b becomes greater compared with the case of being connected to the upper second electrode 611 immediately above the interlayer insulating film 604 sandwiched between the first wiring A 605a and the first wiring B 605b.

The hard mask film 612 is a film being a hard mask film and passivation film in etching the upper second electrode 611, the lower second electrode 610, and the first ion conduction layer 609a and the second ion conduction layer 609b. For example, a silicon nitride film, a silicon oxide film, or the like, or a laminated film thereof may be used as the hard mask film 612. It is preferable that the hard mask film 612 contain the same material as the protective insulating film 614 and the barrier insulating film 607. Specifically, by surrounding a whole periphery of the "three-terminal switch" 613 with a same material, a material interface is integrated so that ingress of moisture and the like from outside can be prevented, and separation from the "three-terminal switch" 613 itself can be prevented.

The protective insulating film 614 is an insulating film having a function of further preventing separation of oxygen from the second ion conduction layer 609b without damaging the "three-terminal switch" 613. For example, a silicon nitride film, a silicon carbonitride film, and the like may be used as the protective insulating film 614. It is preferable that the protective insulating film 614 be of the same material as the hard mask film 612 and the barrier insulating film 607. When the same material is used, the protective insulating film 614 is integrated with the barrier insulating film 607 and the hard mask film 612 to enhance interface adhesion, enabling enhanced protection of the "three-terminal switch" 613.

The interlayer insulating film 615 is an insulating film formed on the protective insulating film 614. For example, a silicon oxide film, an SiOC film, or the like may be used as the interlayer insulating film 615. The interlayer insulating film 615 may be a laminate of a plurality of insulating films. The interlayer insulating film 615 may be of the same material as the interlayer insulating film 617. In the interlayer insulating film 615, prepared holes for embedding the via A 619a and the via B 619b are formed, and the via A 619a and the via B 619b are embedded in the prepared holes through the second barrier metal A 620a and the second barrier metal B 620b, respectively.

The Low-k insulating film 616 is an insulating film having a low relative dielectric constant, arranged between the interlayer insulating films 615 and 617, and a low-dielectric-constant film having a lower relative dielectric constant than a silicon oxide film (such as an SiOCH film) is used. In the Low-k insulating film 616, wiring grooves for embedding the second wiring A 618a and the second wiring B 618b are formed, and the second wiring A 618a and the second wiring B 618b are embedded in the wiring grooves through the second barrier metal A 620a and the second barrier metal B 620b, respectively.

The interlayer insulating film 617 is an insulating film formed on the Low-k insulating film 616. For example, a silicon oxide film, an SiOC film, a low-dielectric-constant film having a lower relative dielectric constant than a silicon oxide film (such as an SiOCH film), or the like may be used as the interlayer insulating film 617. The interlayer insulating film 617 may be a laminate of a plurality of insulating films. The interlayer insulating film 617 may be of the same material as the interlayer insulating film 615. In the interlayer insulating film 617, wiring grooves for embedding the second wiring A 618a and the second wiring B 618b are formed, and the second wiring A 618a and the second wiring B 618b are embedded in the wiring grooves through the second barrier metal A 620a and the second barrier metal B 620b, respectively.

The second wiring A 618a and the second wiring B 618b are wirings embedded in the wiring grooves formed in the interlayer insulating film 617 and the Low-k insulating film 616, through the second barrier metal A 620a and the second barrier metal B 620b, respectively. The second wiring A 618a and the second wiring B 618b are respectively integrated with the via A 619a and the via B 619b. The via A 619a and the via B 619b are embedded in prepared holes formed in the interlayer insulating film 615, the protective insulating film 614, and, in the case of the via A 619a, the hard mask film 612, through the second barrier metal A 620a and the second barrier metal B 620b, respectively. The via A 619a is electrically connected to the upper second electrode 611 through the second barrier metal A 620a. For example, copper may be used for the second wiring A 618a and the second wiring B 618b, and the via A 619a and the via B 619b.

The second barrier metal A 620a and the second barrier metal B 620b are conductive films having a barrier property, covering the side surfaces and the bottom surfaces of the second wiring A 618a and the second wiring B 618b, and the via A 619a and the via B 619b. The covering prevents the metal forming the second wiring A 618a and the second wiring B 618b (including the via A 619a and the via B 619b) from diffusing into the interlayer insulating films 615 and 617, and a lower layer. When, for example, the second wiring A 618a and the second wiring B 618b, and the via A 619a and the via B 619b are composed of a metal element with copper being a main component, a refractory metal or a nitride thereof, such as tantalum, tantalum nitride, titanium nitride, and tungsten carbonitride, or a laminated film thereof may be used as the second barrier metal A 620a and the second barrier metal B 620b. It is preferable that the second barrier metal A 620a and the second barrier metal B 620b be of the same material as the upper second electrode 611. For example, when the second barrier metal A 620a and the second barrier metal B 620b have a laminated structure of tantalum nitride (lower layer)/tantalum (upper layer), it is preferable to use tantalum nitride being the lower layer material for the upper second electrode 611.

The barrier insulating film 621 is an insulating film formed on the interlayer insulating film 617 including the second wiring A 618a and the second wiring B 618b, and has a role in preventing oxidation of the metal forming the second wiring A 618a and the second wiring B 618b (such as copper). Further, the barrier insulating film 621 is an insulating film having a role in preventing the metal forming the second wiring A 618a and the second wiring B 618b from diffusing into an upper layer. For example, a silicon carbonitride film, a silicon nitride film, a laminated structure thereof, or the like may be used as the barrier insulating film 621.

(Mode 1)

Next, an advantage of the "three-terminal-switch" type switching element according to the present exemplary embodiment will be described in accordance with FIG. 14. Further, an element configuration will be described in accordance with the terminology indicated in FIG. 13.

Figure 14:
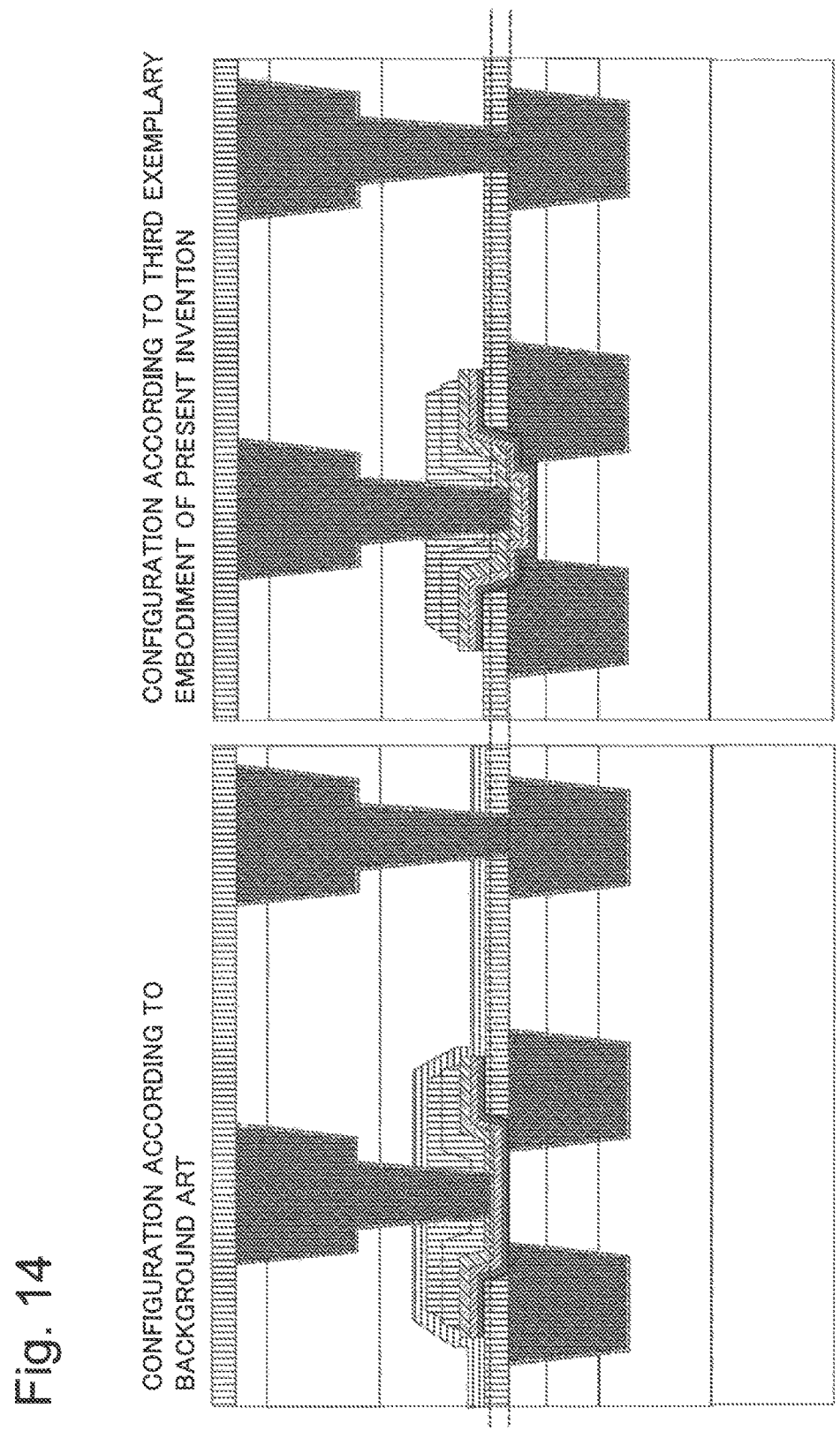
FIG. 14 is a schematic cross-sectional view comparing the configuration example of the three-terminal switching element in FIG. 13 with a configuration according to the background art.

FIG. 14 is a diagram illustrating a configuration according to the background art and a configuration according to the third exemplary embodiment placed side by side, in terms of a "three-terminal-switch" type switching element formed in a multi-layered wiring layer. In the configuration according to the aforementioned third exemplary embodiment, the recess part 608 formed by digging down in a depth direction is formed on the first wiring A 605a and the first wiring B 605b, and the interlayer insulating film 604 sandwiched between the first wiring A 605a and the first wiring B 605b, at the opening surface formed on the barrier insulating film 607. Accordingly, the three-terminal switch 613 is arranged down in a depth direction in the first wiring A 605a and the first wiring B 605b. In the configuration according to the aforementioned third exemplary embodiment, the interlayer insulating film 604 sandwiched between the first wiring A 605a and the first wiring B 605b is dug down lower in a depth direction than the height of the dug down part of the first wiring A 605a and the first wiring B 605b. By contrast, in the configuration according to the background art, the recess part 608 does not exist, and therefore the three-terminal switch 613 is formed immediately above the tapered surface of the barrier insulating film 607, and the first wiring A 605a and the first wiring B 605b. In the configuration according to the third exemplary embodiment, the via A 619a is lowered so as to electrically connect to the upper second electrode 611 immediately above the interlayer insulating film 604 sandwiched between the first wiring A 605a and the first wiring B 605b in the recess part 608. Accordingly, the height difference from the via B 619b directly connecting to the first wiring C 605c is nearly eliminated. When the via A 619a and the via B 619b are exposed with one mask and formed by simultaneous etching, the upper second electrode 611 in the three-terminal switch 613 is exposed to an etching environment correspondingly to the height difference between the via A 619a and the via B 619b. Accordingly, in the configuration according to the third exemplary embodiment of the present invention in which the height difference between the via A 619a and the via B 619b can be nearly eliminated, plasma damage to the ion conduction layer 609 can be further reduced.

(Mode 2)

As Mode 2 according to the present exemplary embodiment, a manufacturing process of a semiconductor device forming a switching element employing a "three-terminal switch" configuration inside a multi-layered wiring layer will be described. Steps of forming a switching element employing a "three-terminal switch" configuration in a multi-layered wiring layer in particular will be described. FIGS. 15(a) to 15(d), FIGS. 16(a) to 16(d), and FIGS. 17(a) to 17(d) are schematic cross-sectional views illustrating a manufacturing process of a three-terminal switching element as an example of a manufacturing method of the semiconductor device according to the third exemplary embodiment of the present invention.

(Step 1)

As illustrated in FIG. 15(a), an interlayer insulating film 702 (such as a silicon oxide film with a film thickness of 500 nm) is deposited on a semiconductor substrate 701 (such as a substrate on which a semiconductor element is formed). Then, a low-dielectric-constant film having a low relative dielectric constant (such as an SiOCH film with a film thickness of 150 nm) is deposited as a Low-k insulating film 703 on the interlayer insulating film 702. Then, a silicon oxide film (such as a silicon oxide film with a film thickness of 100 nm) is deposited as an interlayer insulating film 704 on the Low-k insulating film 703. Then, wiring grooves are formed in the interlayer insulating film 702, the Low-k insulating film 703, and the interlayer insulating film 704 by use of a lithography method (including photoresist formation, dry etching, and photoresist removal).

Subsequently, a first wiring A 705a, a first wiring B 705b and a first wiring C 705c (such as copper) are embedded in the wiring grooves through a first barrier metal A 706a, a first barrier metal B 706b and a first barrier metal C 706c (such as tantalum nitride/tantalum with film thicknesses of 5 nm/5 nm). The interlayer insulating films 702 and 704 may be formed by a plasma-enhanced CVD method. The first wiring A 705a, the first wiring B 705b, and the first wiring C 705c may be formed by, for example, forming the first barrier metal A 706a, the first barrier metal B 706b and the first barrier metal C 706c (such as laminated films of tantalum nitride/tantalum) by a PVD method, burying copper in the wiring grooves by an electrolytic plating method after forming copper seeds by the PVD method, and removing excess copper not existing inside the wiring grooves by a CMP method after heat treatment at a temperature of 200° C. or higher. Common techniques in the relevant technological fields may be used in the series of copper wiring forming methods. An embedded wiring (damascene wiring) is formed by polishing excess copper embedded in a groove, and planarization is performed by polishing an interlayer insulating film.

(Step 2)

As illustrated in FIG. 15(b), a barrier insulating film 707 (such as a silicon nitride film or a silicon carbonitride film with a film thickness of 30 nm) is formed on the interlayer insulating film 704 including the first wiring A 705a, the first wiring B 705b, and the first wiring C 705c. The barrier insulating film 707 may be formed by a plasma-enhanced CVD method. It is preferable that a film thickness of the barrier insulating film 707 be around 10 nm to 50 nm.

(Step 3)

As illustrated in FIG. 15(c), a hard mask film 708 (such as a silicon oxide film with a film thickness of 40 nm) is formed on the barrier insulating film 707. At this time, it is preferable that the hard mask film 708 be of a different material from the barrier insulating film 707 from the viewpoint of keeping an etching selection ratio high in dry etching processing, and may be an insulating film or a conductive film. For example, silicon oxide, silicon nitride, titanium nitride, titanium, tantalum, tantalum nitride, and the like, and also a laminated body of a silicon nitride film/silicon oxide film may be used as the hard mask film 708.

(Step 4)

Figure 15:
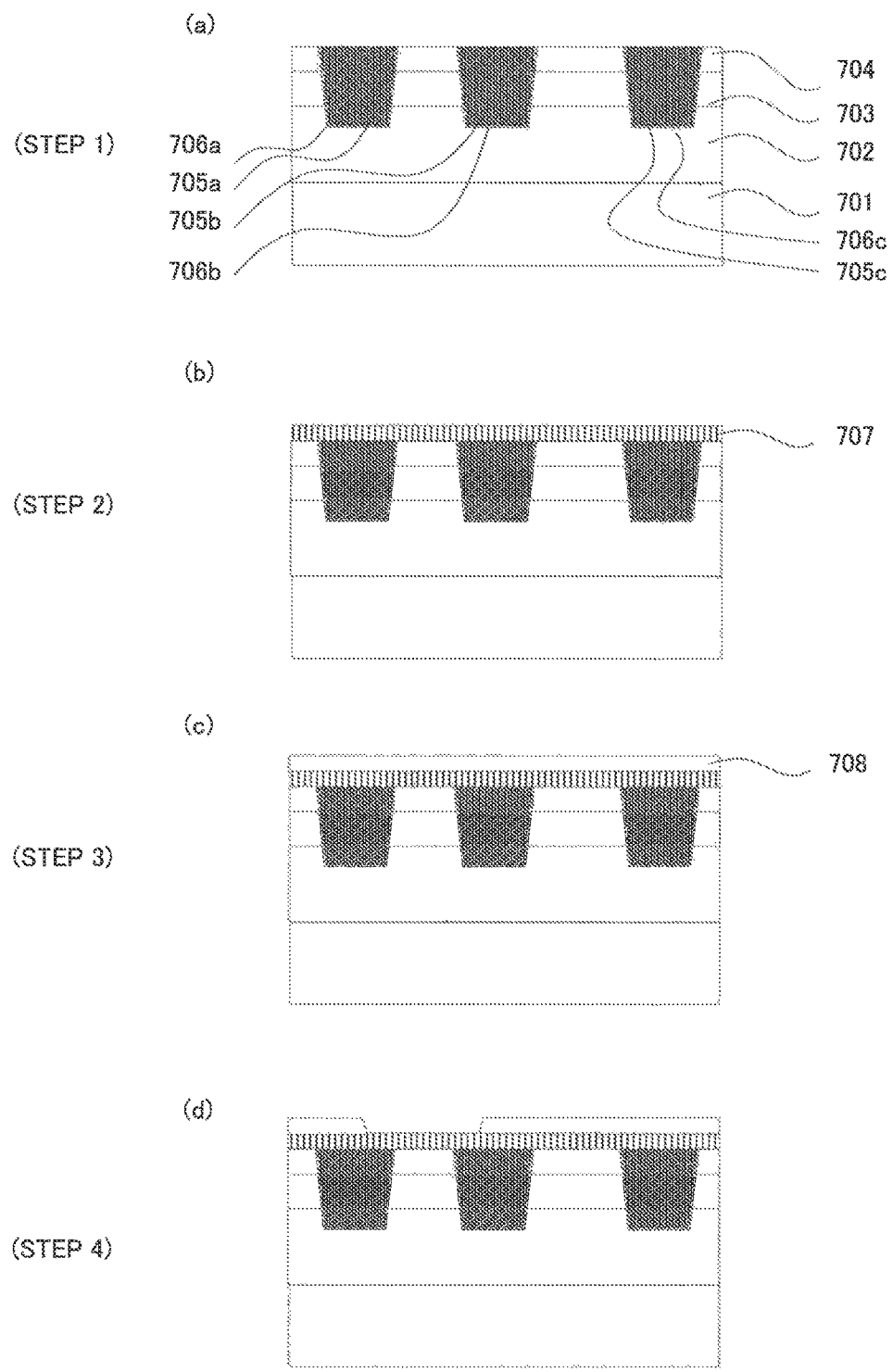
FIGS. 15(a) to 15(d) are schematic cross-sectional views illustrating a manufacturing process of a three-terminal switching element as an example of a manufacturing method of a semiconductor device according to the third exemplary embodiment of the present invention.

As illustrated in FIG. 15(*d*), an opening pattern is formed on the hard mask film 708 by forming a photoresist (unillustrated) pattern on the hard mask film 708, and performing dry etching using the photoresist as a mask. Then, the photoresist is stripped by oxygen plasma ashing or the like. At this time, the dry etching is not necessarily required to stop on an upper surface of the barrier insulating film 707, and may reach inside the barrier insulating film 707.

(Step 5)

Figure 16:
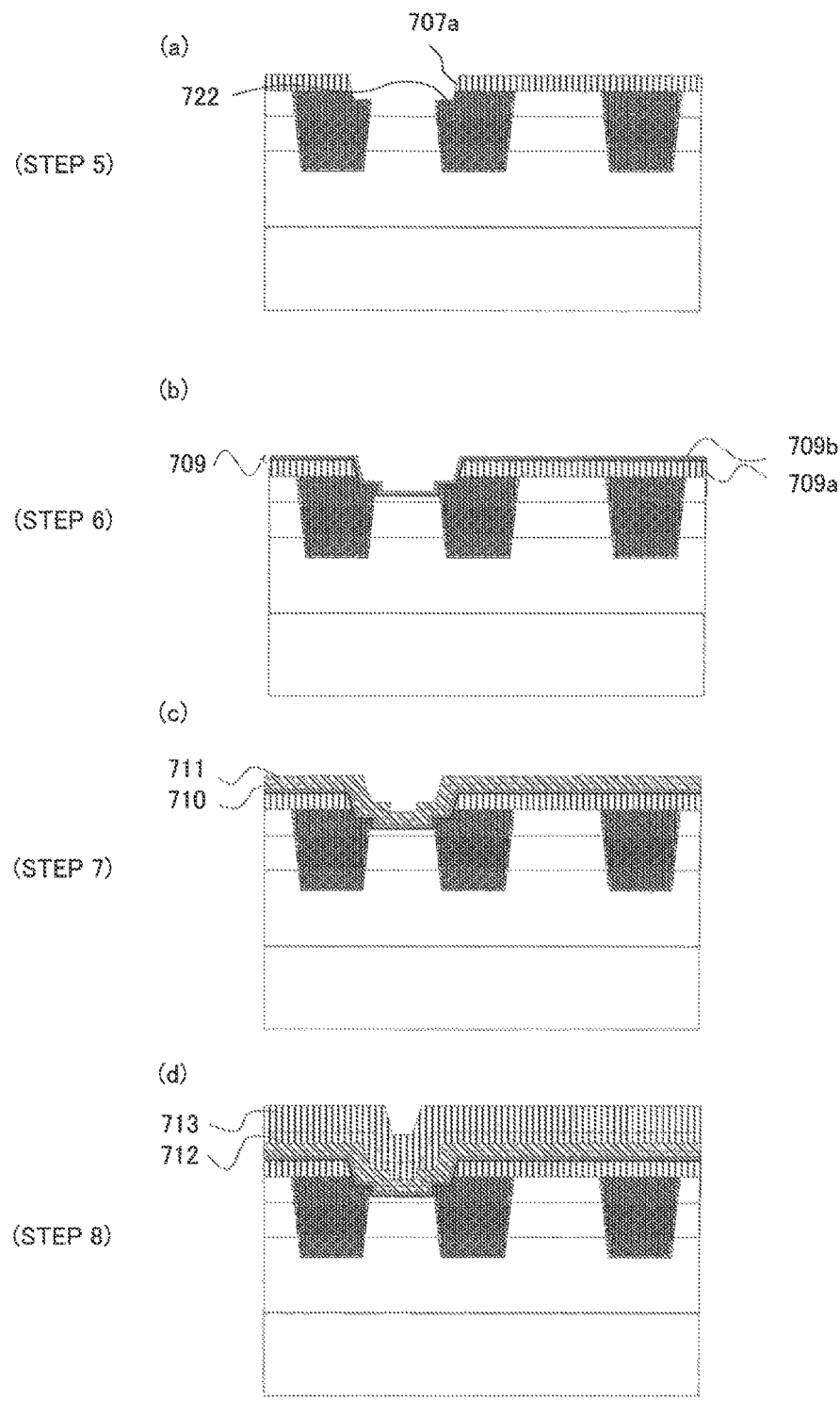
FIGS. 16(a) to 16(d) are schematic cross-sectional views illustrating a manufacturing process of the three-terminal switching element as an example of the manufacturing method of the semiconductor device according to the third exemplary embodiment of the present invention.

As illustrated in FIG. 16(*a*), the barrier insulating film 707 exposed from the opening of the hard mask film 708 is etched back (dry etched) by use of the hard mask film 708 as a mask. Accordingly, an opening 707*a* is formed on the barrier insulating film 707 to expose the first wiring A 705*a* and the first wiring B 705*b* from the opening 707*a* of the barrier insulating film 707. Then, by being exposed to plasma using a mixed gas of nitrogen and argon, copper oxide formed on the exposed surface of the first wiring A 705*a* and the first wiring B 705*b* is removed, and a by-product of etching generated upon the etch back, and the like, are removed. Furthermore, the exposed first wiring A 705*a* and the first wiring B 705*b* are dry etched to form a recess part 722 by use of an inert gas such as helium, argon, and nitrogen, a halogen gas, a fluorocarbon-based gas, or a mixed gas thereof, respectively. At this time, the interlayer insulating film 704 sandwiched between the first wiring A 705*a* and the first wiring B 705*b* is also dug down. The interlayer insulating film 704 between the first wiring A 705*a* and the first wiring B 705*b*, being exposed at the opening 707*a* of the barrier insulating film 707, is also dug down.

In etch back of the barrier insulating film 707, a wall surface of the opening of the barrier insulating film 707 can be formed as a tapered surface by use of reactive dry etching. In reactive dry etching, a gas containing carbon fluoride can be used as an etching gas. While it is preferable that the hard mask film 708 be completely removed during the etch back, the film may remain intact when the film is of an insulating material. Further, a shape of the opening 707*a* of the barrier insulating film 707 is circular, and a diameter of the circle may range from 30 nm to 500 nm. It is desirable that RF etching be performed in an ultrahigh vacuum (less than or equal to $10^{-5}$ Pa) in the formation of the recess part 722. It is desirable to use a nonresponsive gas such as helium, argon, and nitrogen as the etching gas. Further, it is desirable that bias power (ionized gas pull-in power toward the wafer side) in etching be set to 150 W or lower so as not to increase surface roughness of the recess part 722. There may be a case that an unintended recess part is formed in etching with high bias power, and, in such a case, roughness of the recess part is likely to increase compared with the exemplary embodiment of the present invention. When the surface roughness increases, there is a risk of increase in variation of switching voltage, leak current, and reliability, of the three-terminal switch. The etching using a nonresponsive gas progresses isotropically, and therefore a side surface of the recess part 722 can be tapered. An etching rate and an etching time are adjusted so that the film thickness of the barrier insulating film 707 is not entirely etched by dry etching for forming the recess part 722. It is desirable that a height (depth) of the recess part 722 be around 5 nm to 20 nm.

Further, the interlayer insulating film 704 sandwiched between the first wiring A 705*a* and the first wiring B 705*b* is dug down lower in a depth direction than the recess part of the first wiring A 705*a* and the first wiring B 705*b*. For the forming, the interlayer insulating film 704 may be dug down in advance before the forming step of the recess part 722 of the first wiring A 705*a* and the first wiring B 705*b*, after forming the opening 707*a* of the barrier insulating film 707. For the advance digging, use of, for example, a fluorocarbon-based gas or a mixed gas thereof, having a slow etching rate of a metal and a fast etching rate of a silicon oxide film and a Low-k insulating film in an etching chamber, may be considered.

The interlayer insulating film 704 may be dug down afterward by use of a fluorocarbon-based gas or a mixed gas thereof, after the recess part of the first wiring A 705*a* and the first wiring B 705*b* is formed. It is desirable that a height (depth) of the recess part of the interlayer insulating film 704 be around 5 nm to 20 nm below the recess part 722 of the first wiring A 705*a* and the first wiring B 705*b*.

(Step 6)

As illustrated in FIG. 16(*b*), an ion conduction layer 709 is formed on the barrier insulating film 707 including the first wiring A 705*a* and the first wiring B 705*b*. First, 1 nm of zirconium is deposited by a sputtering method. The zirconium is oxidized in formation of a second ion conduction layer 709*b* to form a first ion conduction layer 709*a*. At this time, a metal constituting the first ion conduction layer 709*a* diffuses into a part in contact with the first ion conduction layer 709*a* in the recess part 722, and an alloy layer is formed spontaneously. Additionally, by performing annealing in a vacuum environment at a temperature of 350° C., the thickness of the alloy layer can be increased. It is preferable to perform the annealing for around two minutes. Furthermore, an SiOCH-based polymer film containing silicon, oxygen, carbon, and hydrogen is formed as the second ion conduction layer 709*b* by the plasma-enhanced CVD. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to in a range of 10 to 200 sccm, and a supply amount of helium is set to 500 sccm through a raw material vaporizer. Additionally, 500 sccm of helium is directly supplied to the reaction chamber through another line. Moisture and the like are adhered to the opening 707*a* of the barrier insulating film 707 due to atmospheric exposure, and therefore it is preferable to perform degassing by applying heat treatment at reduced pressure at a temperature around 250° C. to 350° C. before deposition of the first ion conduction layer 709*a*.

(Step 7)

As illustrated in FIG. 16(*c*), an "alloy of ruthenium and titanium" is formed as a lower second electrode 710 with a film thickness of 10 nm on the ion conduction layer 709 by a co-sputtering method. At this time, a ruthenium target and a titanium target exist in a same chamber, and an alloy film is deposited by simultaneous sputtering. At this time, power applied to the ruthenium target is set to 150 W and power applied to the titanium target is set to 50 W, so as to make a content ratio of ruthenium in the "alloy of ruthenium and titanium" 75 atm %. Further, an upper second electrode 711 is formed on the lower second electrode 710. Titanium nitride is formed as the upper second electrode 711 with a film thickness of 25 nm by a reactive sputtering method. At this time, power applied to a titanium target is set to 600 W, and a nitrogen gas and an argon gas are introduced into a chamber for sputtering. At this time, a ratio between a flow rate of nitrogen and a flow rate of argon is set to 1:1 so as to make a ratio of titanium in the titanium nitride 70 atm %.

(Step 8)

As illustrated in FIG. 16(d), a hard mask film 712 (such as a silicon nitride film or a silicon carbonitride film with a film thickness of 30 nm) and a hard mask film 713 (such as a silicon oxide film with a film thickness of 80 nm) are laminated on the upper second electrode 711 in this order. The hard mask film 712 and the hard mask film 713 may be formed by use of a plasma-enhanced CVD method. The hard mask films 712 and 713 may be formed by use of a common plasma-enhanced CVD method in the relevant technological field. Further, it is preferable that the hard mask film 712 and the hard mask film 713 be different types of films, and, for example, the hard mask film 712 may be a silicon nitride film, and the hard mask film 713 may be a silicon oxide film. At this time, it is preferable that the hard mask film 712 is of the same material as a protective insulating film 714, to be described later, and the barrier insulating film 707. In other words, by surrounding an entire periphery of the three-terminal switch with a same material to integrate a material interface, ingress of moisture from outside can be prevented, and separation of a constituent element of the three-terminal switch itself can be prevented. Further, while the hard mask film 712 may be formed by a plasma-enhanced CVD method, it is preferable to use a high-density silicon nitride film formed with, for example, high-density plasma of a mixed gas of $SiH_4/N_2$.

(Step 9)

Figure 17:
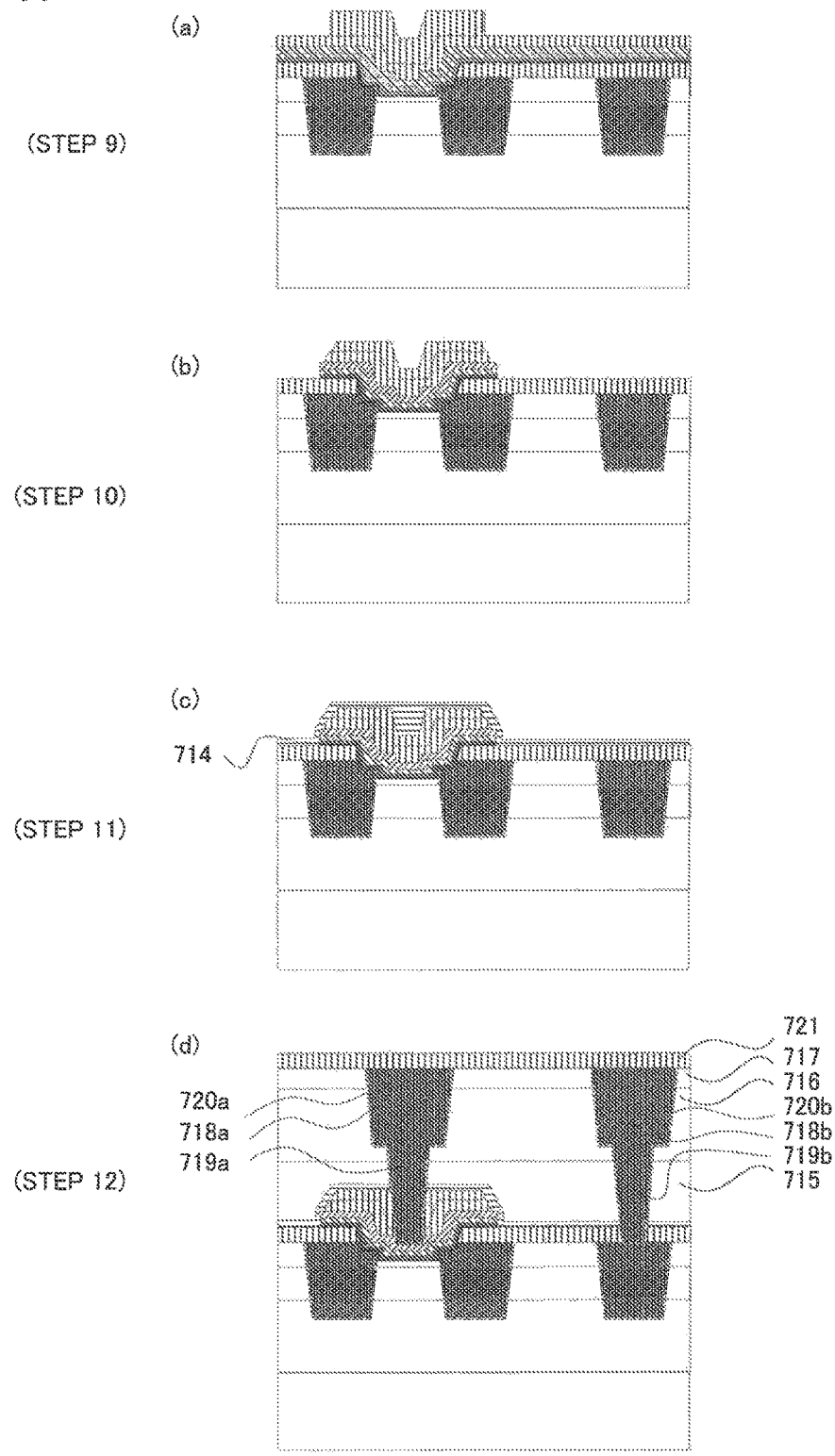
FIGS. 17(a) to 17(d) are schematic cross-sectional views illustrating a manufacturing process of the three-terminal switching element as an example of the manufacturing method of the semiconductor device according to the third exemplary embodiment of the present invention.

As illustrated in FIG. 17(a), a photoresist (unillustrated) for patterning a "three-terminal switch" part is formed on the hard mask film 713, and then, using the photoresist as a mask, the hard mask film 713 is dry etched until the hard mask film 712 appears. Then, the photoresist is removed by use of oxygen plasma ashing and organic stripping.

(Step 10)

As illustrated in FIG. 17(b), the hard mask film 712, the upper second electrode 711, the lower second electrode 710, and the ion conduction layer 709 are continuously dry etched using the hard mask film 713 as a mask. At this time, while it is preferable that the hard mask film 713 is completely removed during the etch back, it may remain intact. For example, when the upper second electrode 711 is of titanium nitride, $Cl_2$-based Reactive Ion Etching (RIE) processing can be performed, and, when the lower second electrode 710 is of an alloy of ruthenium and titanium, RIE processing with a mixed gas of $Cl_2/O_2$ can be performed. Further, in the etching of the ion conduction layer 709, it is required to stop dry etching on the barrier insulating film 707 being a lower surface. When the ion conduction layer 709 is an SiOCH-based polymer film containing silicon, oxygen, carbon, and hydrogen, and the barrier insulating film 707 is a silicon nitride film or a silicon carbonitride film, RIE processing can be performed by adjusting an etching condition with a mixed gas such as $CF_4$-based, $CF_4/Cl_2$-based, and $CF_4/Cl_2$/Ar-based. By use of such a hard mask RIE method, a variable resistance element part can be processed without exposing the variable resistance element part to oxygen plasma ashing for resist removal. Further, when oxidation treatment is performed with oxygen plasma after the processing, the oxidation plasma treatment can be irradiated without depending on a resist stripping time.

(Step 11)

As illustrated in FIG. 17(c), the protective insulating film 714 (such as a silicon nitride film or a silicon carbonitride film with a film thickness of 20 nm) is deposited on the barrier insulating film 707 including the hard mask film 712, the upper second electrode 711, the lower second electrode 710, and the ion conduction layer 709. While the protective insulating film 714 may be formed by a plasma-enhanced CVD method, a reaction chamber needs to be maintained at reduced pressure before film-forming, and, at this time, a problem occurs that oxygen separates from a side surface of the ion conduction layer 709, and leak current of the ion conduction layer increases. In order to suppress the problem, it is preferable that a film-forming temperature of the protective insulating film 714 be 300° C. or lower. Additionally, exposure to a film-forming gas at reduced pressure occurs before the film-forming, therefore it is preferable that a reducing gas be not used. For example, it is preferable to use a silicon nitride film formed with high-density plasma of a mixed gas of $SiH_4/N_2$ at a substrate temperature of 300° C.

(Step 12)

As illustrated in FIG. 17(d), an interlayer insulating film 715 (such as a silicon oxide film), a low-dielectric-constant film having a low relative dielectric constant (such as an SiOCH film with a film thickness of 150 nm) as a Low-k insulating film 716, and an interlayer insulating film 717 (such as a silicon oxide film) are deposited on the protective insulating film 714 in this order. Then, wiring grooves for a second wiring A 718a and a second wiring B 718b, and prepared holes for a via A 719a and a via B 719b are formed. Furthermore, by use of a copper dual-damascene wiring process, the second wiring A 718a and the second wiring B 718b (such as copper), and the via A 719a and the via B 719b (such as copper) are simultaneously formed in the wiring grooves and the prepared holes through a second barrier metal A 720a and a second barrier metal B 720b (such as tantalum nitride/tantalum), respectively. Then, a barrier insulating film 721 (such as a silicon nitride film) is deposited on the interlayer insulating film 717 including the second wiring A 718a and the second wiring B 718b. A process similar to the formation of the lower-layer wiring may be used for the formation of the second wiring A 718a and the second wiring B 718b. At this time, by making a material of the second barrier metal A 720a same as the upper second electrode 711, contact resistance between the second barrier metal A 720a and the upper second electrode 711 can be reduced, and element performance can be enhanced. The interlayer insulating film 715, the Low-k insulating film 716, and the interlayer insulating film 717 may be formed by a plasma-enhanced CVD method. In order to clear a level difference formed by the "three-terminal switch," the interlayer insulating film 715 may be thickly deposited and planarized by a CMP method, so as to be set to a desired film thickness. The via A 719a and the via B 719b are formed by patterning by exposure with a same photomask and simultaneous etching. The upper second electrode 711 is exposed to etching correspondingly to a height difference between the via A 719a and the via B 719b, and is dug down in a depth direction.

(Mode 3)

Figure 18:
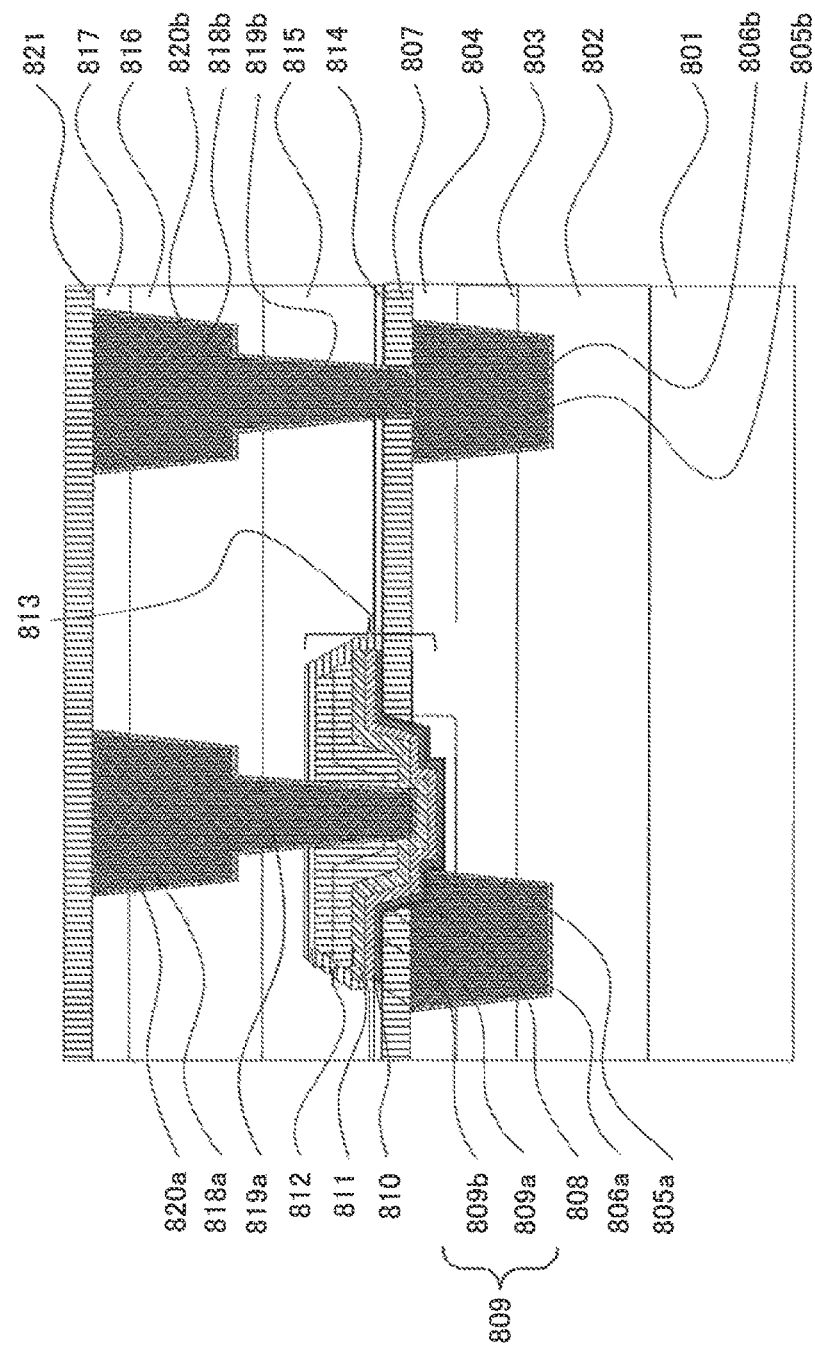
FIG. 18 is a schematic cross-sectional view illustrating another configuration example of a two-terminal switching element as a semiconductor device according to the third exemplary embodiment of the present invention.

As Mode 3 according to the present exemplary embodiment, another configuration example of "a three-terminal switch or a two-terminal switch formed inside a multi-layered wiring layer" will be described. FIG. 18 is a cross-sectional view schematically illustrating a configuration example of a switching element employing a "two-terminal switch formed inside a multi-layered wiring layer" according to the third exemplary embodiment. The example is a semiconductor device including a two-terminal switch 813 inside a multi-layered wiring layer on a semiconductor substrate 801.

The multi-layered wiring layer includes an insulating laminated body in which an interlayer insulating film 802, a Low-k insulating film 803, an interlayer insulating film 804, a barrier insulating film 807, a protective insulating film 814, an interlayer insulating film 815, a Low-k insulating film 816, an interlayer insulating film 817, and a barrier insulating film 821 are laminated on the semiconductor substrate 801 in this order. In the multi-layered wiring layer, a first wiring A 805a and a first wiring B 805b are embedded in wiring grooves formed in the interlayer insulating film 804 and the Low-k insulating film 803 through a first barrier metal A 806a and a first barrier metal B 806b, respectively. In the multi-layered wiring layer, a second wiring A 818a and a second wiring B 818b are embedded in wiring grooves formed in the interlayer insulating film 817 and the Low-k insulating film 816. Additionally, a via A 819a and a via B 819b are embedded in prepared holes formed in the interlayer insulating film 815, the protective insulating film 814, and a hard mask film 812. Additionally, the second wiring A 818a and the via A 819a, and the second wiring B 818b and the via B 819b, are respectively integrated. Additionally, side surfaces and bottom surfaces of the second wiring A 818a and the via A 819a, and the second wiring B 818b and the via B 819b are respectively covered by a second barrier metal A 820a and a second barrier metal B 820b. In the multi-layered wiring layer, at an opening formed on the barrier insulating film 807, the two-terminal switch 813, in which an ion conduction layer 809, a lower second electrode 810, and an upper second electrode 811 are laminated in this order, is formed on the first wiring A 805a as a first electrode, the interlayer insulating film 804 in contact with the first barrier metal A 806a on a side surface of the first wiring A 805a, part of side surfaces of the first barrier metal A 806a and the first barrier metal B 806b, a wall surface of the opening of the barrier insulating film 807, and the barrier insulating film 807. The hard mask film 812 is formed on the upper second electrode 811, and an upper surface and a side surface of a laminated body including the ion conduction layer 809, the lower second electrode 810, the upper second electrode 811, and the hard mask film 812 are covered by the protective insulating film 814. By making part of the first wiring A 805a as a lower electrode of the "two-terminal switch" 813, electrode resistance can be reduced while simplifying a number of steps. By merely creating at least a 2PR mask set as an additional step to a common copper damascene wiring process, the "two-terminal switch" 813 can be integrated, and reduction in resistance and a cost of the element can be concurrently achieved.

In the "two-terminal switch" 813, a first ion conduction layer 809a is in direct contact with the first wiring A 805a in an opening region formed on the barrier insulating film 807, and a metal constituting the first ion conduction layer 809a diffuses into the first wiring A 805a to form an alloy layer at an interface. In the "two-terminal switch" 813, the via A 819a and the upper second electrode 811 are electrically connected through the second barrier metal A 820a, on the upper second electrode 811. The "two-terminal switch" 813 is controlled in ON or OFF state by applying voltage or passing current. The switch is controlled in ON or OFF state by, for example, utilizing electric field diffusion of a metal ion supplied from a metal forming the first wiring A 805a, into the first ion conduction layer 809a and a second ion conduction layer 809b.

As illustrated in FIG. 18, in the opening region formed on the barrier insulating film 807, the first wiring A 805a includes a recess part 808 formed by digging down in a depth direction. In FIG. 18, the interlayer insulating film 804 in contact with the first wiring A 805a is also dug down. The recess part of the interlayer insulating film 804 is lower in a depth direction than the height of the recess part 808 of the first wiring A 805a. In other words, in the opening region of the barrier insulating film 807, a region with two different stages of height is formed in the ion conduction layer 809. The first ion conduction layer 809a is in contact with an upper surface and a side surface of the first wiring A 805a (first barrier metal A 806a) at the recess part 808. Further, the via B 819b is in contact with the first wiring B 805b through the second barrier metal B 820b, without intervening the two-terminal switch 813 between the first wiring B 805b and the via B 819b.

The two-terminal switch 813 is arranged down in a depth direction correspondingly to the recess part 808. Thus, a height of the via A 819a in contact with the upper second electrode 811 through the second barrier metal A 820a, and a height of the via B 819b in contact with the first wiring B 805b through the second barrier metal B 820b, can be nearly equalized. At this time, the via A 819a is connected to the upper second electrode 811 immediately above the interlayer insulating film 804 in contact with the side surface of the first wiring A 805a, being most deeply dug down in the recess part 808. Accordingly, when the via A 819a and the via B 819b are exposed by use of a same photomask and formed by plasma etching simultaneously, plasma damage in the two-terminal switch 813 is reduced to an amount corresponding to the height difference between the via A 819a and the via B 819b, and degradation in element performance of the two-terminal switch 813 can be suppressed.

The semiconductor substrate 801 is a substrate on which a semiconductor element is formed. A substrate such as a silicon substrate, a single-crystal substrate, a silicon-on-insulator (SOI) substrate, a thin-film transistor (TFT) substrate, and a substrate for manufacturing a liquid crystal display (LCD) may be used as the semiconductor substrate 801.

The interlayer insulating film 802 is an insulating film formed on the semiconductor substrate 801. For example, a silicon oxide film, an SiOC film, or the like may be used as the interlayer insulating film 802. The interlayer insulating film 802 may be a laminate of a plurality of insulating films.

The Low-k insulating film 803 is an insulating film having a low relative dielectric constant, arranged between the interlayer insulating films 802 and 804, and a low-dielectric-constant film (such as an SiOCH film) having a relative dielectric constant lower than a silicon oxide film, or the like is used. Wiring grooves for embedding the first wiring A 805a and the first wiring B 805b are formed in the Low-k insulating film 803, and the first wiring A 805a and the first wiring B 805b are embedded in the wiring grooves through the first barrier metal A 806a and the first barrier metal B 806b, respectively.

The interlayer insulating film 804 is an insulating film formed on the Low-k insulating film 803. For example, a silicon oxide film, an SiOC film, or the like may be used as the interlayer insulating film 804. The interlayer insulating film 804 may be a laminate of a plurality of insulating films. Wiring grooves for embedding the first wiring A 805a and the first wiring B 805b are formed in the interlayer insulating film 804, and the first wiring A 805a and the first wiring B 805b are embedded in the wiring grooves through the first barrier metal A 806a and the first barrier metal B 806b, respectively.

The interlayer insulating film 804 in contact with the side surface of the first wiring A 805a is dug down upon forming the recess part 808, and is dug down lower in a depth direction than the recess part 808 of the first wiring A 805a.

The first wiring A 805a is a wiring embedded in the wiring groove formed in the interlayer insulating film 804 and the Low-k insulating film 803 through the first barrier metal A 806a. The first wiring A 805a also serves as the lower electrode of the two-terminal switch 813, and is in direct contact with the first ion conduction layer 809a. An upper surface of the first ion conduction layer 809a is in direct contact with the second ion conduction layer 809b, and an upper surface of the second ion conduction layer 809b is in direct contact with the lower second electrode 810. A metal capable of diffusion and ionic conduction in the ion conduction layer 809, such as copper, may be used as a metal constituting the first wiring A 805a. The metal constituting the first wiring A 805a (such as copper) may be alloyed with aluminum. The first wiring A 805a includes the recess part 808 formed by digging down in a depth direction at the opening surface of the barrier insulating film 807. The first wiring A 805a is in contact with the first ion conduction layer 809a at the recess part 808. An alloy layer with a metal constituting the first ion conduction layer 809a, to be described later, is formed at an interface between the recess part 808 and the first ion conduction layer 809a. The alloy layer is not formed throughout the first wiring A 805a, but is formed only at the opening surface of the barrier insulating film 807. The two-terminal switch 813 is arranged down in a depth direction correspondingly to the recess part of the interlayer insulating film 804 in contact with the side surface of the first wiring A 805a. Thus, a difference between a height of the via A 819a in contact with the upper second electrode 811 through the second barrier metal A 820a, and a height of the via B 819b in contact with the first wiring B 805b through the second barrier metal B 820b, can be nearly eliminated. Accordingly, when the via A 819a and the via B 819b are exposed by use of a same photomask and formed by plasma etching simultaneously, plasma damage in the two-terminal switch 813 is reduced to an amount corresponding to the height difference between the via A 819a and the via B 819b, and degradation in element performance of the two-terminal switch 813 can be suppressed. Formation of the recess part 808 is performed after forming the opening surface of the barrier insulating film 807 in contact with the first wiring A 805a, by applying onto the substrate including the first wiring A 805a and the interlayer insulating film 804, in a dry etching apparatus, plasma using a halogen gas, an inert gas, or a fluorocarbon-based gas, or a mixed gas thereof. At this time, while the barrier insulating film 807 is also etched, the first wiring B 805b not forming the two-terminal switch 813 is not exposed to the plasma, and is not dug down.

The first wiring B 805b is a wiring embedded in the wiring groove formed in the interlayer insulating film 804 and the Low-k insulating film 803 through the first barrier metal B 806b. The first wiring B 805b is in direct contact with the via B 819b at the opening of the barrier insulating film 807 through the second barrier metal B 820b.

The first barrier metal A 806a and the first barrier metal B 806b are conductive films having a barrier property, covering side surfaces and bottom surfaces of the wirings, in order to prevent the metal forming the first wiring A 805a and the first wiring B 805b from diffusing into the interlayer insulating film 804 and a lower layer. When, for example, the first wiring A 805a and the first wiring B 805b are composed of a metal element with copper being a main component, a refractory metal or a nitride thereof such as tantalum, tantalum nitride, titanium nitride, and tungsten carbonitride, or a laminated film thereof may be used as the first barrier metal A 806a and the first barrier metal B 806b.

The barrier insulating film 807 is formed on the interlayer insulating film 804 including the first wiring A 805a and the first wiring B 805b, and has a role in preventing oxidation of the metal forming the first wiring A 805a and the first wiring B 805b (such as copper). Further, the barrier insulating film 807 has a role in preventing the metal forming the first wiring A 805a and the first wiring B 805b from diffusing into the interlayer insulating film 815, and a role as an etching stopper layer upon processing of the upper second electrode 811, the lower second electrode 810, and the ion conduction layer 809. For example, an SiC film, a silicon carbonitride film, a silicon nitride film, or a laminated structure thereof may be used as the barrier insulating film 807. It is preferable that the barrier insulating film 807 be of the same material as the protective insulating film 814 and the hard mask film 812.

The first ion conduction layer 809a and the second ion conduction layer 809b are films with variable resistance. A material varying resistance by an action (such as diffusion and ion conduction) of a metal ion generated from the metal forming the first wiring A 805a (lower electrode) may be used. When resistance change of the "two-terminal switch" 813 accompanying switching to an "ON" state is performed by precipitation of metal due to reduction of a metal ion, an ion-conductible film is used.

The second ion conduction layer 809b is formed by use of a plasma-enhanced CVD method. Raw materials of cyclic organosiloxane and helium being a carrier gas are introduced into a reaction chamber, and, when supply of the two is stabilized and pressure in the reaction chamber becomes constant, application of RF power is started. A supply amount of the raw materials is set to 10 to 200 sccm, and a supply amount of helium is set to 500 sccm through a raw material vaporizer. The thus formed second ion conduction layer 809b is a porous polymer having silicon, oxygen, and carbon as main components, and, for example, has a relative dielectric constant greater than or equal to 2.1 and less than or equal to 3.0.

The first ion conduction layer 809a has a role in preventing the metal forming the first wiring A 805a from diffusing into the second ion conduction layer 809b due to heating and plasma during deposition of the second ion conduction layer 809b. Further, the first ion conduction layer 809a has a role in preventing the first wiring A 805a from being oxidized and becoming more likely to diffuse into the second ion conduction layer 809b. A metal forming the first ion conduction layer 809a, such as zirconium, hafnium, aluminum, and titanium, is exposed to an oxygen atmosphere in a deposition chamber for the second ion conduction layer 809b at reduced pressure, after film formation of the metal constituting the first ion conduction layer 809a. The metal exposed to the oxygen atmosphere turns to zirconium oxide, hafnium oxide, aluminum oxide, or titanium oxide, and becomes part of the ion conduction layer 809. An optimum film thickness of the metal film forming the first ion conduction layer 809a is 0.5 to 1 nm. The metal film used for forming the first ion conduction layer 809a may form a laminate or may be a single layer. It is preferable that formation of the first ion conduction layer 809a be performed by sputtering. A metal atom or ion gaining energy by sputtering rushes and diffuses into the first wiring A 805a to form an alloy layer.

The ion conduction layer 809 is formed on the first wiring A 805a, the recess part 808 of the first wiring A 805a, the interlayer insulating film 804 in contact with a the side surface of the first wiring A 805a, a tapered surface of the recess part formed at the opening of the barrier insulating film 807, a tapered surface of the barrier insulating film 807, and the barrier insulating film 807. In the ion conduction layer 809, an outer periphery of a connecting part of the first wiring A 805a and the ion conduction layer 809 is arranged at least along the tapered surface of the recess part 808 and a tapered surface of the opening of the barrier insulating film 807, the interlayer insulating film 804 in contact with the side surface of the first wiring A 805a, and the side surface of the first barrier metal A 806a in contact with the first wiring A 805a.

The lower second electrode 810 is an electrode on the lower layer side of an upper electrode of the "two-terminal switch" 813, and is in direct contact with the second ion conduction layer 809b. An alloy containing ruthenium, and titanium, tantalum, zirconium, hafnium, aluminum, or the like, having good adhesion with the metal forming the first wiring A 805a, is used for the lower second electrode 810. Ruthenium is a metal more resistant to ionization than the metal forming the first wiring A 805a, and is resistant to diffusion and ionic conduction in the second ion conduction layer 809b.

In a ruthenium alloy used in formation of the lower second electrode 810, it is desirable to select, as a first metal to be added to ruthenium, an added metal having a standard Gibbs energy of formation of a process of generating a metal ion from the metal (oxidation process) greater than ruthenium in a negative direction. Titanium, tantalum, zirconium, hafnium, and aluminum, each having a standard Gibbs energy of formation of a process of generating a metal ion from the metal (oxidation process) greater than ruthenium in a negative direction, exhibit stronger likelihood of spontaneously generating a chemical reaction compared with ruthenium, and therefore have high reactivity. Consequently, in the ruthenium alloy forming the lower second electrode 810, adhesion with a metal bridge formed by the metal forming the first wiring A 805a is enhanced by alloying with ruthenium. By contrast, when the lower second electrode 810 is composed of only an added metal such as titanium, tantalum, zirconium, hafnium, and aluminum, without ruthenium, reactivity becomes so high that transition to an "OFF" state does not occur. The transition from an "ON" state to an "OFF" state progresses by an oxidation reaction (dissolution reaction) of the metal bridge. When a metal having a standard Gibbs energy of formation of a process of generating a metal ion from the metal (oxidation process) greater than the metal forming the first wiring A 805a in a negative direction is used as a metal constituting the lower second electrode 810, transition to an "OFF" state is not likely to occur. The reason is that an oxidation reaction of the lower second electrode 810 progresses ahead of an oxidation reaction of the metal bridge formed by the metal forming the first wiring A 805a. Accordingly, a metal material used for formation of the lower second electrode 810 needs to be alloyed with ruthenium having a standard Gibbs energy of formation of a process of generating a metal ion from the metal (oxidation process) less in a negative direction than copper. Furthermore, when copper being a component of the metal bridge is mixed into the lower second electrode 810, an effect of adding a metal having a large standard Gibbs energy in a negative direction is diminished, and therefore it is preferable that a metal added to ruthenium be a material having a barrier property with respect to copper and a copper ion. For example, tantalum, titanium, or the like may be used. Meanwhile, it is known that a greater amount of an added metal stabilizes an "ON" state accordingly, and it is also known that an addition of 5 atm % enhances the stability. When an added metal is titanium, in particular, excellent transition to an "OFF" state and excellent stability of an "ON" state are exhibited, and it is particularly preferable that the lower second electrode 810 be composed of an alloy of ruthenium and titanium, and a content ratio of titanium be in a range of 20 atm % to 30 atm %. It is desirable that a content ratio of ruthenium in the ruthenium alloy be greater than or equal to 60 atm % and less than or equal to 90 atm %.

It is desirable to use a sputtering method for forming the lower second electrode 810. When forming an alloy by use of a sputtering method, a method of using an alloy target of ruthenium and a first metal, a co-sputtering method of sputtering a ruthenium target and a first metal target simultaneously in a same chamber, and an intermixing method of forming a thin film of a first metal in advance, performing film-forming of ruthenium thereon by use of a sputtering method, and performing alloying by energy of colliding atoms, are available. By use of the co-sputtering method and the intermixing method, composition of an alloy can be changed. When the intermixing method is adopted, it is preferable that heat treatment at 400° C. or lower be applied for "flattening" of a mixed state, after film-forming of ruthenium is completed.

The upper second electrode 811 is an electrode on the upper layer side of the upper electrode of the "two-terminal switch" 813, and is formed on the lower second electrode 810. The upper second electrode 811 has a role in protecting the lower second electrode 810. Specifically, by the upper second electrode 811 protecting the lower second electrode 810, damage to the lower second electrode 810 in a process can be suppressed, and a switching characteristic of the "two-terminal switch" 813 can be maintained. For example, tantalum, titanium, tungsten, a nitride thereof, or the like may be used for the upper second electrode 811. Further, when electrically connecting the via A 819a on the lower second electrode 810, the upper second electrode 811 also functions as an etching stopper layer. Accordingly, it is preferable that an etching rate of the electrode be low with respect to plasma of a fluorocarbon-based gas used for etching the interlayer insulating film 815.

The upper second electrode 811 is composed of a metal nitride. A nitride of titanium, tantalum, zirconium, hafnium, or aluminum, functioning as an etching stopper layer and having conductivity, is particularly preferable. When a metal not being a nitride is used for the upper second electrode 811, defects may be generated in the lower second electrode 810 by part of the metal diffusing into the lower second electrode 810 due to heating and plasma damage during the process. Starting from the defects, a dielectric breakdown voltage of the ion conduction layer 809 may be decreased. By using a metal nitride being a stable compound having electrical conductivity for the upper second electrode 811, diffusion of the metal into the lower second electrode 810 can be prevented. It is particularly preferable that a metal in a metal nitride constituting the upper second electrode 811 and an added metal forming an alloy with ruthenium constituting the lower second electrode 810 be a same metal. Consequently, diffusion failure of the metal forming the alloy with ruthenium can be more efficiently prevented. For example, when the lower second electrode 810 is an alloy electrode of ruthenium and titanium, it is preferable that the upper second electrode 811 be a titanium nitride electrode. Alternatively, when the lower second electrode 810 is an alloy of ruthenium and tantalum, the upper second electrode 811 should be a tantalum nitride electrode. By matching metal components constituting the lower second electrode 810 and the upper second electrode 811, even in case that the metal in the upper second electrode 811 diffuses into the lower second electrode 810, defects are less likely to form. At this time, a ratio of metal to nitrogen in the nitride constituting the upper second electrode 811 is set to be greater than a ratio of metal to ruthenium in the ruthenium alloy constituting the lower second electrode 810. By thus setting the ratio high, diffusion of the metal constituting the lower second electrode 810 into the nitride constituting the upper second electrode 811, causing change in composition of the ruthenium alloy constituting the lower second electrode 810, can be prevented. Specifically, it is more preferable that a content ratio of titanium be greater than or equal to 60 atm % and less than or equal to 80 atm %.

It is desirable to use a sputtering method for forming the upper second electrode 811. When film-forming a metal nitride by use of a sputtering method, it is preferable to use a reactive sputtering method of vaporizing a metal target by use of plasma of a mixed gas of nitrogen and argon. A metal vaporized from the metal target reacts with nitrogen to turn to a metal nitride, and then film-formed on a substrate.

As a more preferable forming method of the upper second electrode 811, it is preferable to use co-sputtering using two electrodes being a ruthenium target electrode and a target electrode composed of a first metal. When an alloy target composed of ruthenium and the first metal is used, composition in continuous use causes deviation due to difference in sputtering yield of each material, and therefore composition of the film to be formed cannot be closely controlled. By contrast, the co-sputtering method is able to precisely control composition of the film to be formed, by individually setting power applied to each target electrode. It is highly effective to use titanium or tantalum, in particular, as the first metal.

The two-terminal switch 813 can be arranged down in a depth direction by forming the recess part 808 on the first wiring A 805a, and forming the recess part on the interlayer insulating film 804 in contact with the side surface of the first wiring A 805a. Accordingly, a time in which the upper second electrode 811 is exposed to etching plasma using a fluorine gas, a rare gas, an inert gas, or a mixed gas thereof, used in forming of the via A 819a, can be reduced. Consequently, a film thickness of the upper second electrode 811 etched by the etching gas is reduced, and accumulation of plasma damage in the ion conduction layer 809 can be prevented. Accumulation of plasma damage in the ion conduction layer 809 causes the metal constituting the first wiring A 805a to become more likely to diffuse into the ion conduction layer 809, causes the ion conduction layer 809 to increase defects due to damage by charge-up, and consequently leads to increase in leak current of the two-terminal switch 813 and progression of characteristic variation and reliability degradation.

The via A 819a may be connected to the upper second electrode 811 immediately above the recess part 808 of the first wiring A 805a instead of being connected to the upper second electrode 811 immediately above the interlayer insulating film 804 in contact with the side surface of the first wiring A 805a. However, in this case, the height difference between the via A 819a and the via B 819b becomes greater compared with the case of being connected to the upper second electrode 811 immediately above the interlayer insulating film 804 in contact with the side surface of the first wiring A 805a.

The hard mask film 812 is a film being a hard mask film and passivation film in etching the upper second electrode 811, the lower second electrode 810, and the first ion conduction layer 809a and the second ion conduction layer 809b. For example, a silicon nitride film, a silicon oxide film, or the like, or a laminated film thereof may be used as the hard mask film 812. It is preferable that the hard mask film 812 contain the same material as the protective insulating film 814 and the barrier insulating film 807. Specifically, by surrounding a whole periphery of the "two-terminal switch" 813 with a same material, a material interface is integrated so that ingress of moisture and the like from outside can be prevented, and separation of a constituent element of the "two-terminal switch" 813 itself can be prevented.

The protective insulating film 814 is an insulating film having a function of further preventing separation of oxygen from the second ion conduction layer 809b without damaging the "two-terminal switch" 813. For example, a silicon nitride film, a silicon carbonitride film, and the like may be used as the protective insulating film 814. It is preferable that the protective insulating film 814 be of the same material as the hard mask film 812 and the barrier insulating film 807. When the same material is used, the protective insulating film 814 is integrated with the barrier insulating film 807 and the hard mask film 812 to enhance interface adhesion, enabling enhanced protection of the "two-terminal switch" 813.

The interlayer insulating film 815 is an insulating film formed on the protective insulating film 814. For example, a silicon oxide film, an SiOC film, or the like may be used as the interlayer insulating film 815. The interlayer insulating film 815 may be a laminate of a plurality of insulating films. The interlayer insulating film 815 may be of the same material as the interlayer insulating film 817. In the interlayer insulating film 815, prepared holes for embedding the via A 819a and the via B 819b are formed, and the via A 819a and the via B 819b are embedded in the prepared holes through the second barrier metal A 820a and the second barrier metal B 820b, respectively.

The Low-k insulating film 816 is an insulating film having a low relative dielectric constant, arranged between the interlayer insulating films 815 and 817, and a low-dielectric-constant film having a lower relative dielectric constant than a silicon oxide film (such as an SiOCH film) is used. In the Low-k insulating film 816, wiring grooves for embedding the second wiring A 818a and the second wiring B 818b are formed, and the second wiring A 818a and the second wiring B 818b are embedded in the wiring grooves through the second barrier metal A 820a and the second barrier metal B 820b, respectively.

The interlayer insulating film 817 is an insulating film formed on the Low-k insulating film 816. For example, a silicon oxide film, an SiOC film, a low-dielectric-constant film having a lower relative dielectric constant than a silicon oxide film (such as an SiOCH film), or the like may be used as the interlayer insulating film 817. The interlayer insulating film 817 may be a laminate of a plurality of insulating films. The interlayer insulating film 817 may be of the same material as the interlayer insulating film 815. In the interlayer insulating film 817, wiring grooves for embedding the second wiring A 818a and the second wiring B 818b are formed, and the second wiring A 818a and the second wiring B 818b are embedded in the wiring grooves through the second barrier metal A 820a and the second barrier metal B 820b, respectively.

The second wiring A 818a and the second wiring B 818b are wirings embedded in the wiring grooves formed in the interlayer insulating film 817 and the Low-k insulating film 816, through the second barrier metal A 820a and the second barrier metal B 820b, respectively. The second wiring A 818a and the second wiring B 818b are respectively integrated with the via A 819a and the via B 819b. The via A 819a and the via B 819b are embedded in prepared holes formed in the interlayer insulating film 815, the protective insulating film 814, and, in the case of the via A 819a, the hard mask film 812, through the second barrier metal A 820a and the second barrier metal B 820b, respectively. The via A 819a is electrically connected to the upper second electrode 811 through the second barrier metal A 820a. For example, copper may be used for the second wiring A 818a and the second wiring B 818b, and the via A 819a and the via B 819b.

The second barrier metal A 820a and the second barrier metal B 820b are conductive films having a barrier property, covering the side surfaces and the bottom surfaces of the second wiring A 818a and the second wiring B 818b, and the via A 819a and the via B 819b. The covering prevents the metal forming the second wiring A 818a and the second wiring B 818b (including the via A 819a and the via B 819b) from diffusing into the interlayer insulating films 815 and 817, and a lower layer. When, for example, the second wiring A 818a and the second wiring B 818b, and the via A 819a and the via B 819b are composed of a metal element with copper being a main component, a refractory metal or a nitride thereof, such as tantalum, tantalum nitride, titanium nitride, and tungsten carbonitride, or a laminated film thereof may be used as the second barrier metal A 820a and the second barrier metal B 820b. It is preferable that the second barrier metal A 820a and the second barrier metal B 820b be of the same material as the upper second electrode 811. For example, when the second barrier metal A 820a and the second barrier metal B 820b have a laminated structure of tantalum nitride (lower layer)/tantalum (upper layer), it is preferable to use tantalum nitride being the lower layer material for the upper second electrode 811.

The barrier insulating film 821 is an insulating film formed on the interlayer insulating film 817 including the second wiring A 818a and the second wiring B 818b, and has a role in preventing oxidation of the metal forming the second wiring A 818a and the second wiring B 818b (such as copper). Further, the barrier insulating film 821 is an insulating film having a role in preventing the metal forming the second wiring A 818a and the second wiring B 818b from diffusing into an upper layer. For example, a silicon carbonitride film, a silicon nitride film, a laminated structure thereof, or the like may be used as the barrier insulating film 821.

SUMMARY OF EXEMPLARY EMBODIMENTS

The aforementioned exemplary embodiments of the present invention may be summarized as follows. The exemplary embodiments of the present invention are able to provide a variable resistance element capable of easy scaling, and suppression of degradation in element performance and reliability performance due to a plasma process. Therefore, when the switch is applied to a wiring selector switch in a programmable logic device, enhanced functionality and cost reduction can be concurrently achieved.

When forming an opening on a barrier insulating film on a wiring layer for forming the variable resistance element according to the exemplary embodiments of the present invention, a copper wiring exposed from the opening surface is etched, and an interface between an ion conduction layer and the wiring layer of the variable resistance element is lowered below an upper surface of the wiring, that is, an interface with the barrier insulating film. Furthermore, the element formed on the etched copper wiring has a configuration in which a via from an upper-layer wiring is connected to an upper part of the area closest to a semiconductor substrate. Consequently, by decrease in height difference between the via connecting to the variable resistance element and a via connecting to the copper wiring, plasma damage to the element is reduced, and performance degradation of the variable resistance element can be suppressed.

In a plasma process, when a charged particle, such as an ionized gas molecule and atom, and an electron, is injected onto a variable resistance layer of the variable resistance element, charge-up of the variable resistance layer occurs. Insulation performance of the variable resistance layer is degraded by destruction of binding of molecules constituting the variable resistance layer due to application of an electric field. Consequently, performance of the variable resistance element, such as leak current, switching voltage variation, repetition strength, retention, degrades. By use of the respective exemplary embodiments of the present invention, performance degradation of the variable resistance element accompanying the plasma process can be suppressed.

Further, in scaling (proportional reduction) of a semiconductor device in which variable resistance elements are integrated in a wiring, reduction in a vertical direction is required in addition to a horizontal direction. When forming the variable resistance element in the wiring, scaling in a vertical direction is hindered correspondingly to a laminated film constituting the element. By use of the respective exemplary embodiments of the present invention, part of a copper-wiring-forming region can be used as a laminated-film-forming region of the variable resistance element, and therefore a height of the element in a vertical direction can be controlled to facilitate scaling.

While the preferred exemplary embodiments and modes of the present invention have been described above, the present invention is not limited thereto. It goes without saying that various modifications may be made within the scope of the invention described in CLAIMS and such modifications are also included in the scope of the present invention. For example, it may be considered to apply the present invention to a circuit configuration in which two variable resistance elements are connected in serial by connecting active electrodes thereof or inactive electrodes thereof. Specifically, it may be considered to apply the present invention to a variable resistance element and a semiconductor device having a configuration in which an ion conduction layer is in contact with one or more lower electrodes through a plurality of openings on a barrier insulating film, as illustrated in FIGS. 9 and 10 in Patent Literature 5. More specifically, recess parts may be respectively formed on surfaces of one or more lower electrodes exposed from the aforementioned plurality of openings on the barrier insulating film, and an ion conduction layer may be formed so as to be at least in contact with a recess part on a surface of a lower electrode.

The aforementioned exemplary embodiments may also be described in part or in whole as the following Supplementary Notes, but are not limited thereto.

(Supplementary Note 1) A variable resistance element including a configuration in which an ion conduction layer is arranged between an upper electrode and a lower electrode, wherein a recess part is formed on a surface of the lower electrode of the variable resistance element, and the ion conduction layer is formed in contact with at least the recess part on a surface of the lower electrode.

(Supplementary Note 2) The variable resistance element according to Supplementary Note 1, wherein the recess part is formed on a central part of a surface of the lower electrode.

(Supplementary Note 3) The variable resistance element according to Supplementary Note 1, wherein the recess part is formed at least on a peripheral part of a surface of the lower electrode.

(Supplementary Note 4) A semiconductor device including a variable resistance element inside a multi-layered wiring layer on a semiconductor substrate, wherein the variable resistance element includes a configuration in which an ion conduction layer is arranged between an upper electrode and a lower electrode, a recess part is formed on a surface of the lower electrode of the variable resistance element, and the ion conduction layer is formed in contact with at least the recess part on a surface of the lower electrode.

(Supplementary Note 5) The semiconductor device according to Supplementary Note 4, wherein the multi-layered wiring layer includes a plug electrically connected to the upper electrode, and the plug is electrically connected to the upper electrode above the recess part of the lower electrode.

(Supplementary Note 6) The semiconductor device according to Supplementary Note 4 or 5, further including a barrier insulating film arranged between the lower electrode and the ion conduction layer, the barrier insulating film including an opening located at the recess part of the lower electrode, wherein the ion conduction layer is in contact with the recess part of the lower electrode through the opening of the barrier insulating film.

(Supplementary Note 7) The semiconductor device according to Supplementary Note 4, further including a plurality of lower electrodes, wherein the recess part is formed on a surface of one lower electrode out of the plurality of lower electrodes, and on a surface of another lower electrode.

(Supplementary Note 8) The semiconductor device according to Supplementary Note 7, wherein the multi-layered wiring layer includes a plug electrically connected to the upper electrode, and the plug is electrically connected to the upper electrode above a part between the recess part of the one lower electrode and the recess part of the another lower electrode.

(Supplementary Note 9) The semiconductor device according to Supplementary Note 7 or 8, further including a barrier insulating film arranged between the one lower electrode, the another lower electrode, and the ion conduction layer, the barrier insulating film including an opening located at the recess part of the one lower electrode and the recess part of the another lower electrode, wherein the ion conduction layer is in contact with the recess part of the one lower electrode and the recess part of the another lower electrode through the opening of the barrier insulating film.

(Supplementary Note 10) The semiconductor device according to Supplementary Note 4, wherein a plurality of the recess parts are formed on a surface of the lower electrode, and the ion conduction layer is formed in contact with each of the plurality of recess parts on a surface of the lower electrode.

(Supplementary Note 11) The semiconductor device according to Supplementary Note 4, further including a plurality of lower electrodes, wherein the recess part is formed on a surface of each of the plurality of lower electrodes, and the ion conduction layer is formed in contact with each of the recess parts on surfaces of the lower electrodes.

(Supplementary Note 12) The semiconductor device according to any one of Supplementary Notes 4 to 9, wherein the recess part is formed on a central part of a surface of the lower electrode.

(Supplementary Note 13) The semiconductor device according to any one of Supplementary Notes 4 to 9, wherein the recess part is formed at least on a peripheral part of a surface of the lower electrode.

(Supplementary Note 14) A manufacturing method of the semiconductor device according to any one of Supplementary Notes 4 to 13, wherein the recess part of the lower electrode is formed by, after exposing a surface of the lower electrode, applying plasma of a halogen gas, an inert gas, a fluorocarbon-based gas, or a composite gas thereof onto the exposed surface of the lower electrode, at reduced pressure.

(Supplementary Note 15) A manufacturing method used for manufacturing the semiconductor device according to Supplementary Note 5, including:

after forming an interlayer insulating film covering the upper electrode, forming a contact hole in the interlayer insulating film covering the upper electrode, located above the recess part of the lower electrode; and forming, in the contact hole, the plug electrically connected to the upper electrode.

(Supplementary Note 16) A manufacturing method of a semiconductor device including, inside a multi-layered wiring layer on a semiconductor substrate, a variable resistance element including a configuration in which an ion conduction layer is arranged between an upper electrode and a lower electrode, the method including:

exposing a wiring also serving as a lower electrode of the variable resistance element; and digging down the wiring also serving as a lower electrode, in a depth direction lower than an upper surface thereof, by applying plasma of a halogen gas, an inert gas, or a fluorocarbon-based gas, or a composite gas thereof, at reduced pressure.

(Supplementary Note 17) The manufacturing method of a semiconductor device, according to Supplementary Note 16, wherein the wiring also serving as a lower electrode is formed in an interlayer insulating film, and, by applying plasma, the interlayer insulating film in contact with the wiring also serving as a lower electrode is dug down in a depth direction lower than the wiring also serving as a lower electrode in contact with the variable resistance layer.

(Supplementary Note 18) A manufacturing method of a semiconductor device including, inside a multi-layered wiring layer on a semiconductor substrate, a variable resistance element including a configuration in which an ion conduction layer is arranged between an upper electrode and a lower electrode, the method including:

forming the lower electrode of the variable resistance element in an interlayer insulating film;

forming a barrier insulating film covering the interlayer insulating film and the lower electrode;

forming an opening exposing a surface of the lower electrode, on the barrier insulating film;

forming a recess part by applying plasma of a halogen gas, an inert gas, a fluorocarbon-based gas, or a composite gas thereof onto the exposed surface of the lower electrode, at reduced pressure; and forming the ion conduction layer of the variable resistance element so as to be in contact with at least the recess part of the lower electrode.

INDUSTRIAL APPLICABILITY

The variable resistance element according to the present invention may be utilized as a nonvolatile switching element, and the present invention may be suitably utilized as, in particular, a nonvolatile switching element constituting an electronic device such as a programmable logic device and a memory.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

REFERENCE SIGNS LIST

10 Semiconductor substrate
11 Multi-layered wiring layer
12 Variable resistance element
13 Upper electrode
14 Ion conduction layer
15 Lower electrode
15c, 15p Recess part
101, 201, 301, 401, 501, 601, 701, 801 Semiconductor substrate
102, 202, 302, 402, 502, 602, 702, 802 Interlayer insulating film
103, 203, 303, 403, 503, 603, 703, 803 Low-k insulating film
104, 204, 304, 404, 504, 604, 704, 804 Interlayer insulating film
105a, 205a, 305a, 405a, 505a, 605a, 705a, 805a First wiring A
105b, 205b, 305b, 405b, 505b, 605b, 705b, 805b First wiring B
106a, 206a, 306a, 406a, 506a, 606a, 706a, 806a First barrier metal A
106b, 206b, 306b, 406b, 506b, 606b, 706b, 806b First barrier metal B
406c, 506c, 606c, 706c First barrier metal C
107, 207, 307, 407, 507, 607, 707, 807 Barrier insulating film
108, 222, 308, 408, 522, 608, 722, 808 Recess part
109, 209, 309, 409, 509, 609, 709, 809 Ion conduction layer
109a, 209a, 309a, 409a, 509a, 609a, 709a, 809a First ion conduction layer
109b, 209b, 309b, 409b, 509b, 609b, 709b, 809b Second ion conduction layer
110, 210, 310, 410, 510, 610, 710, 810 Lower second electrode
111, 211, 311, 411, 511, 611, 711, 811 Upper second electrode
112, 208, 212, 213, 312, 412, 508, 512, 513, 612, 708, 712, 713, 812 Hard mask film
113, 313, 713 Two-terminal switch
114, 214, 314, 414, 514, 614, 714, 814 Protective insulating film
115, 215, 315, 415, 515, 615, 715, 815 Interlayer insulating film
116, 216, 316, 416, 516, 616, 716, 816 Low-k insulating film
118a, 218a, 318a, 418a, 518a, 618a, 718a, 818a Second wiring A
118b, 218b, 318b, 418b, 518b, 618b, 718b, 818b Second wiring B
119a, 219a, 319a, 419a, 519a, 619a, 719a, 819a Via A
119b, 219b, 319b, 419b, 519b, 619b, 719b, 819b Via B
120a, 220a, 320a, 420a, 520a, 620a, 720a, 820a Second barrier metal A
120b, 220b, 320b, 420b, 520b, 620b, 720b, 820b Second barrier metal B
121, 221, 321, 421, 521, 621, 721, 821 Barrier insulating film
413, 613 Three-terminal switch

The invention claimed is:

1. A variable resistance element comprising a configuration in which an ion conduction layer is arranged between an upper electrode and a lower electrode, wherein
at least a side surface of the lower electrode is covered by a barrier metal,
a step-like recess part is formed on a top surface of the lower electrode, a portion of the barrier metal located near the top surface of the lower electrode is also removed to form a part of the step-like recess part, and
the ion conduction layer is formed in contact with at least the step-like recess part on a surface of the lower electrode.

2. The variable resistance element according to claim 1, wherein the step-like recess part is formed on a central part of the surface of the lower electrode.

3. The variable resistance element according to claim 1, wherein the step-like recess part is formed at least on a peripheral part of the surface of the lower electrode.

4. A semiconductor device comprising a variable resistance element disposed inside a multi-layered wiring layer on a semiconductor substrate, wherein
the variable resistance element includes a configuration in which an ion conduction layer is arranged between an upper electrode and a lower electrode,
at least a side surface of the lower electrode is covered by a barrier metal,
a step-like recess part is formed on a top surface of the lower electrode, a portion of the barrier metal located near the top surface of the lower electrode is also removed to form a part of the step-like recess part, and the ion conduction layer is formed in contact with at least the step-like recess part on a surface of the lower electrode.

5. The semiconductor device according to claim 4, wherein
the multi-layered wiring layer includes a plug electrically connected to the upper electrode, and
the plug is electrically connected to the upper electrode above the step-like recess part formed on the lower electrode.

6. The semiconductor device according to claim 4, further including a barrier insulating film arranged between the lower electrode and the ion conduction layer, the barrier insulating film including an opening located at the step-like recess part formed on the lower electrode, wherein
the ion conduction layer is in contact with the step-like recess part formed on the lower electrode through the opening of the barrier insulating film.

7. The semiconductor device according to claim 4, further comprising a plurality of lower electrodes, wherein
the step-like recess part is formed on a surface of one lower electrode out of the plurality of lower electrodes, and on a surface of another lower electrode out of the plurality of lower electrodes.

8. The semiconductor device according to claim 7, wherein
the multi-layered wiring layer includes a plug electrically connected to the upper electrode, and
the plug is electrically connected to the upper electrode above a part between the step-like recess part formed on the one lower electrode out of the plurality of lower electrodes and the step-like recess part formed on the another lower electrode out of the plurality of lower electrodes.

9. The semiconductor device according to claim 7, further comprising a barrier insulating film arranged between the one lower electrode out of the plurality of lower electrodes, the another lower electrode out of the plurality of lower electrodes, and the ion conduction layer, the barrier insulating film including an opening located at the step-like recess part of the one lower electrode out of the plurality of lower electrodes and the step-like recess part of the another lower electrode out of the plurality of lower electrodes, wherein
the ion conduction layer is in contact with the step-like recess part of the one lower electrode out of the plurality of lower electrodes and the step-like recess part of the another lower electrode out of the plurality of lower electrodes through the opening of the barrier insulating film.

10. The semiconductor device according to claim 4, wherein
a plurality of the step-like recess parts are formed on a surface of the lower electrode, and
the ion conduction layer is formed in contact with each of the plurality of step-like recess parts on a surface of the lower electrode.

11. The semiconductor device according to claim 4, further comprising a plurality of lower electrodes, wherein
the step-like recess part is formed on a surface of each of the plurality of lower electrodes, and
the ion conduction layer is formed in contact with each of the step-like recess parts on surfaces of the lower electrodes.

12. The semiconductor device according to claim 4, wherein the step-like recess part is formed on a central part of a surface of the lower electrode.

13. The semiconductor device according to claim 4, wherein the step-like recess part is formed at least on a peripheral part of a surface of the lower electrode.

14. A manufacturing method used for manufacturing a semiconductor device, the semiconductor device comprising a variable resistance element disposed inside a multi-layered wiring layer on a semiconductor substrate, wherein
the variable resistance element includes a configuration in which an ion conduction layer is arranged between an upper electrode and a lower electrode,
at least a side surface of the lower electrode is covered by a barrier metal,
a step-like recess part is formed on a top surface of the lower electrode, a portion of the barrier metal located near the top surface of the lower electrode is also removed to form a part of the step-like recess part,
the ion conduction layer is formed in contact with at least the step-like recess part on a surface of the lower electrode, and
the step-like recess part of the lower electrode is formed by, after exposing a surface of the lower electrode, applying a plasma of a halogen gas, an inert gas, a fluorocarbon-based gas, or a mixed gas thereof onto the exposed surface of the lower electrode, at a reduced pressure.

15. A manufacturing method of a semiconductor device, the semiconductor device comprising a variable resistance element disposed inside a multi-layered wiring layer on a semiconductor substrate, wherein
the variable resistance element includes a configuration in which an ion conduction layer is arranged between an upper electrode and a lower electrode,
at least a side surface of the lower electrode is covered by a barrier metal,
a step-like recess part is formed on a top surface of the lower electrode, a portion of the barrier metal located near the top surface of the lower electrode is also removed to form a part of the step-like recess part,
the ion conduction layer is formed in contact with at least the step-like recess part on a surface of the lower electrode,
the multi-layered wiring layer includes a plug electrically connected to the upper electrode,
the plug is electrically connected to the upper electrode above the step-like recess part formed on the lower electrode, and
after forming an interlayer insulating film covering the upper electrode, forming a contact hole in the interlayer insulating film covering the upper electrode, located above the step-like recess part of the lower electrode; and
forming, in the contact hole, the plug electrically connected to the upper electrode.

16. A manufacturing method of a semiconductor device comprising, inside a multi-layered wiring layer on a semiconductor substrate, a variable resistance element including a configuration in which an ion conduction layer is arranged between an upper electrode and a lower electrode, at least a side surface of the lower electrode is covered by a barrier metal, a step-like recess part is formed on a top surface of the lower electrode, a portion of the barrier metal located near the top surface of the lower electrode is removed to form a part of the step-like recess part, and the ion conduction layer is formed in contact with at least the step-like recess part on a surface of the lower electrode, the method comprising:

exposing a wiring also serving as the lower electrode of the variable resistance element; and digging down the wiring also serving as the lower electrode, in a depth direction lower than an upper surface thereof, by applying a plasma of a halogen gas, an inert gas, or a fluorocarbon-based gas, or a mixed gas thereof, at a reduced pressure.

17. The manufacturing method of a semiconductor device, according to claim 16, wherein the wiring also serving as the lower electrode is formed in an interlayer insulating film, and, by applying the plasma, the interlayer insulating film in contact with the wiring also serving as the lower electrode is recessed down in a depth direction lower than the wiring also serving as the lower electrode in contact with the ion conduction layer.

* * * * *